(12) United States Patent
Sato et al.

(10) Patent No.: US 6,808,617 B2
(45) Date of Patent: Oct. 26, 2004

(54) ELECTROLYTIC POLISHING METHOD

(75) Inventors: Shuzo Sato, Kanagawa (JP); Yuji Segawa, Tokyo (JP); Akira Yoshio, Tokyo (JP); Takeshi Nogami, Kanagawa (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 09/955,668

(22) Filed: Sep. 19, 2001

(65) Prior Publication Data

US 2002/0070126 A1 Jun. 13, 2002

(30) Foreign Application Priority Data

Sep. 19, 2000 (JP) ..................................... P2000-284260

(51) Int. Cl.[7] ............................................. B23H 11/00
(52) U.S. Cl. ....................... 205/640; 205/641; 205/644; 205/645; 205/646; 205/220; 205/222; 205/223; 205/229; 205/316
(58) Field of Search ............................... 205/640, 641, 205/644, 645, 646, 220, 222, 223, 229, 316

(56) References Cited

U.S. PATENT DOCUMENTS 6,447,668 B1 * 9/2002 Wang ........................ 205/645
6,491,808 B2 * 12/2002 Ichinose et al. ............ 205/646
2001/0035354 A1 * 11/2001 Ashjaee et al. ............. 205/103
2003/0006147 A1 * 1/2003 Talieh ........................ 205/640

* cited by examiner

Primary Examiner—Wesley A. Nicolas
(74) Attorney, Agent, or Firm—Robert J. Depke; Holland & Knight LLP

(57) ABSTRACT

A polishing method and polishing apparatus able to easily flatten an initial unevenness with an excellent efficiency of removal of excess copper film and suppress damage to a lower interlayer insulation film, and a plating method and plating apparatus able to deposit a flat copper film. The polishing method comprises the steps of measuring thickness equivalent data of a film on a wafer, making a cathode member smaller than the surface face a region thereof, interposing an electrolytic solution between the surface and the cathode member, applying a voltage using the cathode member as a cathode and the film an anode, performing electrolytic polishing by electrolytic elution or anodic oxidation and chelation and removal of a chelate film in the same region preferentially from projecting portions of the film until removing the target amount of film obtained from the thickness equivalent data, and repeating steps of moving the cathode member to another region to flattening the regions over the entire surface. Further, plating is performed by a reverse reaction of the above.

49 Claims, 38 Drawing Sheets

FILM THICKNESS ↑

AMOUNT OF REMOVAL ↑

ELECTRODE MOVING SPEED

ED     CT     ED
X(POSITION ON A WAFER)

FILM THICKNESS

AMOUNT OF REMOVAL

ELECTRODE MOVING SPEED

ED          CT          ED
XY(POSITION ON A WAFER)

SURFACE THICKNESS ↑

AMOUNT OF DEPOSITION ↑

ELECTRODE MOVING SPEED ↑

X(POSITION ON A WAFER)

ELECTROLYTIC POLISHING METHOD

RELATED APPLICATION DATA

The present application claims priority to Japanese Application(s) No(s). P2000-284260 filed Sep. 19, 2000, which application(s) is/are incorporated herein by reference to the extent permitted by law.

BACKGROUND OF THE INVENTION

1. Field of the Invention

The present invention relates to a polishing method, a polishing apparatus, a plating method, and a plating apparatus used in producing a semiconductor device, more particularly relates to a polishing method and a polishing apparatus of a copper film or other film in a damascene process and a plating method and a plating apparatus used in processes of forming a copper film etc.

2. Description of the Related Art

Along with the increase in integration and reduction of size of semiconductor devices, progress has been made in miniaturization of interconnections, reduction of interconnection pitch, and superposition of interconnections. The importance of the multilayer interconnection technology in the manufacturing process of semiconductor devices is therefore rising.

On the other hand, conventionally aluminum has been frequently used as an interconnection material of a semiconductor device having a multilayer interconnection structure, but in order to suppress the propagation delay of signals in the recent 0.25 $\mu$m or less design rule, an interconnection process for replacing the aluminum of the interconnection material by copper is being developed. When using copper for interconnections, there is the merit that both a low resistance and a high electromigration tolerance can be obtained.

In a process using this copper for interconnections, for example, an interconnection process referred to as the damascene process for burying a metal in a groove-like interconnection pattern formed in an interlayer insulation film in advance and removing excess metal film by chemical mechanical polishing (CMP) to form the interconnections has become dominant. The damascene process has the characteristics that etching of the interconnections become unnecessary and also a further upper interlayer insulation film becomes flat by itself, so the process can be simplified.

Further, by the dual damascene process where not only grooves for the interconnections, but also the contact holes are formed as grooves in the interlayer insulation film and where the interconnections and the contact holes are simultaneously buried by the metal, a greater reduction of the interconnection steps becomes possible.

Here, an explanation will be made of an example of the process for forming copper interconnections by the dual damascene process by referring to the figures below.

First, as shown in FIG. 34A, for example, an interlayer insulation film 302 made of for example silicon oxide is formed by for example low pressure chemical vapor deposition (CVD) on a silicon or other semiconductor substrate 301 on which a not illustrated impurity diffusion region is appropriately formed.

Next, as shown in FIG. 34B, contact holes CH communicating with the impurity diffusion region of the semiconductor substrate 301 and grooves M in which will be formed a predetermined pattern of interconnections to be electrically connected to the impurity diffusion region of the substrate 301 are formed by using well-known photolithography and etching.

Next, as shown in FIG. 34C, a barrier metal film 305 is formed on the surface of the interlayer insulation film 302 and in the contact holes CH and the grooves M. This barrier metal film 305 is formed by a material such as Ta, Ti, TaN, or TiN by well-known sputtering. When the interconnection material is copper and the interlayer insulation film 302 is silicon oxide, since copper has a large diffusion coefficient with respect to silicon oxide, it is easily oxidized. The barrier metal film 305 is provided to prevent this.

Next, as shown in FIG. 35A, a seed film 306 is formed on the barrier metal film 305 to a predetermined thickness by well-known sputtering.

Then, as shown in FIG. 35B, a copper film 307 is grown and formed on the seed film 306 so as to bury the contact holes CH and the grooves M by copper. The copper film 307 is formed by for example plating, CVD, sputtering, etc.

Next, as shown in FIG. 35C, the excess copper film 307 and barrier metal film 305 on the interlayer insulation film 302 are removed by CMP for flattening.

Due to the above steps, copper interconnections 308 and contacts 309 are formed.

By repeating the above process on the interconnections 308, multilayer interconnections can be formed.

Summarizing the problems to be solved by the invention, in the step of removing the excess copper film 307 by CMP in the copper interconnection forming process using the dual damascene process, because the flattening technique employing conventional CMP involves applying a predetermined pressure between a polishing tool and the copper film for polishing, there arises a problem that large damage is given to the semiconductor substrate.

Especially, in a case where an insulation film of a small dielectric constant, for example, a polyimide film or other organic insulation film, or an SiOF film comprised of silicon oxide including fluorine, or an inorganic insulation film such as porous silica or other gel insulation film, is used for the interlayer insulation film for the purpose of reducing the parasitic capacitance in interconnections to raise the operation speed of a semiconductor device, since generally these insulation films have low mechanical strength, the aforesaid damage in the above CMP process is no longer negligible and may cause cracks of the interlayer insulation film and separation of the interlayer insulation film from the semiconductor substrate.

Further, the removal performance differs among the interlayer insulation film 302, the copper film 307, and the barrier metal film 305, therefore there has been the problem that dishing, erosion (thinning), recesses, etc. easily occur in the interconnections 308.

Dishing is a phenomenon where, as shown in FIG. 36, when there is an interconnection 308 having a width of, for example, about 100 $\mu$m at a 0.18 $\mu$m design rule, the center portion of the interconnection is excessively removed and sinks. If this dishing occurs, the sectional area of the interconnection 308 becomes insufficient. This causes poor interconnection resistance etc. This dishing is apt to occur when copper or aluminum, which are relatively soft, is used as the interconnection material.

Erosion is a phenomenon where, as shown in FIG. 37, a portion having a high pattern density such as where interconnections with a width of 1.0 $\mu$m are formed at a density of 50% in a range of for example 3000 $\mu$m is excessively removed. When erosion occurs, the sectional area of the interconnections becomes insufficient. This causes poor interconnection resistance etc.

Recess is a phenomenon where, as shown in FIG. 38, the interconnection 308 becomes lower in level at the interface between the interlayer insulation film 302 and the interconnection 308 resulting in a step difference. In this case as well, the sectional area of the interconnection becomes insufficient, causing poor interconnection resistance etc.

Further, in the step of flattening and removing the excess copper film 307 by CMP, it is necessary to efficiently remove the copper film. The amount removed per unit time, that is, the polishing rate, is required to be for example more than 500 nm/min.

In order to obtain this polishing rate, it is necessary to increase the polishing pressure on the wafer. When the polishing pressure is raised, as shown in FIG. 39, a scratch SC and chemical damage CD are apt to occur in the interconnection surface. In particular, they easily occur in soft copper. For this reason, they cause opening of the interconnections, short-circuiting, poor interconnection resistance, and other defects. Further, if the polishing pressure is raised, there is the inconvenience that the amount of the scratches, separation of interlayer insulation film, dishing, erosion, and recesses also becomes larger.

SUMMARY OF THE INVENTION

A first object of the present invention is to provide a polishing method and a polishing apparatus capable of easily flattening an initial unevenness, excellent in efficiency of removing an excess copper film, and capable of suppressing damage to an interlayer insulation film below a copper film when flattening the copper film by polishing in a process of producing a semiconductor device having copper interconnections.

On the other hand, in the process of copper-buried electroplating, a pre-process of the above polishing process, basically it is difficult to form a film of a uniform thickness over the entire surface. In the current state, films are usually formed with a variability of thickness of about 3 to 5%. CMP processing is performed to form interconnections from this state. Even if the uniformity of the amount of removal by the CMP were 0%, in a case where CMP is performed until the excess copper on the entire surface is removed, over-polishing occurs to the extent of the variability in formation of the plating film and in turn dishing, erosion, and recess to the same extent become inevitable. For example, assuming a 10,000 Å copper film is plated to form an interconnection that is 5000 Å in depth, the variability in thickness is 3 to 5%, i.e., 300 to 500 Å. A recess caused by 300 to 500 Å over-polishing corresponds to 6 to 10% loss of the sectional area with respect to a 5000 Å interconnection. This is too large to be negligible in formation of interconnections.

Therefore, to solve the above problem, a second object of the present invention is to provide a plating method and a plating apparatus able to deposit a flat copper film and applicable to a process of forming an interconnection of a semiconductor device.

To attain the first object, according to a first aspect of the present invention, there is provided a polishing method for polishing an object having a film on a surface to be polished, comprising the steps of measuring data equivalent to a thickness of the film on the object and making a relatively small cathode member compared with the surface face a region of the surface, interposing an electrolytic solution at least between that region of the surface and the cathode member, and in that state applying a voltage with the cathode member serving as a cathode and the film as an anode to electrolytically polish and flatten the film by electrolytic elution in that region of the surface preferentially from projecting portions of the film until removing a target amount of the film obtained from the thickness equivalent data; wherein the process of moving the cathode member to another region of the surface and electrolytically polishing the film in that other region until removing the target amount of film to flatten the film is repeated over the entire surface, to thereby remove the target amount of film over the entire surface.

Preferably, the film comprises a copper film.

The present polishing method preferably further comprises a step of calculating the amount of the film to be removed from the thickness equivalent data after the step of measuring the thickness equivalent data and before the step of electrolytically polishing and flattening the film by electrolytic elution in that region of the surface.

Preferably, the cathode member is moved continuously from one region to another region of the surface.

More preferably, the speed of movement of the cathode member is controlled in accordance with the target amount of the film to be removed obtained from the thickness equivalent data.

Preferably, the cathode member is moved stepwise from one region to another region of the surface.

Preferably, as the thickness equivalent data of the film, the thickness of the film is measured.

Preferably, in the step of measuring the thickness equivalent data of the film, the thickness equivalent data of the film in the region where the cathode member faces the surface is measured, and the process of moving the cathode member to another region of the surface, measuring the thickness equivalent data of the film in that other region, and electrolytically polishing and flattening the film by electrolytic elution preferentially from projecting portions of the film in that other region until removing the target amount of the film obtained from the thickness equivalent data is repeated over the entire surface.

More preferably, in the step of measuring the thickness equivalent data of the film, as the thickness equivalent data of the film, an electrolytic current of the electrolytic polishing is measured in the region where the cathode member faces the surface, and in the step of electrolytically polishing and flattening the film by electrolytic elution in that region of the surface, the electrolytic polishing is performed until removing the target amount of the film determined by the electrolytic current of the electrolytic polishing.

Still more preferably, in the step of electrolytically polishing and flattening the film by electrolytic elution in that region of the surface, the target amount of the film remaining at the point of time when the electrolytic current of the electrolytic polishing becomes a specified value is determined to be zero and the electrolytic polishing in that region of the surface is finished.

Preferably, the cathode member is shaped so as to be able to apply a stronger electric field to a projecting portion than to a recessed portion of the film corresponding to the unevenness of the film in that region of the surface. In the step of electrolytically polishing and flattening the film by electrolytic elution in that region of the surface, by applying this electric field, the film is polished electrolytically and flattened by electrolytic elution in the region of the surface preferentially from a projecting portion of the film.

More preferably, the surface has a projecting and recessed pattern formed by repeating a projecting and recessed pattern in that region of the surface. By moving the cathode member stepwise to other regions of the surface and applying the stronger electric field to the projecting portion than to the recessed portion of the film corresponding to the unevenness of the film in these other regions, the step of electrolytically polishing and flattening the film by electrolytic elution preferentially from projecting portions of the film is repeated over the entire surface.

Preferably, the cathode member is divided into a plurality of regions which are arranged insulated from each other and the cathode member as a whole faces the entire surface. By changing the position of application of voltage to the divided cathode member, the substantially equivalent is obtained as when changing the position of the cathode member facing the surface from one region to another region.

More preferably, the cathode member is divided into a plurality of concentric circular regions, and the entire surface is electrolytically polished by changing the position of application of voltage from the inner side to the outer side of the cathode member divided into concentric circular regions.

Preferably, when making a relatively small cathode member compared with the surface face that region of the surface, an anode member set apart from the cathode member at a certain distance is made to face the surface, an electrolytic solution is interposed at least between that region of the surface and the cathode member and between the surface and the anode member, and a voltage is applied to the cathode member and the anode member so as to apply the voltage de facto with the cathode member as a cathode and the surface as an anode.

More preferably, the anode member is comprised of a nobler metal than the material on the surface.

Preferably, in the step of electrolytically polishing and flattening the film by electrolytic elution in that region of the surface, chemical mechanical polishing is performed at the same time as the electrolytic polishing to flatten the film by composite polishing combining the electrolytic polishing and the chemical mechanical polishing.

Preferably, when a voltage is applied with the cathode member as a cathode and the surface as an anode, a direct-current voltage is applied.

More preferably, a rectangular pulse voltage is applied.

Further, in a case where an anode member set apart from the cathode member at a certain distance is made to face the surface, when a voltage is applied to the cathode member and the anode member, preferably an alternating-current voltage is applied.

Preferably, in the step of electrolytically polishing and flattening the film by electrolytic elution in that region of the surface, an electrolytic current of the electrolytic polishing in the region is measured at the same time.

More preferably, the voltage applied with the cathode member as a cathode and the surface as an anode is controlled to maintain the electrolytic current constant.

Further, more preferably, the progress in flattening the film in that region of the surface is managed through the electrolytic current.

According to the polishing method of the present invention, data corresponding to a thickness of the film on the object is measured, a relatively small cathode member compared with the surface is made to face a region of the surface, an electrolytic solution is interposed at least between that region of the surface and the cathode member, a voltage is applied with the cathode member serving as a cathode and the film as an anode, and the film is electrolytically polished by electrolytic elution in that region of the surface preferentially from projecting portions of the film until removing the target amount of the film obtained from the thickness equivalent data to flatten the film.

Here, in order to remove the target amount of film over the entire surface, a step of moving the cathode member to other regions of the surface and the step of electrolytically polishing and flattening the film in these other regions until removing the target amount of the film are repeated over the entire surface.

According to the polishing method of the present invention, it is possible to set the distribution of the necessary amounts of removal under conditions obtained after measuring beforehand the variability of the thickness of a film plated on a surface and, in accordance with this, remove the film as necessary for formation of interconnections by polishing by exactly the right amounts.

In addition, by moving the cathode member so that the actual distribution of the amounts of removal over the entire surface, comprised of the partial amounts of removal superposed on the surface, coincides with the above preset distribution of the amounts of removal, the film can be removed as necessary for formation of interconnections by polishing by exactly the right amounts over the entire surface.

Further, since the film on the surface is removed by polishing by electrolytic elution, unlike the CMP method, it is no longer necessary to apply pressure on the film, so occurrence of cracks of the film or damage to the lower interlayer insulation film can be suppressed.

In addition, in the above removal by polishing by electrolytic elution, only the projecting portions are selectively electrolytically eluded at the uneven portions formed on the surface of the film, so effective flattening can be achieved.

As described above, according to the polishing method of the present invention, when flattening a film by polishing, initial unevenness can be easily flattened, excellent efficiency of removal of excess copper film can be obtained, and damage to a lower interlayer insulation film can be suppressed.

In addition, to achieve the first object, according to a second aspect of the present invention, there is provided a polishing method for polishing an object having a film on a surface to be polished, comprising the steps of measuring data corresponding to a thickness of the film on the object; making a relatively small cathode member compared with the surface face a region of the surface, interposing an electrolytic solution including a chelating agent at least between that region of the surface and the cathode member, and in that state applying a voltage with the cathode member serving as a cathode and the film as an anode to oxidize the surface of the film by anodic oxidation and form a chelate film of the oxidized material; and selectively removing a projecting portion of the chelate film corresponding to unevenness of the film to expose the film of the projecting portion at the surface; wherein a step of moving the cathode member from one region to an other region of the surface, the chelate film forming step, and the chelate film removing step are repeated until removing the target amount of the film determined from the thickness equivalent data over the entire surface to flatten the entire surface.

Preferably, the film comprises a copper film.

Preferably, the electrolytic solution further includes a surface-active agent.

The polishing method of the present invention preferably further comprises a step of calculating the target amount of the film to be removed from the thickness equivalent data after the step of measuring the thickness equivalent data and before the chelate film forming step in that region of the surface.

Preferably, the cathode member is moved continuously from one region to another region of the surface.

More preferably, the speed of movement of the cathode member is controlled in accordance with the target amount of the film to be removed obtained from the thickness equivalent data.

Preferably, the cathode member is moved stepwise from one region to another region of the surface.

Preferably, as the thickness equivalent data of the film, the thickness of the film is measured.

Preferably, in the step of measuring the thickness equivalent data of the film, the thickness equivalent data of the film in the region where the cathode member faces the surface is measured, and the step of moving the cathode member to other regions of the surface, the step of measuring the thickness equivalent data of the film in these other regions, the chelate film forming step, and the chelate film removing step are repeated over the entire surface.

More preferably, in the step of measuring the thickness equivalent data of the film, as the thickness equivalent data of the film, an electrolytic current of the anodic oxidation is measured in the region where the cathode member faces the surface, and the step of measuring an electrolytic current of the anodic oxidation, the chelate film forming step, and the chelate film removing step are repeated over the entire surface until removing the target amount of the film determined by the electrolytic current of the anodic oxidation.

Still more preferably, when repeating the step of measuring the electrolytic current of the anodic oxidation in a region of the surface, the chelate film forming step, and the chelate film removing step over the entire surface, the target amount of the film remaining at the point of time when the electrolytic current of the anodic oxidation becomes a specified value is determined to be zero and the chelate film forming step and the chelate film removing step in that region of the surface are finished.

Preferably, the cathode member is shaped so as to be able to apply a stronger electric field to a projecting portion than to a recessed portion of the film corresponding to the unevenness of the film in that region of the surface. In the chelate film forming step and the chelate film removing step in that region of the surface, by applying this electric field, the chelate film is formed and removed preferentially from projecting portions of the film to flatten the film.

More preferably, the surface has a projecting and recessed pattern formed by repeating a projecting and recessed pattern in that region of the surface. By moving the cathode member stepwise to other regions of the surface and applying the stronger electric field to the projecting portion than to the recessed portion of the film corresponding to the unevenness of the film in these other regions, the step of chelating the film and removing the formed chelate film preferentially from a projecting portion of the film to flatten the film is repeated over the entire surface.

Preferably, the cathode member is divided into a plurality of regions which are arranged insulated from each other and the cathode member as a whole faces the entire surface. By changing the position of application of a voltage to the divided cathode member, the substantially equivalent is obtained as when changing the position of the cathode member facing the surface from one region to another region.

More preferably, the cathode member is divided into a plurality of concentric circular regions, and the entire surface of the film is oxidized by anodic oxidation and chelated by changing the position of application of a voltage from the inner side to the outer side of the cathode member divided into concentric circular regions.

Preferably, when making a relatively small cathode member compared with the surface face that region of the surface, an anode member set apart from the cathode member at a certain distance is made to face the surface, an electrolytic solution is interposed at least between that region of the surface and the cathode member and between the surface and the anode member, and a voltage is applied to the cathode member and the anode member so as to apply the voltage de facto with the cathode member as a cathode and the surface as an anode.

More preferably, the anode member is comprised of a nobler metal than the material on the surface.

Preferably, in the step of removing the chelate film in that region of the surface, a projecting portion of the chelate film corresponding to the unevenness of the film is selectively removed by wiping.

Alternatively, preferably, in the step of removing the chelate film in that region of the surface, the chelate film is removed by applying vibration.

Alternatively, preferably, in the step of removing the chelate film in that region of the surface, the chelate film is removed by applying a jet.

Preferably, when a voltage is applied with the cathode member as a cathode and the surface as an anode, a direct-current voltage is applied.

More preferably, a rectangular pulse voltage is applied.

Further, in a case where an anode member set apart from the cathode member at a certain distance is made to face the surface, when a voltage is applied to the cathode member and the anode member, preferably an alternating-current voltage is applied.

Preferably, in the step of oxidizing the film by the anodic oxidation in that region of the surface, an electrolytic current of the anodic oxidation in the region is measured at the same time.

More preferably, the voltage applied with the cathode member as a cathode and the surface as an anode is controlled to maintain the electrolytic current constant.

Still more preferably, the progress in flattening the film in that region of the surface is managed through the electrolytic current.

According to the above polishing method of the present invention, data corresponding to a thickness of a film on an object is measured, the relatively small cathode member compared with the surface is made to face a region of the surface, an electrolytic solution including a chelating agent is interposed at least between that region of the surface and the cathode member, and the surface of the film is oxidized by anodic oxidation and a chelate film of the oxidized material is formed by applying a voltage with the cathode member serving as a cathode and the film as an anode. Further, projecting portions of the chelate film are selectively removed corresponding to unevenness of the film to expose the film of a projecting portion at its surface.

Here, the step of moving the cathode member from one region to other regions of the surface, the chelate film forming step, and the chelate film removing step are repeated until removing the target amount of film determined from the thickness equivalent data over the entire surface to flatten the entire surface.

According to the above polishing method of the present invention, the uneven surface formed on the film on the surface is partially oxidized by anodic oxidation in a region of the surface, reacts with a chelating agent supplied as a processing solution, and is chelated. Therefore, a chelate film of rather low mechanical strength able to be easily removed is formed. If removing a projecting portion of the chelate film, because the further exposed copper is chelated after being oxidized by anodic oxidation, flatness of the film is achievable by repeating the step of removing the projecting portion of the chelate film.

In addition, if a surface-active agent is added into the processing solution, the chelate film on the uneven surface is micelled forming an insoluble complex micelle, further, it can be easily and selectively removed preferentially from a projecting portion.

Within the range to which the electric action of the cathode member extends, since the electrical resistance of the chelate film is higher than copper, the copper covered by the not removed chelate film remaining in the groove is hard to be oxidized by anodic oxidation by conducting a current, so the chelation of this region is very slow and the chelate film is formed by anodic oxidation only at the projecting portion of the copper exposed by the removal of the previous chelate film.

Further, because the current is supplied through an electrolytic solution, if the potential difference between the film on the anode and the cathode member of the cathode is constant, the current density becomes larger the shorter the distance between electrodes. Therefore, in the film exposed after removing the chelate film, the more projecting a part of the film is, the shorter the electrode distance to the cathode member used as the cathode and thus the higher the current density and consequently the higher the speed of the anodic oxidation and the faster the chelation.

Further, since the volume of the chelate film formed on the uneven surface is greater than the original copper, the step difference on the uneven surface is magnified large compared with the step difference on the surface of the original copper. Therefore, the mechanical removal energy due to wiping etc. received by a projecting portion is large.

Accordingly, within the range to which the electrical action of the cathode member extends, projecting portions of the film can be removed preferentially and can be flattened effectively.

In addition, it is possible to set the distribution of the necessary amounts of removal by conditions obtained by measuring beforehand the variability of the thickness of a film plated on a surface and, in accordance with this, remove the film necessary as necessary for formation of interconnections by polishing by exactly the right amounts.

In addition, by moving the cathode member so that the actual distribution of the amounts of removal over the entire surface comprised of the partial amounts of removal superposed on the surface coincides with the above preset distribution of amounts of removal, it is possible to remove the film as necessary for formation of interconnections by polishing by exactly the right amounts over the entire surface.

Further, since the film on the surface is removed by polishing by anodic oxidation, chelation, and removal of the chelate film, unlike the CMP method, it is no longer necessary to apply pressure on the film, so occurrence of cracks of the film or damage to the lower interlayer insulation film can be suppressed.

As described above, according to the polishing method of the present invention, when flattening a film by polishing, an initial unevenness can be easily flattened, excellent efficiency of removal of excess copper film can be obtained, and damage to a lower interlayer insulation film can be suppressed.

In addition, to achieve the first object, according to a third aspect of the present invention, there is provided a polishing apparatus for polishing an object having a film on a surface to be polished, comprising a table for holding the object, a measuring means for measuring data corresponding to a thickness of the film on the object, a cathode member relatively small compared with the surface and arranged to face a region of the surface, an electrolytic solution feeding means for feeding an electrolytic solution at least between that region of the surface and the cathode member, a power supply for applying a voltage with the cathode member serving as a cathode and the film serving as an anode, a control means for controlling application of voltage until removing the target amount of film obtained from the thickness equivalent data when the film is electrolytically polished by electrolytic elution in that region of the surface, and a moving means for moving the cathode member to other regions of the surface in order to remove the target amount of film over the entire surface.

Preferably, the film comprises a copper film.

The polishing apparatus of the present invention preferably further comprises a calculating unit for calculating the target amount of the film to be removed from the thickness equivalent data.

Preferably, the measuring means measures a thickness of the film.

Preferably, the measuring means measures an electrolytic current of electrolytic polishing in a region where the cathode member faces the surface, and the control means controls a voltage to be applied until removing the target amount of film determined by the electrolytic current of the electrolytic polishing in that region of the surface.

More preferably, the control means determines the target amount of the film remaining at the point of time when the electrolytic current of the electrolytic polishing becomes a specified value to be zero and controls the electrolytic polishing in that region of the surface to finish.

Preferably, the cathode member is shaped so as to be able to apply a stronger electric field to a projecting portion than to a recessed portion of the film corresponding to the unevenness of the film in that region of the surface. By applying this electric field, the film is polished electrolytically and flattened by electrolytic elution in that region of the surface preferentially from a projecting portion of the film.

Preferably, the cathode member is divided into a plurality of regions which are arranged insulated from each other and the cathode member as a whole faces the entire surface. By changing the position of application of voltage to the divided cathode member, the substantially equivalent is obtained as when changing the position of the cathode member facing the surface from one region to another region.

More preferably, the cathode member is divided into a plurality of concentric circular regions.

The polishing apparatus of the present invention preferably further comprises an anode member facing the surface and set apart from the cathode member at a certain distance, the electrolytic feeding means feeds an electrolytic solution between the region of the surface and the cathode member and between the surface and the anode member, and the power supply applies a voltage to the cathode member and the anode member.

More preferably, the anode member is comprised of a nobler metal than the material on the surface.

The polishing apparatus of the present invention preferably further comprises a polishing means for chemical mechanical polishing and performs the chemical mechanical polishing in that region of the film at the same time as the electrolytic polishing to flatten the film.

Preferably, the power supply applies a direct-current voltage with the cathode member as a cathode and the surface as an anode.

More preferably, the power supply applies a rectangular pulse voltage.

Further, in a case where an anode member set apart from the cathode member at a certain distance is made to face the surface, preferably the power source applies an alternating-current voltage to the cathode member and the anode member.

The polishing apparatus of the present invention preferably further comprises an ammeter for measuring an electrolytic current of the electrolytic polishing in that region.

More preferably, the control means controls the voltage applied to the cathode member and the surface so as to maintain the electrolytic current constant.

According to the above polishing apparatus of the present invention, the film on the surface can be polished by the polishing method of the present invention. When flattening a film by polishing, an initial unevenness can be easily flattened, excellent efficiency of removal of an excess copper film can be obtained, and damage to a lower interlayer insulation film can be suppressed.

In addition, to achieve the above object, according to a fourth aspect of the present invention, there is provided a polishing apparatus for polishing an object having a film on a surface to be polished, comprising a table for holding the object, a measuring means for measuring data corresponding to a thickness of the film on the object, a cathode member relatively small compared with the surface and arranged to face a region of the surface, an electrolytic solution feeding means for feeding an electrolytic solution including a chelating agent at least between the region of the surface and the cathode member, a power supply for applying a voltage with the cathode member serving as a cathode and the film as an anode, a control means for controlling the application of voltage until the surface of the film is oxidized by anodic oxidation in that region of the surface and a chelate film of the oxidized material is formed, a chelate film removing means for removing the chelate film, and a moving means for moving the cathode member to other regions of the surface in order to remove a target amount of the film obtained from the thickness equivalent data over the entire surface.

Preferably, the film comprises a copper film.

Preferably, the chelate film removing means selectively removes a projecting portion of the chelate film corresponding to unevenness of the film.

Preferably, as an electrolytic solution, the electrolytic feeding means feeds an electrolytic solution further including a surface-active agent.

The polishing apparatus of the present invention preferably further comprises a calculating unit for calculating the target amount of the film to be removed from the thickness equivalent data.

Preferably, the measuring means measures a thickness of the film.

Alternatively, the measuring means measures an electrolytic current of the anodic oxidation in a region where the cathode member faces the surface, and the control means controls the voltage to be applied until removing the target amount of film determined by the electrolytic current of the anodic oxidation in that region of the surface.

More preferably, the control means determines the target amount of the film remaining at the point of time when the electrolytic current of the anodic oxidation becomes a specified value to be zero and controls the anodic oxidation in that region of the surface to finish.

Preferably, the cathode member is shaped so as to be able to apply a stronger electric field to a projecting portion than to a recessed portion of the film corresponding to the unevenness of the film in that region of the surface. By applying this electric field, the film is oxidized by anodic oxidation and chelated in that region of the surface preferentially from a projecting portion of the film to flatten the film.

Preferably, the cathode member is divided into a plurality of regions which are arranged insulated from each other and the cathode member as a whole faces the entire surface. By changing the position of application of voltage to the divided cathode member, the substantially equivalent is obtained as when changing the position of the cathode member facing the surface from one region to another region.

More preferably, the cathode member is divided into a plurality of concentric circular regions.

The polishing apparatus of the present invention preferably further comprises an anode member facing the surface and set apart from the cathode member at a certain distance, the electrolytic feeding means feeds an electrolytic solution between the region of the surface and the cathode member and between the surface and the anode member, and the power supply applies a voltage to the cathode member and the anode member.

More preferably, the anode member is comprised of a nobler metal than the material on the surface.

The polishing apparatus of the present invention preferably comprises a wiping means for selectively removing projecting portions of the chelate film corresponding to the unevenness of the film as the chelate film removing means.

Alternatively, preferably, the chelate film removing means includes a vibration applying means.

Alternatively, preferably, the chelate film removing means includes a jet generating and applying means for applying a jet to the chelate film.

Preferably, the power supply applies a direct-current voltage with the cathode member as a cathode and the surface as an anode.

More preferably, the power supply applies a rectangular pulse voltage.

Further, in a case where an anode member set apart from the cathode member at a certain distance is made to face the surface, preferably the power source applies an alternating-current voltage to the cathode member and the anode member.

The polishing apparatus of the present invention preferably further comprises an ammeter for measuring an electrolytic current of the anodic oxidation in that region.

More preferably, the control means controls the voltage applied to the cathode member and the surface so as to maintain the electrolytic current constant.

According to the above polishing apparatus of the present invention, the film on the surface can be processed by the polishing method of the present invention. When flattening a film by polishing, an initial unevenness can be easily flattened, excellent efficiency of removal of excess copper film can be obtained, and damage to a lower interlayer insulation film can be suppressed.

In addition, to achieve the second object, according to a fifth aspect of the present invention, there is provided a plating method depositing a plating film on a surface of an object, comprising the steps of measuring surface height data of the surface or thickness data of the plating film on the object and making a relatively small anode member compared with the surface face a region of the surface, applying a voltage with the anode member serving as an anode and the surface as a cathode while interposing an electrolytic plating solution at least between the region of the surface and the anode member, and depositing the plating film by plating in that region of the surface until depositing a target amount of the plating film deduced from the surface height data or the thickness data of the plating film at the time of the measurement; wherein the process of moving the anode member to another region of the surface and depositing a plating film by plating in that other region is repeated over the entire surface.

Preferably, the plating film comprises a copper film.

According to the plating method of the present invention, it is possible to set a distribution of the necessary amounts of deposition under conditions obtained by measuring beforehand the surface height of a surface to be plated or by measuring plating thickness data while plating and in accordance with this form the necessary plating film by exactly the right amounts.

In addition, by moving the anode member so that the actual distribution of the amounts of deposition over the entire surface, comprised of the partial amounts of deposition superposed on the surface, coincides with the above preset distribution of the amounts of deposition, the plating film can be form by exactly the right amounts over the entire surface.

As described above, in the process of forming interconnections of a semiconductor device, a flat plating film can be deposited.

In addition, to achieve the second object, according to a sixth aspect of the present invention, there is provided a plating apparatus for depositing a plating film on a surface of an object, comprising a table for holding the object, a measuring means for measuring surface height data of the surface or plating thickness data of the plating film on the object, an anode member relatively small compared with the surface and arranged to face a region of the surface, an electrolytic plating solution feeding means for feeding an electrolytic plating solution at least between that region of the surface and the anode member, a power supply for applying a voltage with the anode member serving as an anode and the surface as a cathode, a control means for controlling application of voltage until forming by plating a target amount of the plating film deduced from the surface height data or the plating thickness data at the time of the measurement in that region of the surface, and a moving means for moving the anode member to other regions of the surface.

Preferably, the plating film comprises a copper film.

According to the plating apparatus of the present invention, it is possible to set the distribution of amounts of deposition required under conditions obtained by measuring the surface height of the surface to be plated beforehand or measuring the plating thickness data while plating and in accordance with this form the necessary plating film by exactly the right amounts.

Further, by moving the anode member so that the actual distribution of the amounts of deposition over the entire surface comprised of the partial amounts of deposition superposed on the surface coincides with the above preset distribution of amounts of deposition, it is possible to form a plating film by exactly the right amounts over the entire surface.

As described above, in the process of forming interconnections of a semiconductor device, a flat plating film can be deposited.

BRIEF DESCRIPTION OF THE DRAWINGS

The above objects and features of the present invention will be more apparent from the following description of the preferred embodiments given with reference to the accompanying drawings, wherein:

FIGS. 1A to 1C are sectional views of steps of the method of producing a semiconductor device according to a first embodiment of the present invention, wherein FIG. 1A shows the step for forming an insulation film on a semiconductor substrate, FIG. 1B shows the step for forming contact holes and interconnection grooves, and FIG. 1C shows the step for forming a barrier film;

FIG. 2A shows the step of forming a copper film as a seed film, while FIG. 2B shows the step of forming a copper film;

FIG. 11A is a view of a cathode member of a polishing apparatus according to a fifth embodiment, while

FIG. 13A is a schematic view of a polishing apparatus according to a sixth embodiment, while

FIG. 18A is a schematic view of a polishing apparatus according to a 10th embodiment, while

FIG. 19A is a sectional view, FIG. 19B is a plan view, and FIG. 19C is a sectional view for explaining the operation when using the polishing ring wheel;

FIG. 20A is a plan view and FIG. 20B is a sectional view;

FIGS. 26A and 26B are views of steps continuing from FIGS. 25A and 25B, wherein FIG. 26A shows the step of removing projecting portions of the chelate film, while FIG. 26B shows the step of re-forming a chelate film;

FIG. 27A shows the step of flattening the copper film, FIG. 27B shows the step of removing excess copper film, and FIG. 27C shows the step of exposing the barrier film;

FIG. 30A is a current profile monitored in the plating apparatus according to the 13th embodiment, while

FIG. 34A shows the step of forming an insulation film, FIG. 34B shows the step of forming contact holes and interconnection grooves, and FIG. 34C shows the step of forming a barrier film;

FIG. 35A shows the step of forming a seed film, FIG. 35B shows the step of forming an interconnection layer, and FIG. 35C shows the step of forming interconnections;

DESCRIPTION OF THE PREFERRED EMBODIMENTS

Below, an explanation will be made of preferred embodiments of a polishing method, a polishing apparatus, a plating method, and a plating apparatus of the present invention by referring to the accompanying drawings.

First Embodiment

An explanation will be made of the case where the present invention is applied to a process of formation of copper interconnections by a dual damascene process in a semiconductor device having copper interconnections.

Figure 1A:
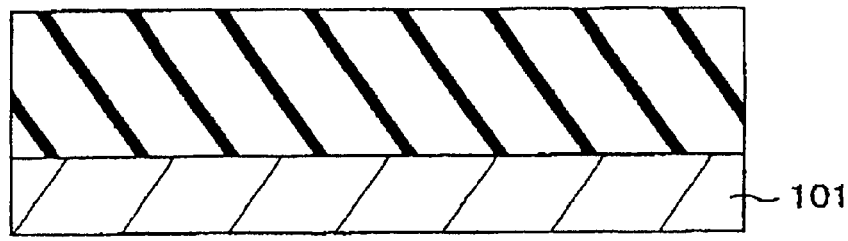

First, as shown in FIG. 1A, for example an interlayer insulation film 102 made of for example silicon oxide ($SiO_2$) is formed by low pressure chemical vapor deposition (CVD) on a silicon or other semiconductor substrate 101 on which a not illustrated impurity diffusion region is suitably formed by using for example tetraethyl orthosilicate (TEOS) as a reaction source.

Figure 1B:
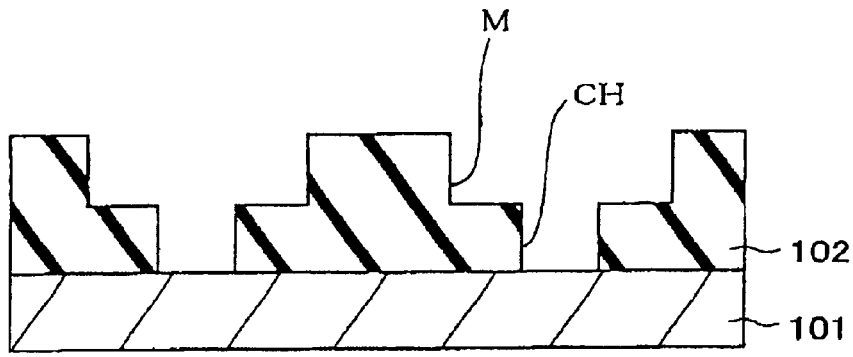

Next, as shown in FIG. 1B, contact holes CH communicating with the impurity diffusion region of the semiconductor substrate 101 and interconnection grooves M are formed by well-known photolithography and etching. The depth of the interconnection use grooves M is for example about 800 nm, while the width is for example about 250 nm to 100 μm.

Figure 1C:
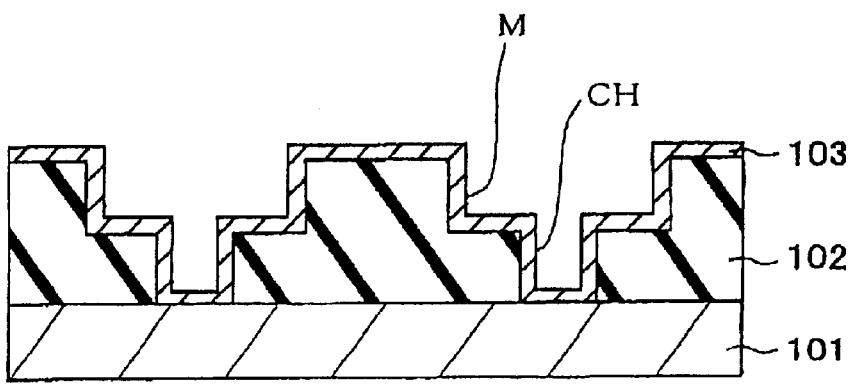

Next, as shown in FIG. 1C, a barrier metal film 103 is formed on the surface of the interlayer insulation film 102 and in the contact holes CH and the interconnection grooves M. This barrier metal film 103 is formed by a material such as Ta, Ti, W, Co, TaN, TiN, WN, CoW, or COWP to a thickness of for example about 25 nm by physical vapor deposition (PVD) using a sputtering system, a vacuum vapor deposition system, or the like.

The barrier metal film 103 is provided in order to prevent the diffusion of the material comprising the interconnections into the interlayer insulation film 102 and to increase the bondability with the interlayer insulation film 102. Particularly, as in the present embodiment, when the interconnection material is copper and the interlayer insulation film 102 is silicon oxide, since copper has a large coefficient of diffusion in silicon oxide, it can be easily oxidized. This must be prevented.

Figure 2A:
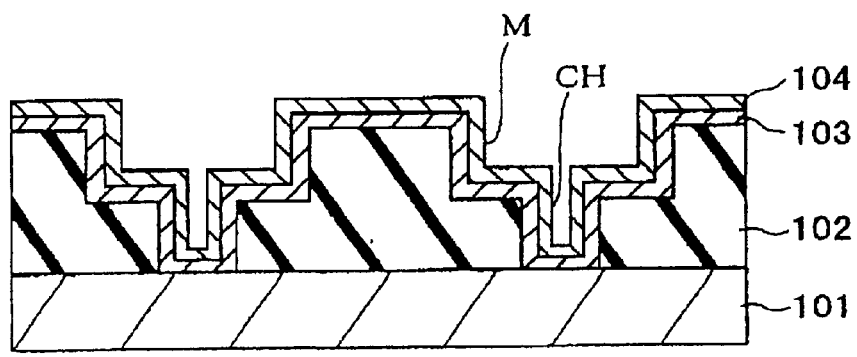
FIGS. 2A and 2B are views of steps continuing from FIGS. 1A to 1C, where

Next, as shown in FIG. 2A, a seed film 104 made of a material the same as the material for forming the copper interconnections is formed on the barrier metal film 103 to a thickness of for example about 150 nm by well-known sputtering. The seed film 104 is formed so as to accelerate the growth of copper grains when burying the interconnection grooves and the contact holes with copper.

Figure 2B:
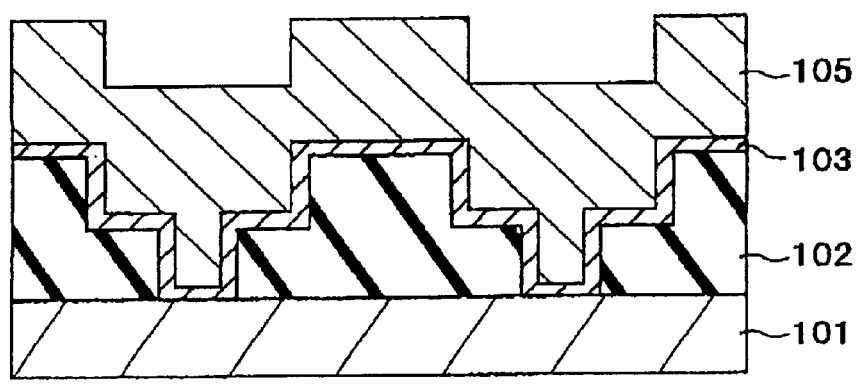

Next, as shown in FIG. 2B, an interconnection layer 105 made of copper is formed on the barrier metal film 103 to a thickness of for example about 1200 nm to 1600 nm so as to bury the contact holes CH and the interconnection grooves M. The interconnection layer 105 is preferably formed by electroplating or electroless plating, but it is also possible to form the interconnection layer 105 by CVD, PVD, sputtering, or the like. Note that the seed film 104 is integrally formed with the interconnection layer 105.

Due to the burying of the contact holes CH and the interconnection grooves M, unevenness having a height of for example about 800 nm is caused on the surface of the interconnection layer 105.

The above process is carried out in a manner similar to the related art, but in the polishing method of the present invention, the excess metal film 102 present on the interlayer insulation film 102 is removed by not chemical mechanical polishing, but electrolytic elution using a cathode member smaller than the surface.

Figure 3A:
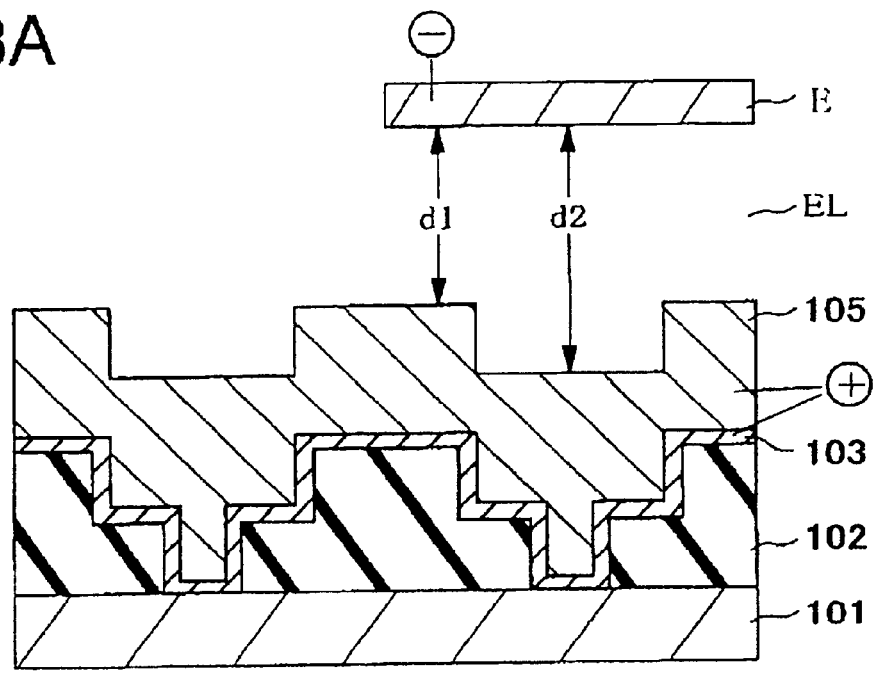
FIGS. 3A and 3B are views of steps continuing from FIGS. 2A and 2B, showing the step of electrolytic elution in a region of the copper film.

That is, as shown in FIG. 3A, a relatively small cathode member E compared with the interconnection layer 105 is arranged to face a region of the surface, that is, the interconnection layer 105, and an electrolytic solution EL is interposed at least between that region of the interconnection layer 105 and the cathode member E.

As the composition of the above electrolytic solution, for example, phosphoric acid, nitric acid, ammonia chloride, sulfuric acid, hydrochloric acid, or the like or a mixture of these can be used.

Figure 3B:
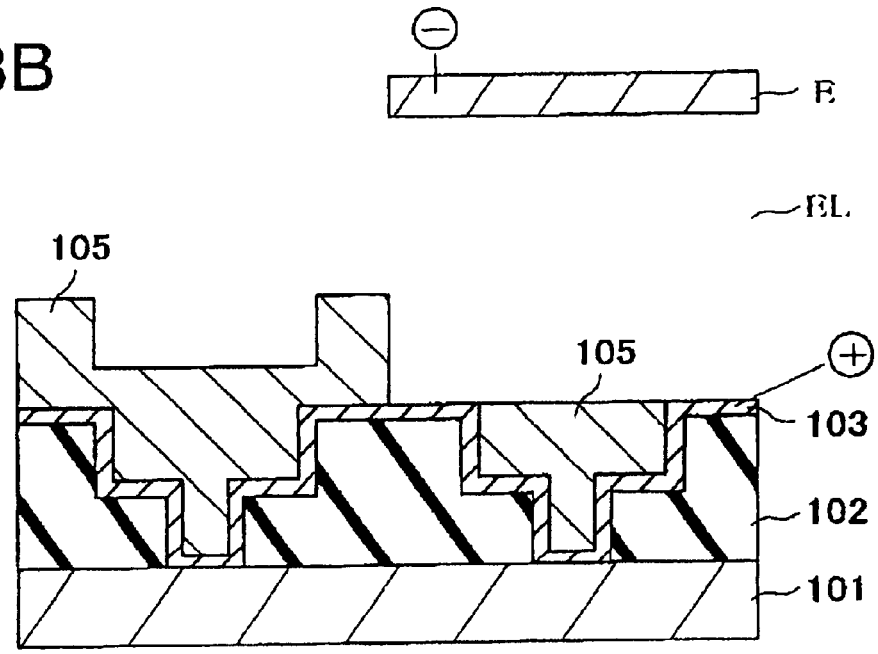

In the above state, as shown in FIG. 3B, a voltage is applied with the cathode member E as a cathode and the interconnection layer 105 as an anode to electrolytically polish and flatten the interconnection layer 105 by electrolytic elution in that region of the interconnection layer 105.

At this time, because a current is applied through the electrolytic solution, if the potential difference between the interconnection layer 105 on the anode and the cathode member E of the cathode is constant, the current density becomes larger the shorter the distance between electrodes. Therefore, the distance d1 between the cathode member E and a projecting portion of the interconnection layer 105 having unevenness on its surface is shorter than the distance d2 between the cathode member E and a recessed portion of the interconnection layer 105 and thus the current density is higher. Consequently, the speed of the electrolytic elution is higher and a projecting portion of the interconnection layer 105 is preferentially first electrolytically polished.

The electrolytic polishing in that region of the above interconnection layer 105 is carried out until removing a target amount of the interconnection layer 105. Here, the target amount of removal of the interconnection layer 105 in that region is calculated in advance in a separate step from the thickness data measured by a thickness meter for the interconnection layer 105. Alternatively, it is measured and calculated during the above electrolytic polishing step. Further, it is possible to measure the electrolytic current of the electrolytic elution in the step of electrolytic polishing and use the electrolytic current as a quantity related to the remaining amount of removal of the interconnection layer 105.

Figure 4A:
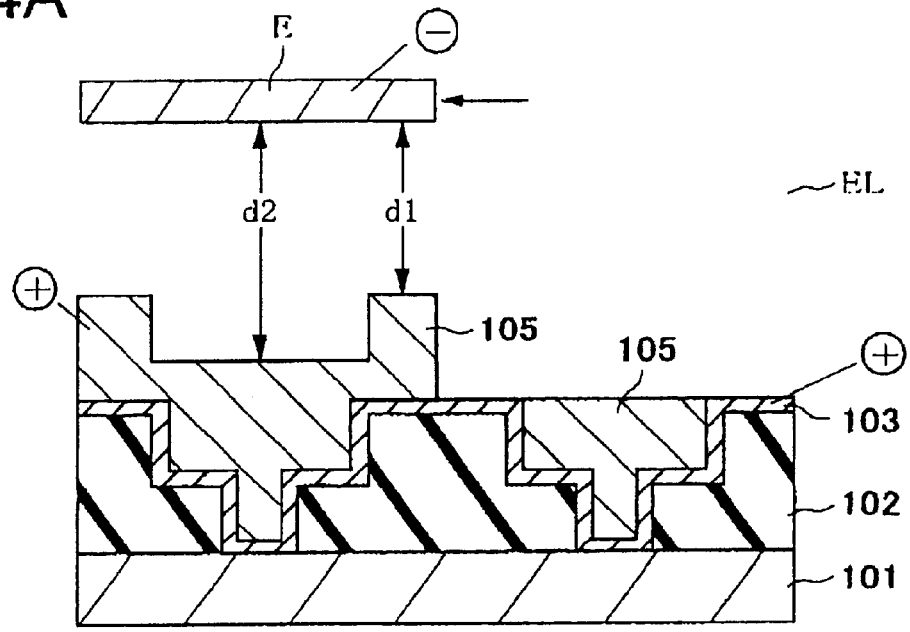
FIGS. 4A and 4B are views of steps continuing from FIGS. 3A and 3B, showing the step of electrolytic elution in another region of the copper film.

Next, as shown in FIG. 4A, the cathode member E is moved from the region where the flattening process of the interconnection layer 105 by electrolytic polishing is finished to another region. In this other region, since the interconnection layer 105 has not been removed, the cathode member E faces the interconnection layer 105 having unevenness with a distance d1 to a projecting portion and a distance d2 to a recessed portion.

Figure 4B:
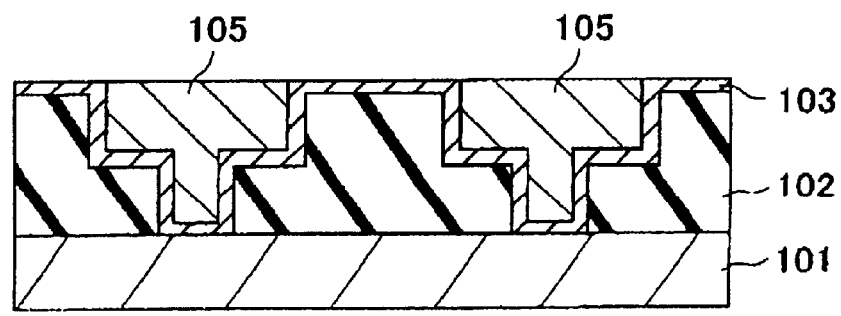

Next, similar with the flattening process of the interconnection layer 105 by electrolytic polishing in the former region as shown in FIG. 3B, the interconnection layer 105 is flattened in the other region by electrolytic polishing as shown in FIG. 4B.

Also in this step, similar with the above, the interconnection layer 105 is preferentially electrolytically polished from the projecting portions. The electrolytic polishing in the other region of the above interconnection layer 105, similar with the above, is carried out until removing a target amount of the interconnection layer 105 in the other region.

In the subsequent step, the barrier metal film deposited outside the contact holes and the interconnection grooves is removed.

Due to the above steps, contact hole connections and copper interconnections preferable for a semiconductor device are formed simultaneously by the dual damascene process.

According to the polishing method applied to a process of formation of copper interconnections by a dual damascene process in a semiconductor device having copper interconnections, it is possible to set the distribution of necessary amounts of removal under conditions obtained by measuring beforehand the variability of the thickness of a copper film plated on the surface and in accordance with this remove the copper film by polishing as necessary for formation of interconnections by exactly the right amounts.

In addition, by moving the cathode member so that the actual distribution of amounts of removal over the entire surface comprising partial amounts of removal superposed on the surface coincides with the above preset distribution of amounts of removal, it is possible to remove the copper film by polishing as necessary for formation of interconnections by exactly the right amounts over the entire surface.

Further, since the copper film on the surface is removed by polishing by electrolytic elution, unlike the CMP method, it is no longer necessary to apply pressure on the film, so occurrence of cracks of the copper film or damage to the lower interlayer insulation film can be suppressed.

In addition, in the above polishing and removal by electrolytic elution, only the projecting portions are selectively electrolytically eluded in unevenness formed on the surface of the copper film, so effective flattening can be achieved.

As described above, according to the polishing method of the present invention, when flattening a copper film by polishing, an initial unevenness can be easily flattened, excellent efficiency of removal of an excess copper film can be obtained, and damage to the lower interlayer insulation film can be suppressed.

Second Embodiment

Figure 5:
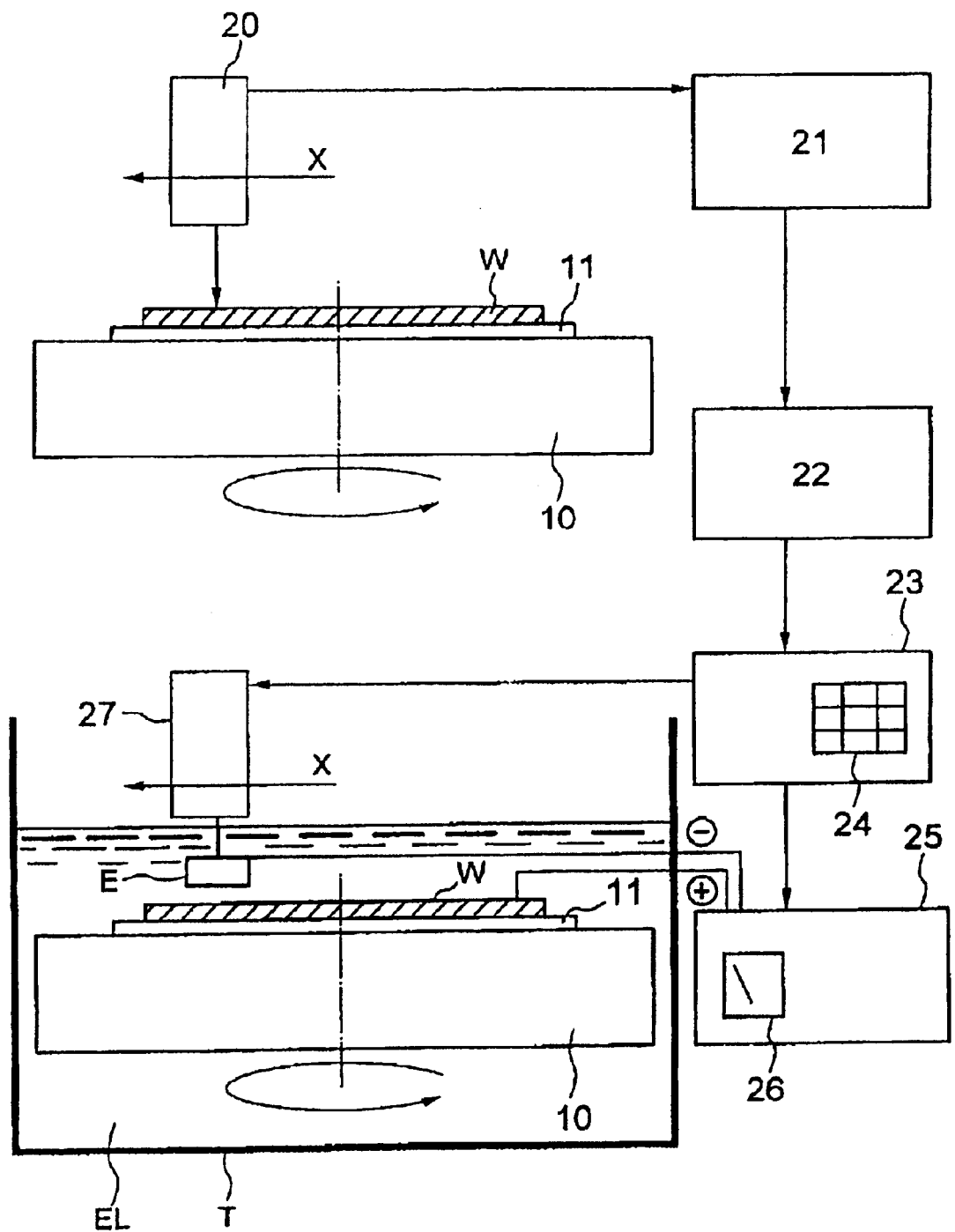
FIG. 5 is a schematic view of a polishing apparatus according to a second embodiment of the present invention.

FIG. 5 is a schematic view of a polishing apparatus used in the above step of electrolytic polishing of the interconnection layer.

Namely, the polishing apparatus of the present embodiment includes a table 10 for carrying a wafer W to be polished (hereinafter, also referred to as "wafer") that has a copper film on its surface, a securing means 11 such as a vacuum chuck provided on the table 10, a measuring means 21 provided with a measuring head 20, a calculating unit 22, a controller 23, a control panel 24, a power supply 25, an ammeter 26, a cathode member E, a moving mechanism 27 of the cathode member E, and an electrolytic bath tank T for storing the electrolytic solution EL.

Note that, although not illustrated in the figure, the above polishing apparatus is installed in a clean room, and a loading/unloading port for loading and unloading a wafer cassette storing wafers to be polished in or out of the clean room is provided in the clean room. Further, a wafer conveyance robot for transferring the wafers between the wafer cassette loaded in the clean room through this loading/unloading port and the polishing apparatus is arranged between the loading/unloading port and the polishing apparatus.

The wafer W, for example, is secured by a securing means 11 such as a vacuum chuck on the rotatable table 10. As the securing means, in addition to a vacuum chuck, use can also be made of an edge clamp or a mechanical clamp. In case of an edge clamp, a current can be supplied to the wafer that serves as the anode through the clamp portion grounding the edge portion of the wafer.

The thickness of the copper film, or data corresponding to the thickness, is measured by the measuring means 21 provided with a measuring head 20. The thickness of the copper film can be measured, for example, by making the measuring head 20 scan in one direction (the X-direction in FIG. 5) while rotating the table 10, for example, by using the method of measuring the sheet resistance with a four-probe type sheet resistance meter and converting it to thickness using a known sheet resistance or by using the method of measuring thickness equivalent data by an eddy current type detector or an electrostatic capacitance type detector.

From the obtained thickness equivalent data of the copper film, the calculating unit 22 calculates the target amount of removal of the copper film and outputs it to the controller 23.

The controller 23 sets the target amount of removal of the copper film from this input and, in accordance with this setting, controls the voltage output from the power supply 25 and the moving mechanism 27 of the cathode member 27. In addition, the controller 23 can receive outside input from the control panel 24.

In the step of electrolytic polishing by electrolytic elution, the wafer W is immersed in the electrolytic solution EL in the electrolytic bath tank T together with the table 10.

The cathode member E, which is relatively smaller than the surface of the wafer W, is arranged so as to face one region of the surface. The cathode member E, for example, is a circular plate having a diameter of 200 nm comprised of oxygen-free copper and is arranged to be parallel with the wafer in the electrolytic solution EL.

At the edge of the wafer, for example, by conductance through the clamp portion grounded at places 2 mm away from the edge, a direct-current voltage or a pulse voltage is applied by the power supply 25 with the surface of the wafer, that is, the copper film, as an anode and the cathode member E as a cathode.

The power supply is not a low voltage power supply that outputs a constant voltage at all times, but preferably is a DC power supply with a built-in switching regulator circuit for outputting voltage in pulses by a certain cycle.

Specifically, use is made of a power supply that outputs a pulse voltage by a certain cycle and is able to be suitably changed in pulse width. As an example, use may be made of a power supply whose output voltage is 100 to 150V, or 30V depending on the voltage tolerance of a semiconductor device, whose maximum output current is 2 to 3A (for example 2.2A), and whose pulse width may be changed to 1, 2, 3, 5, 10, 20, or 30 $\mu$s.

The voltage and pulse width of the above pulse voltage can be selected by the distance between the wafer and the cathode member and the electrical resistance of the electrolytic solution so as to enable the most effective removal of the copper film.

Outputting a pulse voltage with a short width as explained above is for making the amount of the anodic oxidation per pulse very small. Namely, this is effective for preventing sudden and huge anode oxidation of the copper film compared with the target amount of removal due to discharge caused by a sudden change of the distance between electrodes in a case of contact with unevenness of the surface of the wafer or spark discharge due to a sudden change of electrical resistance occurring when air bubbles, particles, or the like are interposed and for achieving continuity of as small amounts as possible.

Further, since the output voltage is relatively high compared with the output current, it is possible to set a certain mechanical safety margin when setting the electrode distance. Namely, even if the electrode distance changes somewhat, since the output voltage is high, the change in the current value is small.

If such a voltage is applied, as described in the first embodiment, electrolytic polishing is performed in one region of the surface.

For example, the cathode member E is made to scan in one direction (the X-direction in FIG. 5) by the moving mechanism 27 while rotating the table 10 so as to electrolytically polish the entire surface by electrolytic elution. The cathode member E can be moved by the moving mechanism 27 continuously or stepwise.

The voltage applied by the above power supply to the cathode and anode and the moving mechanism 27 are controlled by the controller 23 in accordance with the preset target amount of removal of the copper film.

For example, when the moving mechanism 27 moves the cathode member 27 continuously, the speed of movement of the cathode member E can be controlled in accordance with the preset target amount of removal of the copper film. In regions where the speed of movement is low, the cathode member E faces the surface for a longer time, the time of electrolytic elution is longer, and a larger amount of copper film can be polished electrolytically by electrolytic elution. On the other hand, in regions where the speed of movement is high, the time when the cathode member E faces the surface is shorter and the time of electrolytic elution is shorter, leading to a smaller amount of electrolytic elution of the copper film.

Figure 6A:
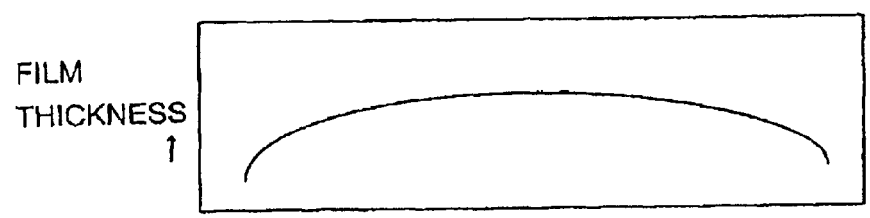
FIGS. 6A to 6C show the thickness profile of the copper film, removal profile, and speed of movement profile of an electrode, respectively, according to the second embodiment.
Figure 6B:
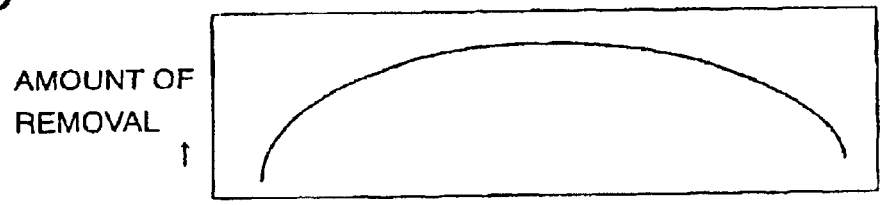
Figure 6C:
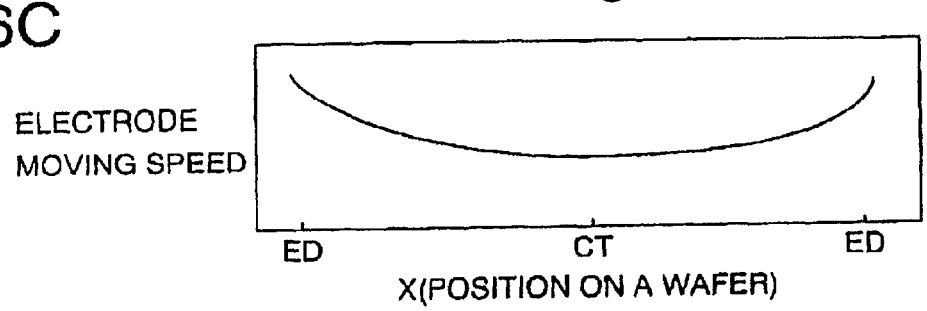

For example, when the measurement result of the copper thickness is that shown by the graph in FIG. 6A, that is, the film has a thickness profile thick at the center portion CT and thin at the edge portion ED, the target amount of removal of the copper film is set to be large at the center portion CT and small at the edge ED as shown in the profile of FIG. 6B. The controller 23 controls the speed of movement of the cathode member E so as to satisfy the profile of the target amount of removal, for example, as shown in FIG. 6C, to move fast at the center portion CT and slow at the edge ED.

In addition, it is possible to monitor the electrolytic current of the electrolytic elution by the ammeter 26 and, for example, to have the controller 23 control the voltage so that the current is constant.

Figure 7A:
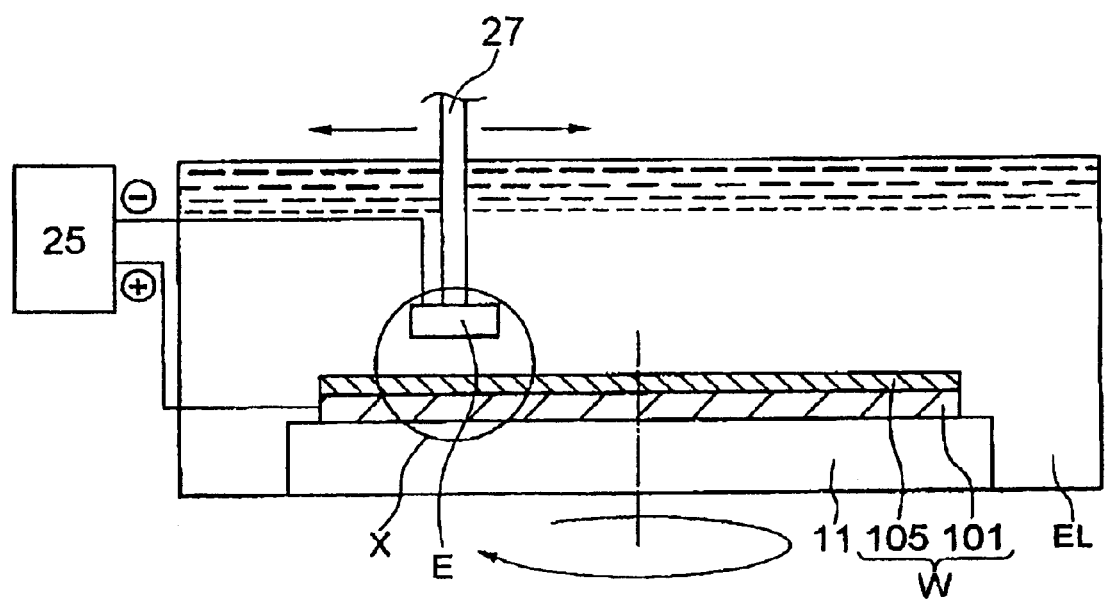
FIG. 7A is an enlarged view of the principal portions of the polishing apparatus according to the second embodiment.
Figure 7B:
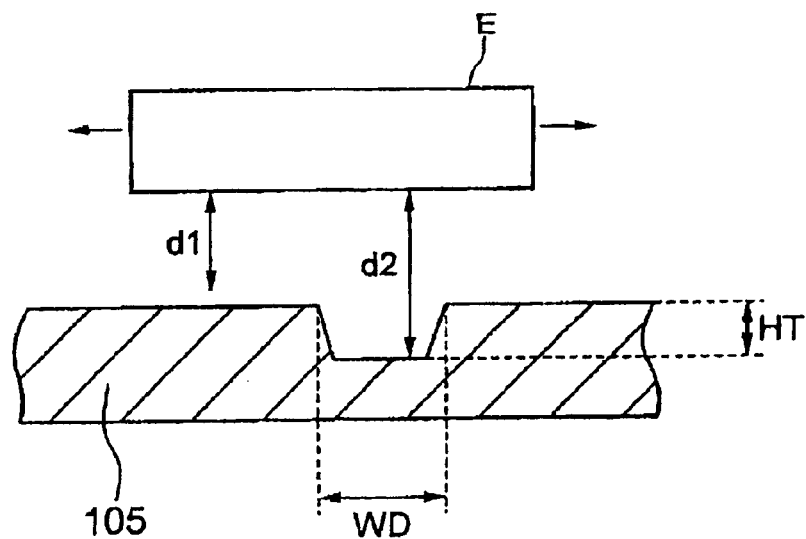
FIG. 7B is an enlarged view of the X portion in FIG. 7A.

FIG. 7A is a view for explaining in detail the inside of the electrolytic bath tank where the polishing apparatus shown in FIG. 5 performs electrolytic elution, while FIG. 7B is an enlarged view of the X portion in FIG. 7A.

A wafer W comprised of a substrate 101 formed with an interconnection layer 105 as the surface to be polished is secured by a securing means such as a vacuum chuck and driven to rotate. A cathode member E is arranged to be parallel with the surface at one region of the wafer W. An electrolytic solution EL for electrolytic elution of copper is interposed between the interconnection layer 105 and the cathode member E.

Here, as the above electrolytic solution for electrolytic elution of copper, for example, phosphoric acid, nitric acid, ammonia chloride, sulfuric acid, hydrochloric acid, etc. or a mixture of these can be used.

While a not shown driving mechanism rotates the wafer W, the power supply 25 supplies a voltage with the cathode member E as a cathode and the interconnection layer 105 and the barrier metal film (not shown) as an anode. The moving mechanism 27 moves the cathode member E in a certain direction.

Here, as shown in FIG. 7B, the distance d1 between a projecting portion on the surface of the interconnection layer 105 in the range microscopically electrolytically acted on and the cathode member E is shorter than the distance d2 between a recessed portion on the surface of the interconnection layer 105 and the cathode member E, so when the potential difference between the cathode member E and the interconnection layer 105 is constant, the current density at the projecting portion is greater than that at the recessed portion and therefore the electrolytic elution is accelerated.

Here, if the distance between the cathode member E and wafer is too small, the flow action of the electrolytic solution interposed between the cathode member and the wafer does not function sufficiently, so it is desirable to set this distance larger than a certain value, for example, 2 mm or so.

This scale acts in the range of the level of interconnections having a height HT of the unevenness of about 0.5 to 1.5 $\mu$m and a width WD of about 0.1 to 100 $\mu$m.

Macroscopically, however, sometimes the surface of the copper film is oxidized by anodic oxidation and passivated. The passivation film (not illustrated) has a higher electrical resistance than copper. Hence, after a passivation film is formed on the surface of the copper film, the value of the current passing through the cathode member from the copper film through the electrolytic solution declines, and the electrolytic elution is suppressed by that extent.

When a passivation film is formed on the surface of the copper film as mentioned above, it is possible to apply a higher voltage partially on the passivation film portion to selectively remove this portion. Although the newly exposed copper surface will be passivated intensively, the surface can be polished successfully by repeatedly applying the higher voltage to the passivated region to remove the passivation film.

Further, the power supply 25 of the polishing apparatus of the present embodiment includes an ammeter 26 able to monitor the electrolytic current flowing through the power supply 25. The monitored current signal can be output to the controller 23. Further, instead of the ammeter 26, the power supply may include a resistance meter serving as a means for detecting electrical resistance. The function thereof is the same as the current detection means.

Further, the controller 23 can control the operation of a flattening apparatus based on the current value determined from the current value signal from the ammeter of the power supply 25. Specifically, it can control the operation of the flattening apparatus based on the current value determined from the current value signal so as to stop the application of voltage.

The control panel 24 connected to the controller 23 is for enabling an operator to input various data. For example, it displays the monitored current value signal.

By monitoring the electrolytic current with the ammeter, the flattening process can be controlled and the state of progress of the flattening process can be correctly grasped.

For example, in a hardware configuration enabling scanning action by an electrode as explained above, the electrode is secured at a certain point of the surface, the change of the current value is monitored, and the electrode is moved when the current value starts to decrease. This operation is repeated to scan the entire surface.

If a passivation film is formed as described above, the current value decreases along with the formation of the passivation film and increases along with the removal thereof. This change is repeated.

In the above polishing, if the entire copper film is removed by electrolytic action to expose the surface of the barrier metal film, since the electrical resistance of the barrier metal film is higher than that of the copper film, the current value begins to declines after the passivation film is removed. When the current value begins to declines, voltage stops being applied to stop the progress of passivation due to the anodic oxidation. Flattening of the initial unevenness of the copper film is achieved by the process up to here.

Next, the barrier metal film deposited outside the contact holes and the interconnection grooves is removed, whereby copper interconnections are formed by the damascene process.

According to the polishing apparatus according to the present embodiment, since the material is removed only electrochemically, the material can be removed to flatten the film by an extremely low polishing pressure compared with conventional chemical mechanical polishing. Even compared with simple mechanical polishing, this is highly advantageous in reducing scratches, reducing step differences, reducing dishing and erosion, etc. In addition, the ability to flatten without mechanical contact gives decisive superiority in reducing scratches.

Further, since flattening is possible at an extremely low pressure, it is very useful when an organic film of a low dielectric constant or a porous insulation film of a low dielectric constant, which have low mechanical strengths and are easily broken by conventional chemical mechanical polishing, is used for the interlayer insulation film.

In the chemical mechanical polishing of the related art, when using a slurry containing alumina particles etc., the alumina particles sometimes remain without being consumed after contributing to the CMP process or may be buried in the surface of the copper film. In the polishing method of the present invention, however, since a flattening method using an electrolytic solution not containing a polishing abrasive is possible, there are no particles buried in or remaining at the copper film left for forming the interconnections.

Further, it is possible to set the distribution of necessary amounts of removal under conditions obtained by measuring beforehand the variability of the thickness of a copper film plated on a surface and in accordance with this remove amounts of the copper film by polishing as necessary for formation of interconnections by exactly the right amounts. Specifically, by moving the cathode member so that the actual distribution of amounts of removal over the entire surface comprised of partial amounts of removal superposed on the surface coincides with the above preset distribution of amounts of removal, it is possible to remove the copper film by polishing as necessary for formation of interconnections by exactly the right amounts over the entire surface.

As described above, according to the polishing apparatus of the present invention, when flattening a copper film by polishing, an initial unevenness can be easily flattened, excellent efficiency of removal of excess copper film can be obtained, and damage to the lower interlayer insulation film can be suppressed.

Third Embodiment

In the first and second embodiments, explanations were made of cases where the cathode members had flat surfaces and were able to give uniform electric fields at one region of a surface, but it is also possible to use a cathode member having a pattern of unevenness on the voltage application surface corresponding to the interconnection pattern formed on a wafer, that is, the uneven pattern of the surface of the wafer.

Figure 8A:
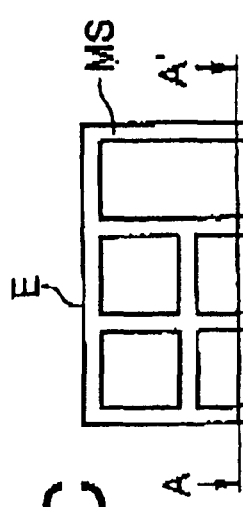
FIGS. 8A and 8C are plan views of a cathode member of a polishing apparatus according to the third embodiment.
Figure 8C:
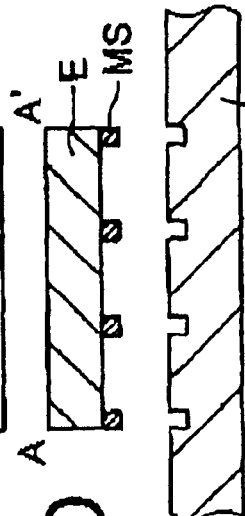
Figure 8B:
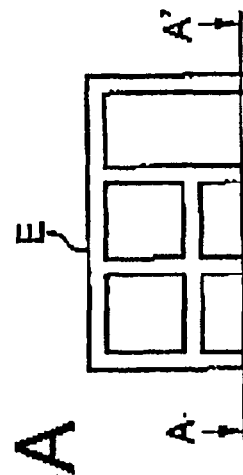
FIGS. 8B and 8D are sectional views when the cathode member is made to face the surface.

FIG. 8A is a plan view of an example of a cathode member according to the present embodiment, while FIG. 8B is a sectional view of the cathode member in FIG. 8A along the A–A' plane. These show the configuration when the cathode member is made to face the surface to be polished, that is, the interconnection layer.

That is, the cathode member E is shaped corresponding to the uneven pattern of the surface of the wafer, that is, the interconnection layer 105, so that portions corresponding to projecting portions of the interconnection layer 105 project out so as to give a strong electric field and so that portions corresponding to recessed portions of the interconnection layer 105 are recessed so as to give a weak electric field.

Figure 8D:
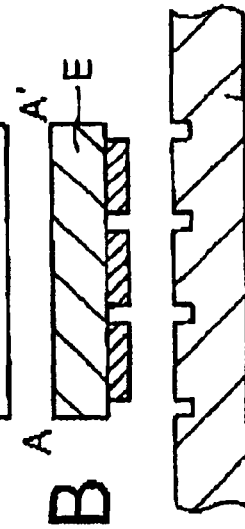

Further, FIG. 8C is a plan view of another example of a cathode member according to the present embodiment, while FIG. 8D is a sectional view along the A–A' line. These show the configuration when the cathode member is made to face the surface to be polished, that is, the interconnection layer 105.

That is, the cathode member E is formed, corresponding to the uneven pattern of the surface of the wafer, that is, the interconnection layer 105, so that masks MS are formed at portions corresponding to recessed portions of the interconnection layer 105 to give a weak electric field and so that the surface of the cathode member E is exposed at portions corresponding to recessed portions of the interconnection layer 105 to give a strong electric field.

When using such a cathode member having an uneven pattern on the voltage application surface corresponding to the uneven pattern of the surface of the wafer, the cathode member is positioned with respect to each interconnection pattern at predetermined regions of the wafer. When the polishing is finished, the cathode member is moved stepwise to a neighboring region.

Figure 8E:
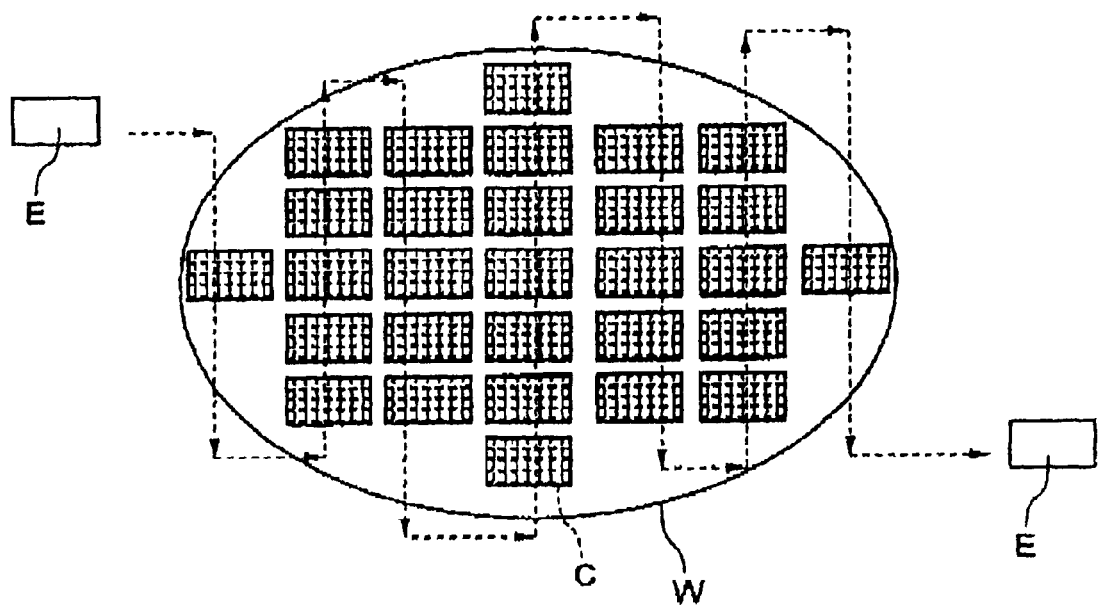
FIG. 8E is a schematic view showing how the cathode member is moved.

In this case, the wafer is not driven to rotate during polishing, but is at rest in the electrolytic solution. For example, as shown in FIG. 8E, by the same procedure as in exposure of a stepper aligner, the cathode member E is moved stepwise in the X- and Y-directions to polish each unit semiconductor chip C on the wafer W until processing the entire surface of the wafer.

The configuration and operation of the rest of the apparatus such as the measuring means provided with a measuring head for measuring the thickness of the copper film or data corresponding to the thickness and the calculating unit for calculating the target amount of removal of the copper film from the obtained thickness equivalent data of the copper film can be made the same way as in the first and second embodiments. The same effects can be achieved as the first and second embodiments.

Fourth Embodiment

In the first and second embodiments, the cathode member was provided a mechanism for mechanical movement, but it is possible to use a cathode member which is divided into a plurality of regions which are arranged insulated from each other and which faces the entire surface overall. By changing the position of application of voltage to the divided cathode member, the substantially equivalent is obtained as when changing the position of the cathode member facing the surface from one region to another region.

Figure 9A:
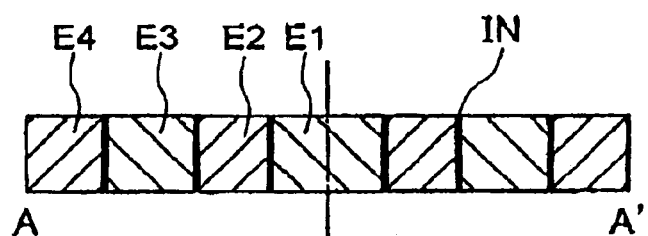
FIGS. 9A and 9B are a sectional view and a plan view of a cathode member of a polishing apparatus according to a fourth embodiment, respectively.
Figure 9B:
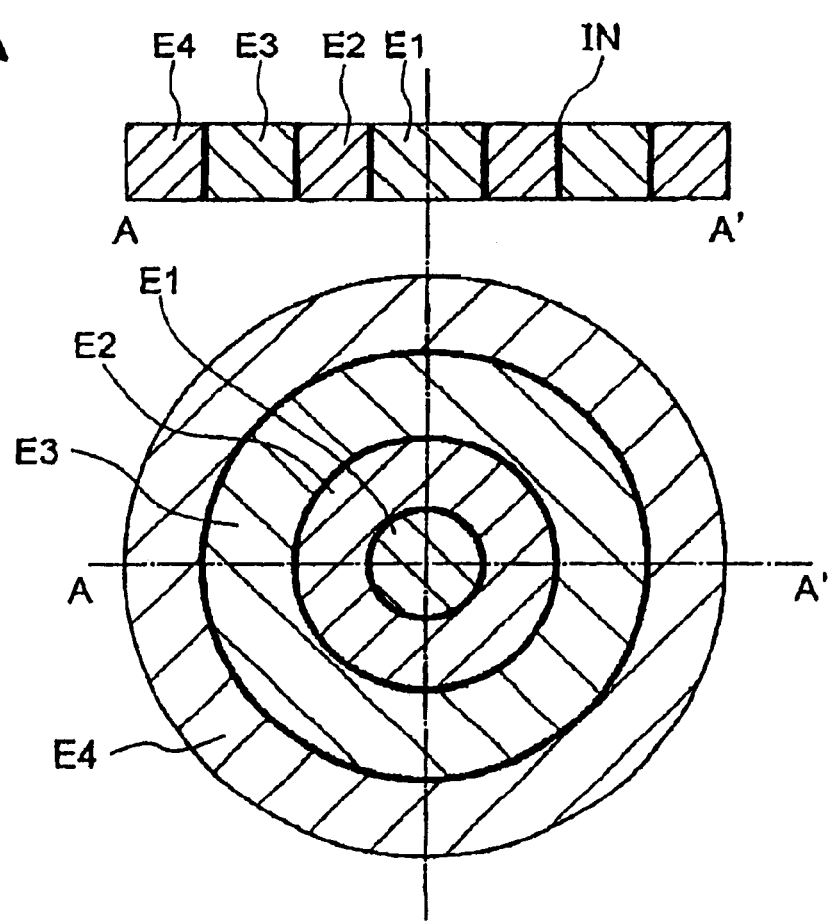

Namely, for example, as shown in the sectional view in FIG. 9A and the plan view in FIG. 9B, the cathode member is made a cathode member divided into a plurality of concentric circular regions (four in FIG. 9A and FIG. 9B, that is, E1, E2, E3, and E4). Two neighboring regions are held insulated from each other by an insulator IN. The cathode member as a whole faces the entire surface.

Figure 10A:
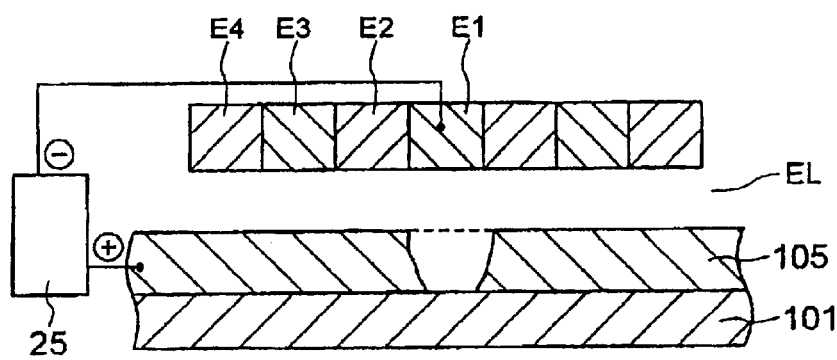
FIGS. 10A to 10C are sectional views showing the polishing method using the polishing apparatus according to the fourth embodiment.

In order to electrolytically polish by electrolytic elution using the plurality of concentric circular regions (E1, E2, E3, and E4), as shown in FIG. 10A, the above regions (E1, E2, E3, and E4) are arranged as a whole to face the wafer comprised of the substrate 101 formed with the interconnection layer 105 as the surface to be polished via the electrolytic solution EL. A predetermined voltage is applied by the power supply 25 with the interconnection layer 105 at the edge portion of the wafer connected as an anode and the innermost region E1 connected as a cathode. As a result, the portion of the interconnection layer 105 facing the region E1 is electrolytically polished by electrolytic elution.

Figure 10B:
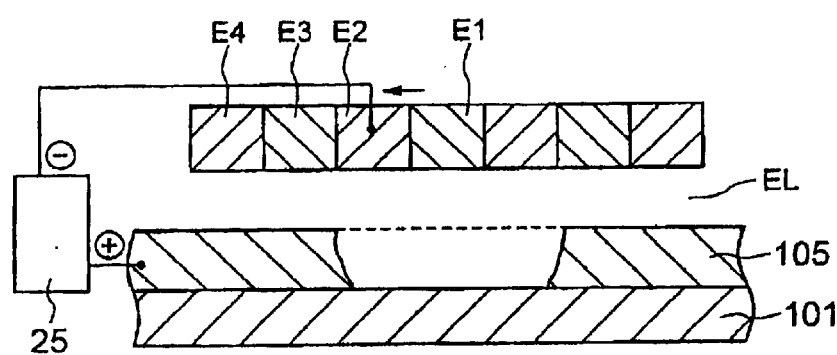

After the interconnection layer 105 facing the region E1 finishes being polished, as shown in FIG. 10B, a predetermined voltage is applied with the second innermost region E2 connected as a cathode. The portion of the interconnection layer 105 facing the region E2 is electrolytically polished by electrolytic elution.

Figure 10C:
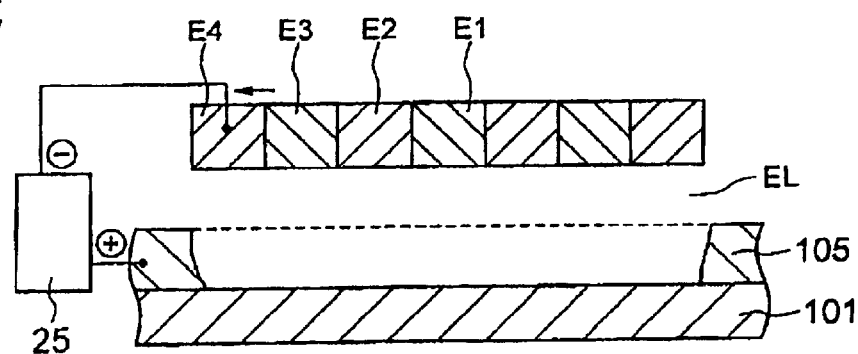

In this way, by changing the position of application of voltage from the inner to the outer concentric circular regions (E1, E2, E3, and E4), the entire surface is electrolytically polished, whereby, as shown in FIG. 10C, the entire surface can be uniformly polished without leaving any island-like parts of the interconnection layer 105.

The configuration and operation of the rest of the apparatus such as the measuring means provided with a measuring head for measuring the thickness of the copper film or data corresponding to the thickness and the calculating unit for calculating the target amount of removal of the copper film from the obtained thickness equivalent data of the copper film can be made the same way as in the first and second embodiments. The same effects can be achieved as the first and second embodiments.

Fifth Embodiment

Figure 11A:
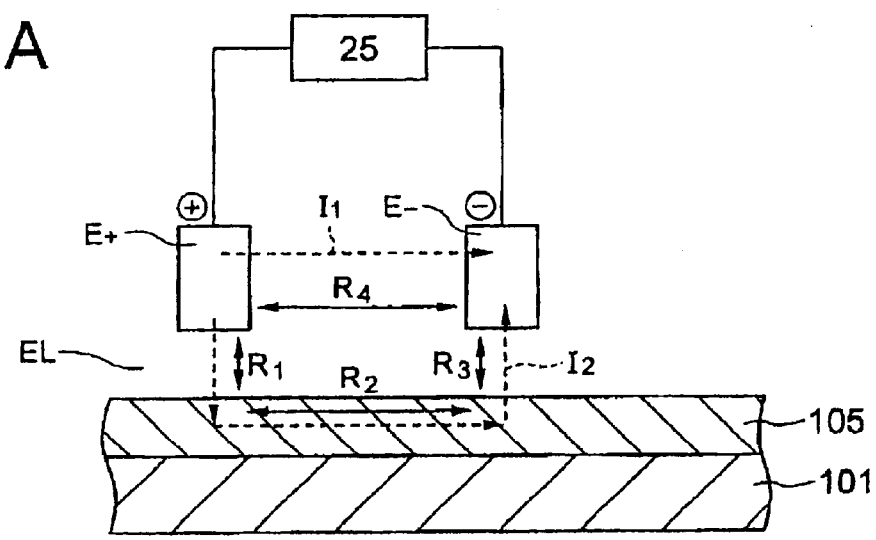

In the first and second embodiments, explanations were made of polishing apparatuses for electrolytic elution using a cathode member as a cathode and the interconnection layer as an anode. In this embodiment, as shown in FIG. 11A, the cathode member $E_-$ is made to face the interconnection layer 105 of the wafer comprised of the substrate 101 formed with the interconnection layer 105 as the surface to be polished, an anode member $E_+$ set apart from the cathode member $E_-$ by a certain distance is made to face the interconnection layer 105, an electrolytic solution is interposed at least between the interconnection layer 105 and the cathode member $E_-$ and between the interconnection layer 105 and the anode member $E_+$, and a voltage is applied to the cathode member $E_-$ and the anode member $E_+$.

At this time, the distance between the cathode member $E_-$ and the anode member $E_+$ is set sufficiently long, while the distances between the interconnection layer 105 and the cathode member $E_-$ and between the interconnection layer 105 and the anode member $E_+$ are set sufficiently short.

Therefore, the sum of the resistance R1 between the interconnection layer 105 and the anode member $E_+$, the resistance R2 of the portions of the interconnection layer 105 facing the cathode member $E_-$ and the anode member $E_+$ respectively, and the resistance R3 between the interconnection layer 105 and the cathode member $E_-$ is smaller than the direct resistance R4 between the anode member $E_+$ and the cathode member $E_-$, and the current $I_2$ from the anode member $E_+$ to the cathode member $E_-$ through the interconnection layer 105 is larger than the current $I_1$ from the anode member $E_+$ directly to the cathode member $E_-$, so the same effect is obtained as when applying voltage with the cathode member $E_-$ as a cathode and the surface to be polished, that is, the interconnection layer 105, as an anode.

Figure 11B:
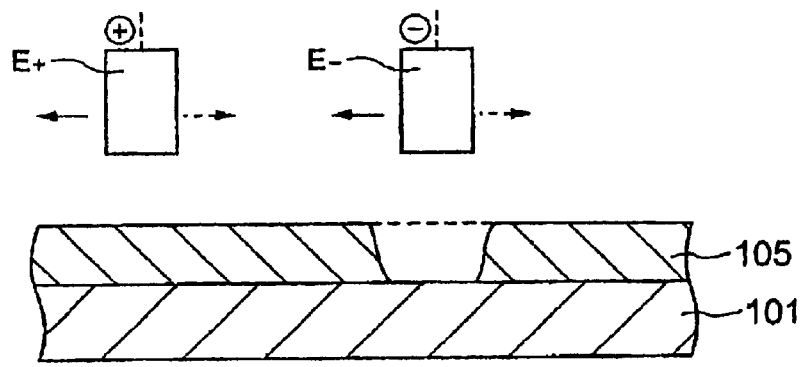
FIG. 11B is a view for explaining a polishing method using the polishing apparatus.

As a result, as shown in FIG. 11B, electrolytic elution occurs at the surface of the portion of the interconnection layer 105 facing the cathode member $E_-$.

If the above anode member can be ionized more easily than the surface to be polished, that is, the copper, the anode member would end up being eluted in the above electrolytic elution reaction. Therefore, it is preferable to use a metal more precious than copper for the anode member. For example, use can be made of an electrode comprised of platinum or titanium covered by platinum.

For electrolytic elution over the entire surface of the surface using the above cathode member $E_-$ and the anode member $E_+$, the region facing the cathode member $E_-$ and the anode member $E_+$ is moved from one region to another region.

Here, if the interconnection layer 105 between the cathode member $E_-$ and the anode member $E_+$ is eluted completely, the current passing through the interconnection layer 105 disappears, the electrolytic elution reaction stops, and the electrolytic elution can no longer be carried out over the entire surface of the surface.

Figure 12A:
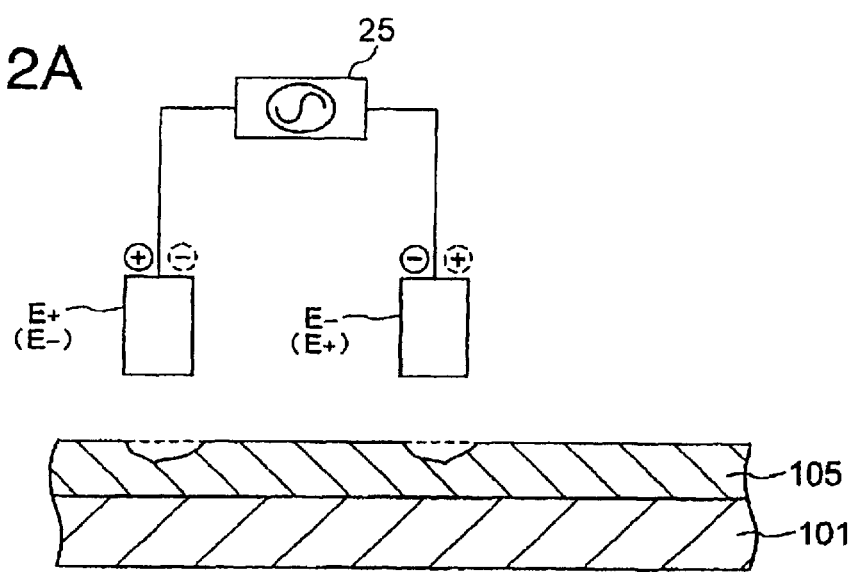
FIGS. 12A to 12B are views for explaining the polishing method using the polishing apparatus according to the fifth embodiment.
Figure 12B:
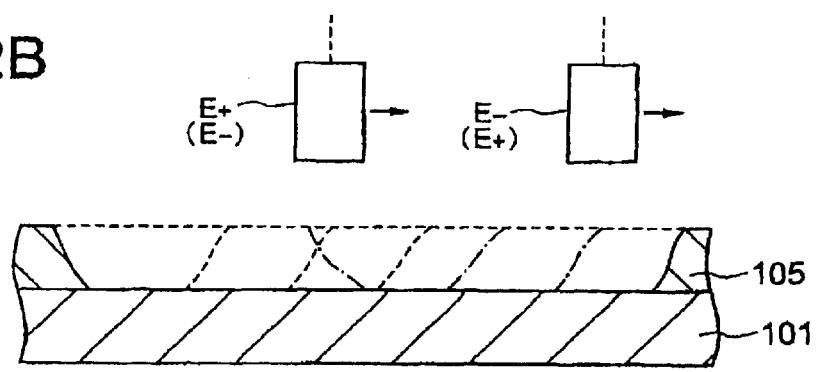

To prevent this, as shown in FIG. 12A, it is preferable to apply an alternating current voltage between the cathode member $E_-$ and the anode member $E_+$. In this case, since the cathode and the anode are alternated between each other and electrolytic elution occurs at portions facing each electrode, the two cathodes are moved before all of the interconnection layer 105 at a certain portion is completely eluted, whereby, as shown in FIG. 12B, it is possible to electrolytically polish the entire surface of the wafer by electrolytic elution.

The configuration and operation of the rest of the apparatus such as the measuring means provided with a measuring head for measuring the thickness of the copper film or data corresponding to the thickness and the calculating unit for calculating the target amount of removal of the copper film from the obtained thickness equivalent data of the copper film can be made the same way as in the first and second embodiments. The same effects can be achieved as the first and second embodiments.

Sixth Embodiment

In the second embodiment, the thickness of the copper film or data corresponding to the thickness is measured by a measuring means provided with a measuring head beforehand, the profile of the amounts of copper film to be removed is calculated from the obtained thickness equivalent data of the copper film, and the cathode member is moved based on this, but the present embodiment provides a method of electrolytic polishing by electrolytic elution which measures the thickness equivalent data during the electrolytic elution, in particular, a method of measuring the electrolytic current of the electrolytic polishing as the thickness equivalent data.

Figure 13A:
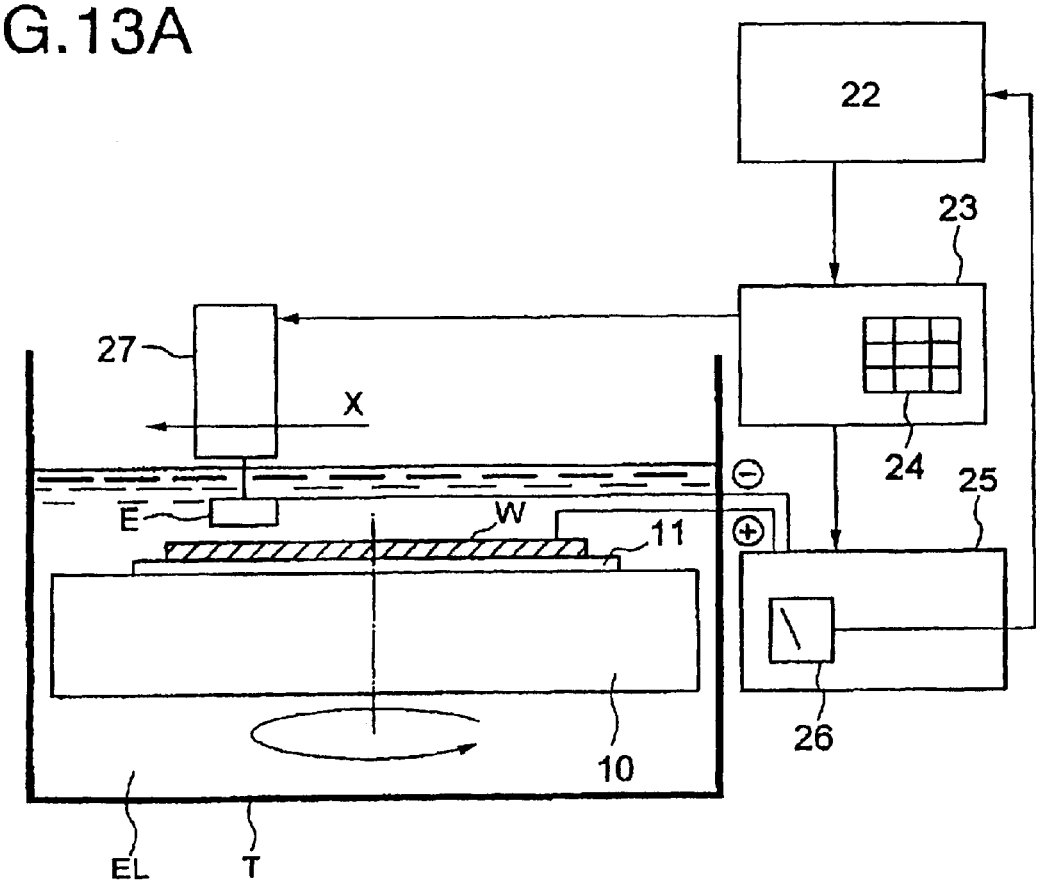

FIG. 13A is a schematic view of a polishing apparatus according to the present embodiment.

Namely, the polishing apparatus of the present embodiment includes a table 10 for carrying a wafer W to be polished (hereinafter, also referred to as "wafer") that has a copper film on its surface, a securing means 11 such as a vacuum chuck provided on the table 10, a calculating unit 22, a controller 23, a control panel 24, a power supply 25, an ammeter 26, a cathode member E, a moving mechanism 27 for the cathode member E, and an electrolytic bath tank T for storing the electrolytic solution EL.

The wafer W, for example, is secured by a securing means 11 such as a vacuum chuck on the rotatable table 10 and is immersed in the electrolytic solution EL in the electrolytic bath tank T together with the table 10.

For example, the cathode member E which is relatively smaller than the surface of the wafer W is arranged to face one region of the surface while the table 10 is being rotated. A predetermined voltage such as a direct current voltage or a pulse voltage is supplied by the power supply 25 with the surface of wafer, that is, the copper film, used as an anode and the cathode member E as a cathode.

If such a voltage is applied, as described in the first embodiment, that region of the surface is electrolytically polished.

The electrolytic current at this time is monitored by the ammeter 26 and is output to the calculating unit 22. From the input current value, the calculating unit 22 calculates the remaining target amount of removal of the copper and outputs it to the controller 23.

The controller 23 sets the target amount of removal of the copper film from this input and in accordance with this controls the voltage output from the power supply 25 and the moving mechanism 27 of the cathode member 27. In addition, the controller 23 can receive outside input from the control panel 24.

Alternatively, the electrolytic current may be monitored by the ammeter 26, the target amount of the copper film to be removed at the point of time when the current value becomes a specified value determined as zero, the electrolytic polishing in that region of the surface finished, and the cathode member E moved by the moving mechanism 27 from this region to another region.

Figure 13B:
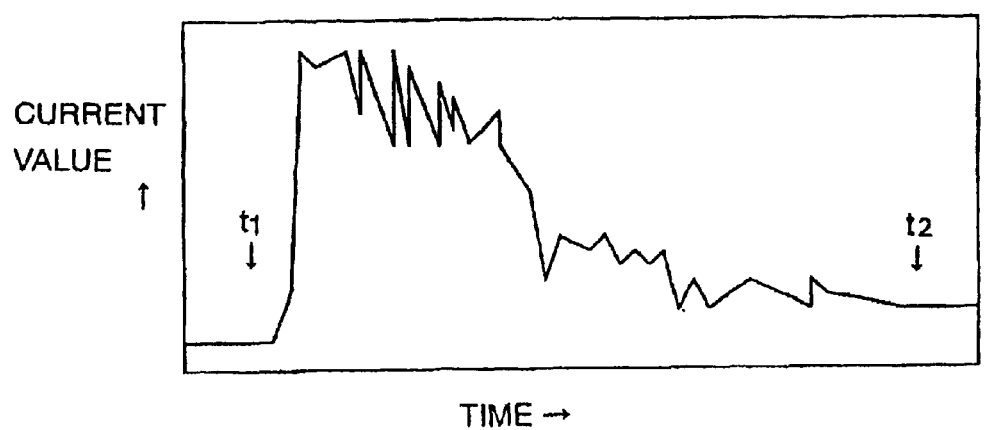
FIG. 13B shows the current profile monitored in this polishing apparatus.

For example, as shown by the graph in FIG. 13B, if the electrolytic elution reaction starts at the time $t_1$, the current value rises suddenly and reaches the maximum. While the reaction is proceeding, the remaining amount of the copper film decreases. Along with this, the current value gradually falls.

When the copper film outside the interconnection grooves is removed, the electrolytic elution reaction begins to slow, and the current value is sufficiently small compared with the above peak value, so a flat region with little variation sets in. At the time $t_2$ the remaining target amount of the copper film is determined to be zero, and the electrolytic polishing in that region of the surface is finished.

The configuration and operation of the rest of the apparatus can be made the same as in the first and second embodiments. The same effects can be achieved as the first and second embodiments.

Further, the present embodiment is also applicable to the polishing apparatuses in the third to fifth embodiments.

Seventh Embodiment

In the above second embodiment, the thickness of the copper film or data corresponding to the thickness is measured by a measuring means provided with a measuring head beforehand, the profile of the amounts of copper film to be removed is calculated from the obtained thickness equivalent data of the copper film, and the cathode member is moved based on this, but the present embodiment is a method for electrolytic polishing by electrolytic elution while measuring data corresponding to the thickness.

Figure 14:
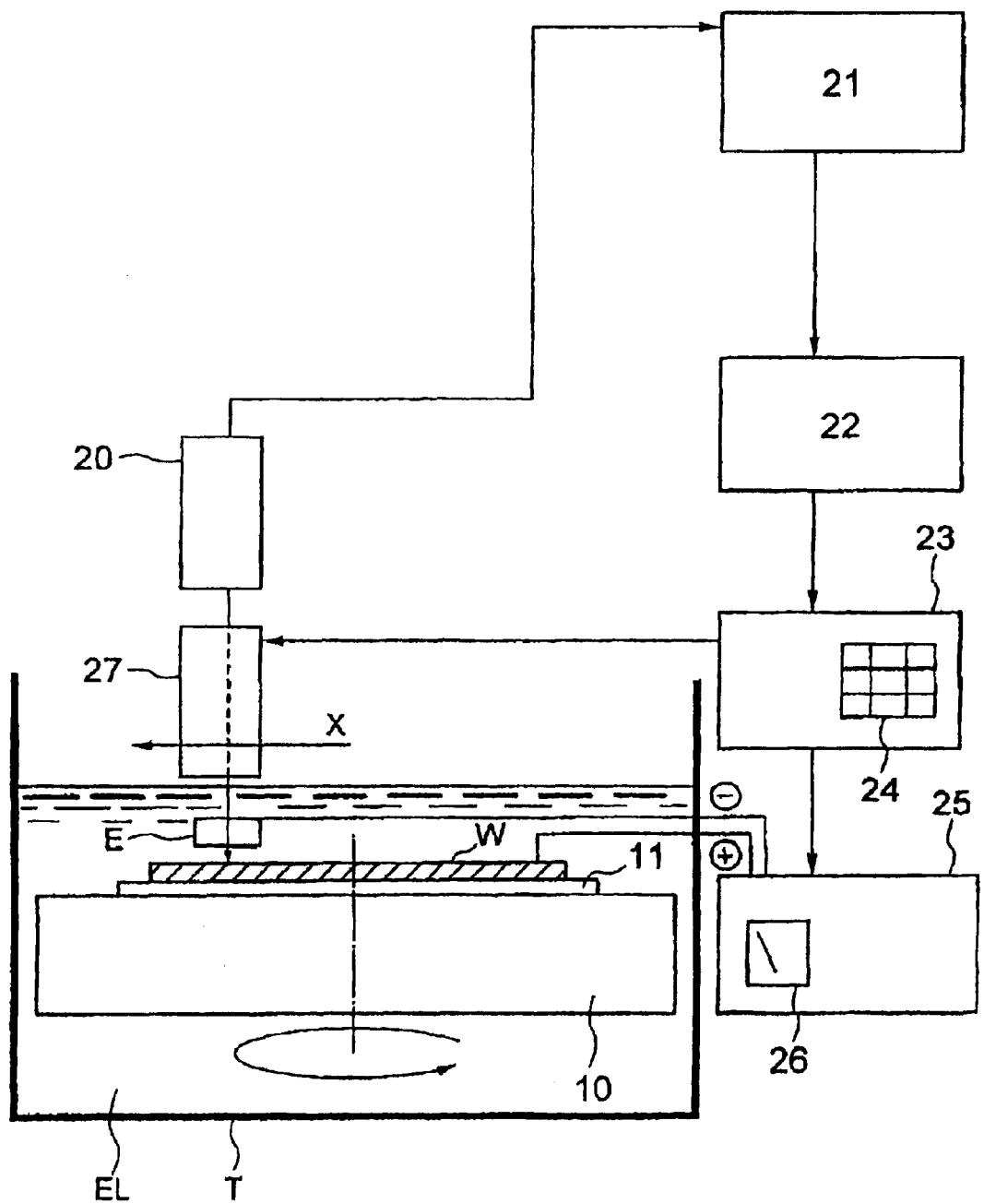
FIG. 14 is a schematic view of a polishing apparatus according to a seventh embodiment.

FIG. 14 is a schematic view of a polishing apparatus according to the present embodiment.

Namely, the polishing apparatus of the present embodiment includes a table 10 for carrying a wafer W to be polished (hereinafter, also referred to as "wafer") that has a copper film on its surface, a securing means 11 such as a vacuum chuck provided on the table 10, a measuring means 21 provided with a measuring head 20, a calculating unit 22, a controller 23, a control panel 24, a power supply 25, an ammeter 26, a cathode member E, a moving mechanism 27 for the cathode member E, and an electrolytic bath tank T for storing the electrolytic solution EL.

The wafer W, for example, is secured by a securing means 11 such as a vacuum chuck on the rotatable table 10 and is immersed in the electrolytic solution EL in the electrolytic bath tank T together with the table 10. The measuring head 20 and the cathode member E are arranged to face one region of the surface.

First, the thickness of the copper film at one region of the surface or data corresponding to the thickness is measured by the measuring means 21 provided with a measuring head 20 while driving the table 10 to rotate. The thickness of the copper film can be measured, for example, by using the method of measuring the sheet resistance with a four-probe type sheet resistance meter and converting it to thickness using a known sheet resistance or by using the method of measuring thickness equivalent data by an eddy current type detector or an electrostatic capacitance type detector.

The calculating unit 22 calculates the target amount of the copper film to be removed from the obtained thickness equivalent data of the copper film and outputs it to the controller 23.

The controller 23 sets the target amount of the copper film to be removed from this input and in accordance with this controls the voltage output from the power supply 25 and the moving mechanism 27 of the cathode member 27. In addition, the controller 23 can receive outside input from the control panel 24.

A predetermined voltage such as a direct current voltage or a pulse voltage is supplied by the power supply 25 while using the surface of the wafer, that is, the interconnection layer 105, as an anode and the cathode member E as a cathode. If such a voltage is supplied, as described in the first embodiment, that region of the surface is electrolytically polished.

Here, the surface is electrolytically polished by electrolytic elution while the measuring means 21 is measuring the thickness or thickness equivalent data. When it is judged that the target amount of the copper film has been removed from the result of measurement of the thickness or thickness equivalent data, the cathode member E is moved by the moving mechanism 27 continuously or stepwise. At this time, the measuring head 20 is also moved along with the cathode member E.

The entire surface of the surface can be uniformly electrolytically polished by electrolytic elution by carrying out the above steps over the entire surface.

The configuration and operation of the rest of the apparatus can be made the same as in the first and second embodiments. The same effects can be achieved as the first and second embodiments.

Further, the present embodiment is also applicable to the polishing apparatuses in the third to fifth embodiments.

Eighth Embodiment

Figure 15:
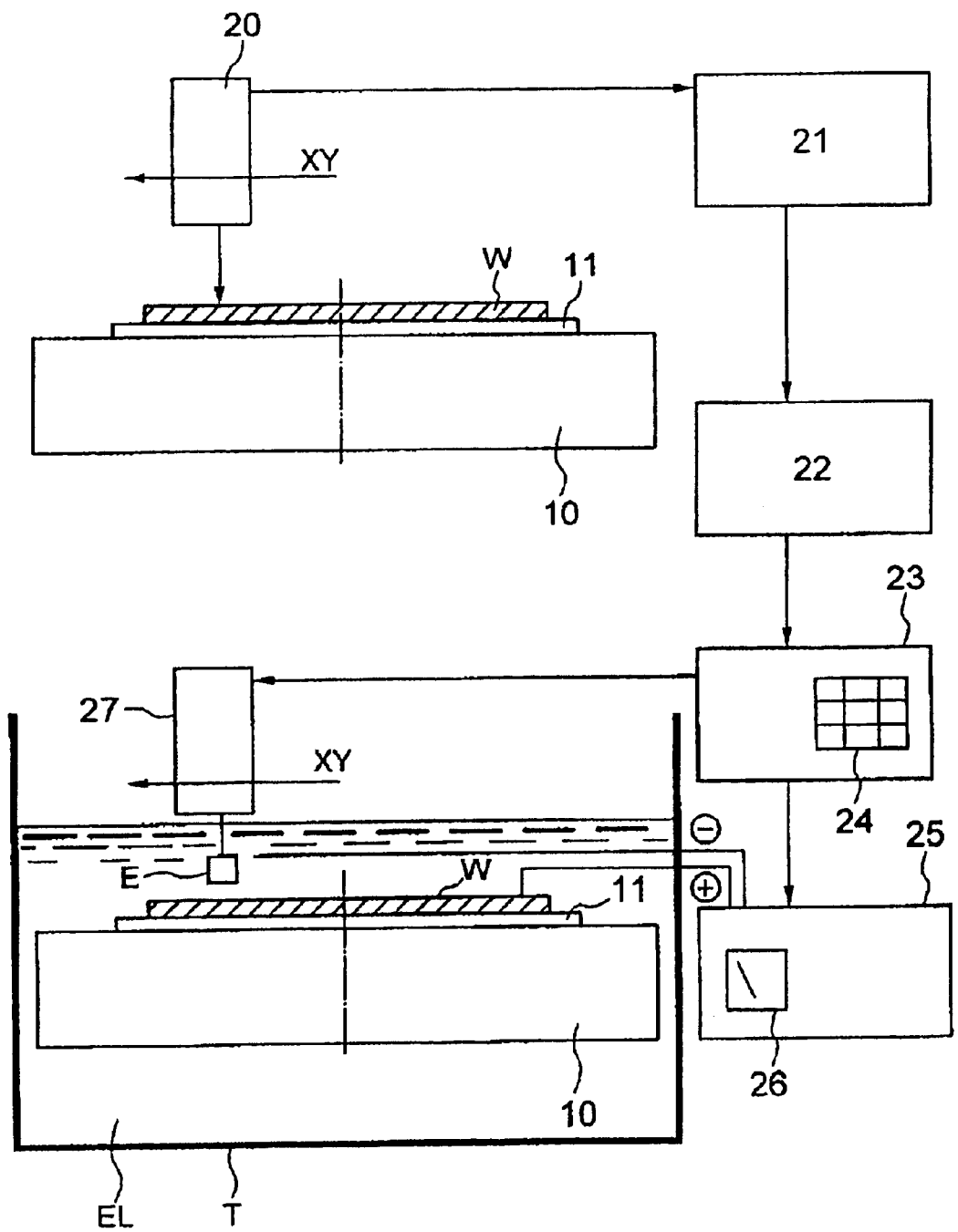
FIG. 15 is a schematic view of a polishing apparatus according to an eighth embodiment.

FIG. 15 is a schematic view of a polishing apparatus according to the present embodiment. This is substantially the same as the polishing apparatus according to the second embodiment, but the cathode member E is small to the extent of the magnitude of the unevenness of the surface. In addition, the measuring head 20 and the moving mechanism 27 are able to move two dimensionally within the plane of the surface to be polished. Here, no rotation driving mechanism of the table 10 is necessary.

In the above polishing apparatus, in the same way as the second embodiment, the thickness of the copper film or data corresponding to the thickness is measured two-dimensionally in advance by a measuring means provided with a measuring head, the profile of the target amount of the copper film to be removed is calculated from the obtained thickness equivalent data, and the movement of the cathode member is controlled two-dimensionally within the plane of the surface based on this for control of the electrolytic elution. Since the cathode member E is small to the extent of the magnitude of the unevenness of the surface, movement of the miniature cathode member and application of voltage following the unevenness of the surface become possible.

Figure 16A:
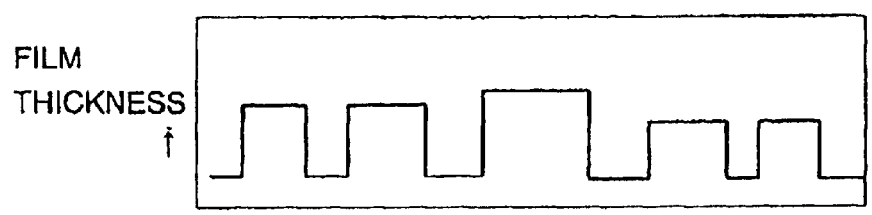
FIGS. 16A to 16C show the thickness profile of the copper film, removal profile, and the speed of movement profile of an electrode, respectively, according to the eighth embodiment.
Figure 16B:
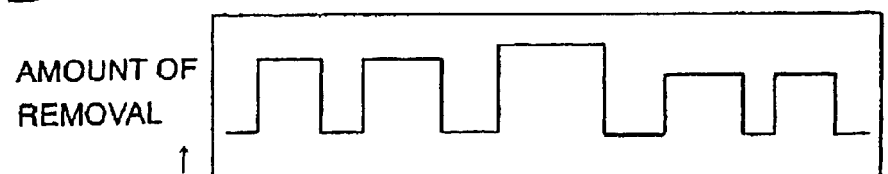
Figure 16C:
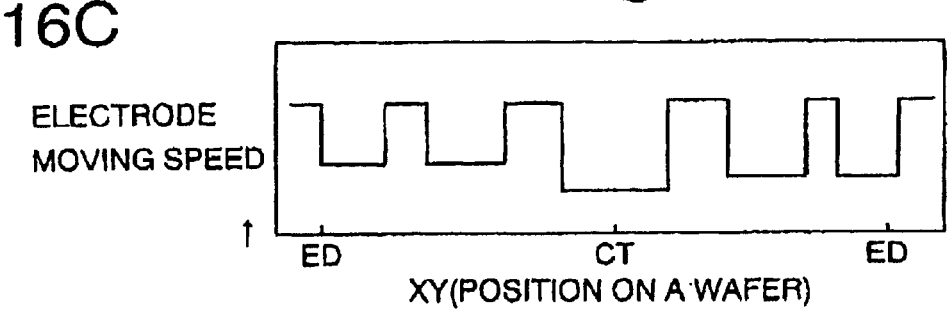

For example, when the result of measurement of the thickness of the copper film is as shown by the graph in FIG. 16A (in this figure, the profile for one direction in the plane is shown one-dimensionally), that is, fine projecting and recessed regions are formed from the edge portion ED of the wafer to the center portion CT, the target amount of the copper film to be removed is set as shown in FIG. 16B, the same as the profile in FIG. 16A. The speed of movement of the cathode member E is controlled, as shown in FIG. 16C, for fast movement at portions of a small amount of removal and slow movement at portions of a large amount of removal.

The configuration and operation of the rest of the apparatus can be made the same as in the first and second embodiments. The same effects can be achieved as the first and second embodiments.

Further, the present embodiment is also applicable to the polishing apparatuses in the third to fifth embodiments.

Ninth Embodiment

In the above first to eighth embodiments, the surface is polished by electrolytic elution alone. In the present embodiment, polishing by chemical mechanical polishing (CMD) is further combined, whereby it is possible to polishing by composite polishing combining electrolytic polishing and chemical mechanical polishing.

Figure 17:
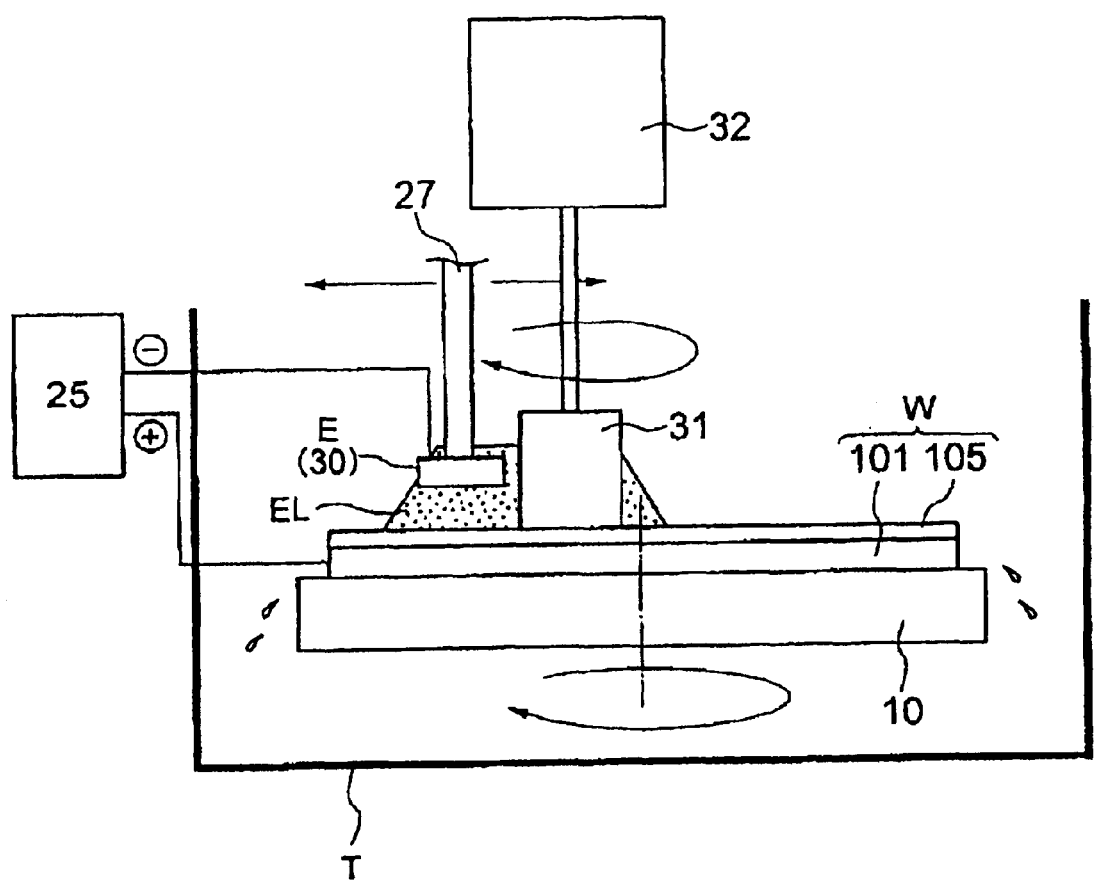
FIG. 17 is a schematic view of a polishing apparatus according to a ninth embodiment.

The polishing apparatus according to the present embodiment is essentially the same as that shown in FIG. 5, except that the inner portion of the electrolytic bath tank T at the lower part of FIG. 5 is replaced by the polishing apparatus shown in FIG. 17.

Namely, a wafer W comprised of a substrate 101 formed with the interconnection layer 105 as the surface to be polished is secured by a securing means such as a vacuum chuck, an edge clamp, or a mechanical clamp and is driven to rotate. In one region of the wafer W, a cathode member E that also serves as a nozzle 30 for feeding an electrolytic solution and movable by the moving mechanism 27 is arranged to be parallel with the surface.

An electrolytic solution EL fed from the electrolytic feeding nozzle for electrolytic elution of copper is interposed between the interconnection layer 105 and the cathode member E.

When a predetermined voltage such as a direct current voltage or a pulse voltage is supplied by the power supply 25 with the surface of the wafer, that is, the interconnection layer 105, used as an anode and the cathode member E as a cathode, as described in the first embodiment, one region of the surface is electrolytically polished.

In the region where an electrolytic solution is fed by the above electrolytic solution feeding nozzle 30, a polishing head 32 including a scrubber 31 is provided. The polishing head 32 is able to drive the scrubber 31 to rotate while applying pressure on the same. Further, the scrubber 31 is movable due to the movement of the polishing head 32, but moves linked with the movement of the cathode member E. Furthermore, the polishing head 32 is able to apply pressure to the scrubber 31 due to the movement of the polishing head 32.

Here, the scrubber, for example, is made of polyvinyl acetal foam, polyurethane foam, etc. A scrubber made of a material used in a usual CMP process can be adopted.

Here, as the electrolytic solution for copper, for example, it is possible to use the electrolytic solutions explained in the first or second embodiments further containing polishing slurries containing polishing abrasives such as aluminum oxide, silicon oxide, cerium oxide, or zirconium oxide. By inclusion of these polishing abrasives, chemical mechanical polishing can be carried out effectively.

The polishing apparatus according to the present embodiment, for example, supplies a voltage between the cathode member E (the electrolytic solution feeding nozzle 30) and the interconnection layer 105 from a power supply 25 controlled by a not shown controller for polishing by electrolytic elution and can polish by chemical mechanical polishing using an electrolytic solution containing a polishing abrasive as a polishing slurry to improve or assist the polishing efficiency.

Since the cathode member E and the scrubber 31 are linked by the moving mechanism 27 and are moved continuously or stepwise over the entire surface of the wafer, the entire surface can be polished uniformly by the composite polishing of electrolytic polishing by electrolytic elution and chemical mechanical polishing.

When polishing a wafer using for the interlayer insulation film an organic material of a low dielectric constant or a porous material of a low dielectric constant, which have low mechanical strengths and are easily broken by conventional chemical mechanical polishing, chemical mechanical polishing that applies a high pressure is not desirable. In the present embodiment, however, since electrolytic polishing and chemical polishing are combined, the polishing pressure can be reduced compared with polishing using chemical mechanical polishing alone. Therefore, similar with the previous embodiments, scratches of the copper film and damage to the lower interlayer insulation film can be suppressed.

In present embodiment as well, in the same way as the second embodiment, sometimes the surface of the copper film is oxidized by the anodic oxidation and is passivated. In this case, the passivated portion can be selectively removed by chemical mechanical polishing by lengthening the time for partial scrubbing by chemical mechanical polishing or by applying a high voltage on the passivation film portion. Although the newly exposed copper surface is passivated intensively, the surface can be polished successfully by repeated mechanical scrubbing to remove the passivation film.

At this time, the value of the electrolytic current increases together with the removal of the passivation film and decreases with the formation of the passivation film.

The configuration and operation of the rest of the apparatus such as the measuring means provided with a measuring head for measuring the thickness of the copper film or data corresponding to the thickness and the calculating unit for calculating the target amount of removal of the copper film from the obtained thickness equivalent data of the copper film can be made the same way as in the first to eighth embodiments. The same effects can be achieved as the first to eighth embodiments.

10th Embodiment

The polishing apparatus according to the present embodiment, in the same way as the ninth embodiment, is an apparatus for composite polishing combining electrolytic polishing and chemical mechanical polishing.

Figure 18A:
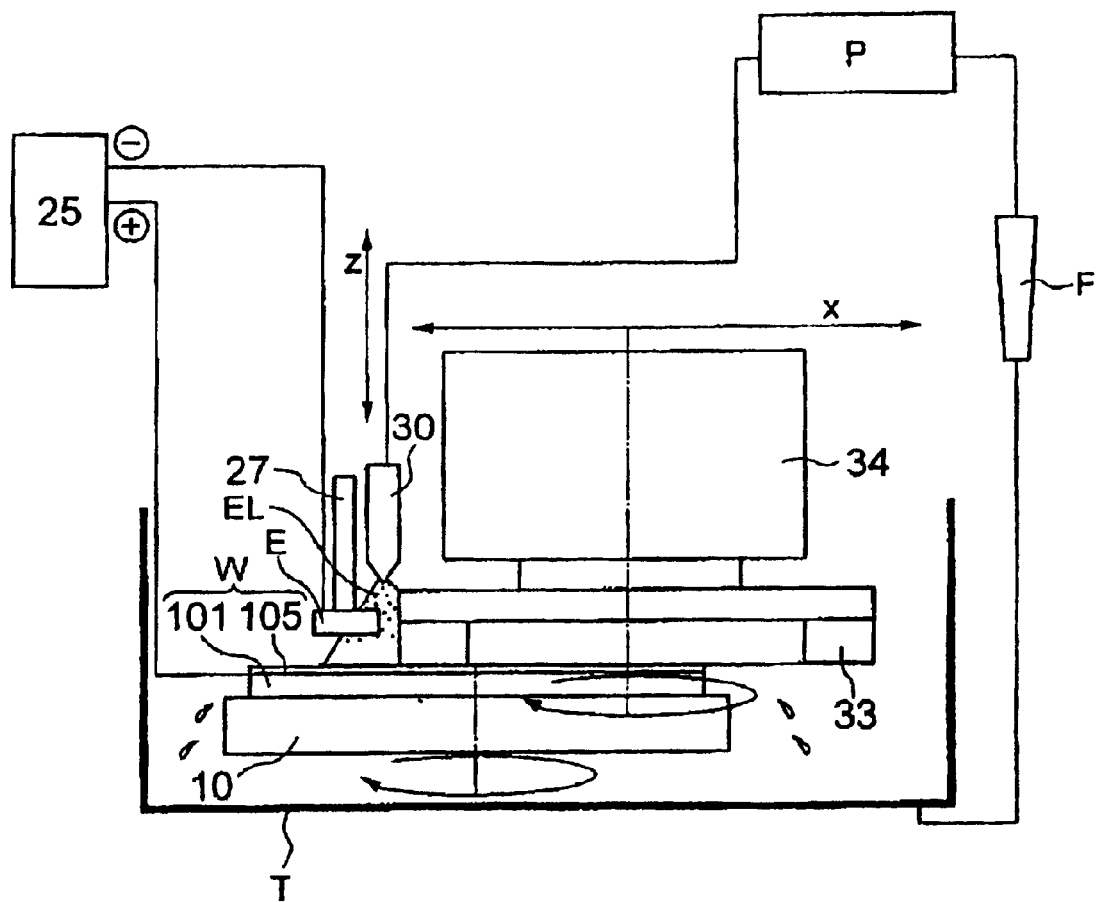

The polishing apparatus according to the present embodiment is essentially the same as that shown in FIG. 5 except that the inner portion of the electrolytic bath tank T at the lower part of FIG. 5 is replaced by the polishing apparatus shown in FIG. 18.

Namely, a wafer W comprised of a substrate 101 formed with an interconnection layer 105 as the surface to be polished is secured by a securing means such as a vacuum chuck, an edge clamp, or a mechanical clamp and is driven to rotate. In case of an edge clamp, a current can be carried to the wafer that serves as the anode through the clamp portion that grounds the edge portion of the wafer.

In one region of the wafer W, a cathode member E movable by the moving mechanism 27 is arranged to be parallel with the surface. Further, an electrolytic solution feeding nozzle 30 is arranged in this region and is moved linked with the cathode member E. An electrolytic solution EL fed from the electrolytic solution feeding nozzle 30 for electrolytic elution of copper is interposed between the interconnection layer 105 and the cathode member E.

Note that, in addition to the one nozzle as shown in the figure, it is possible to provide a plurality of nozzles in symmetry at the opposite side of the wafer or provide a plurality randomly.

If a predetermined voltage such as a direct current voltage or a pulse voltage is applied by the power supply 25 with the surface of the wafer, that is, the interconnection layer 105, used as an anode and the cathode member E as a cathode, as described in the first embodiment, that region of the surface is electrolytically polished.

If the distance between the cathode member E and the wafer W is too short, the flow action of the electrolytic solution interposed between the cathode member and the wafer does not function sufficiently, so it is desired to set this distance larger than a certain value.

In the region where an electrolytic solution is fed by the above electrolytic solution feeding nozzle 30, a shaft 34 provided with a polishing ring wheel 33 is provided.

Figure 18B:
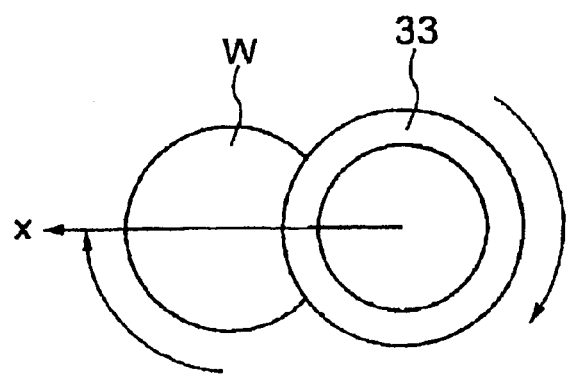
FIG. 18B is a plan view for explaining the operation of a wafer and a polishing ring wheel of this polishing apparatus.

The shaft 34, as shown in FIG. 18B, is able to drive the polishing ring wheel 33 to rotate in the same direction as the rotation direction of the wafer W.

The polishing ring wheel 33 is also movable due to the movement of the shaft 34 in the X-direction in the figure, but this is linked with the movement of the cathode member E. Furthermore, pressure can be applied to the polishing ring wheel 33 by movement of the shaft 34 in the Z-direction in the figure to give a mechanical scrubbing pressure.

The polishing ring wheel 33, for example, is made of polyvinyl acetal foam, polyurethane foam, etc. Polishing ring wheels used in the usual CMP process can be adopted. The size of the polishing ring wheel 33, for example, is 200 mm in outer diameter, 160 mm in inner diameter, and 20 mm in thickness.

Here, as the electrolytic solution for copper, for example, use may be made of the electrolytic solutions explained in the first or second embodiment further containing a polishing slurry containing a polishing abrasive such as aluminum oxide, silicon oxide, cerium oxide, zirconium oxide, etc. Due to inclusion of these polishing abrasives, chemical mechanical polishing can be carried out effectively.

The polishing apparatus according to the present embodiment, for example, supplies a voltage between the cathode member E and the interconnection layer 105 from a power supply 25 controlled by a not shown controller for polishing by electrolytic elution and can also polish by chemical mechanical polishing using an electrolytic solution containing a polishing abrasive as a polishing slurry to improve or assist the polishing efficiency.

Since the cathode member E, the electrolytic solution feeding nozzle 30, and the polishing ring wheel 33 are linked by the moving mechanism 27 etc. and are moved continuously or stepwise over the entire surface of the wafer, the entire surface can be polished uniformly by the composite polishing of electrolytic polishing by electrolytic elution and chemical mechanical polishing.

In the polishing apparatus according to the present embodiment, the electrolytic solution residing at the bottom of the electrolytic bath tank T can be pumped up by a jet pump P via a filter F and fed again by the electrolytic solution feeding nozzle 30. At this time, it is possible to remove unnecessary components in the electrolytic solution and add insufficient components.

Further, the same power supply 25 as described in the second embodiment can be used.

In addition, in the same way as the second embodiment, it is possible to detect the electrolytic current by an ammeter and control the operation of the polishing apparatus such as stopping application of voltage or moving the cathode member based on the current value from the above ammeter.

Note that, although not illustrated in the figure, the above polishing apparatus is installed in a clean room. A loading/unloading port for loading and unloading a wafer cassette storing wafers to be polished in or out of the clean room is provided in the clean room. Further, a wafer conveyance robot for transferring the wafer between the wafer cassette loaded in the clean room through this loading/unloading port and the polishing apparatus is arranged between the loading/unloading port and the polishing apparatus.

The configuration and operation of the rest of the apparatus such as the measuring means provided with a measuring head for measuring the thickness of the copper film or data corresponding to the thickness and the calculating unit for calculating the target amount of removal of the copper film from the obtained thickness equivalent data of the copper film can be made the same way as in the first to eighth embodiments. The same effects can be achieved as the first to eighth embodiments.

11th Embodiment

Figure 19A:
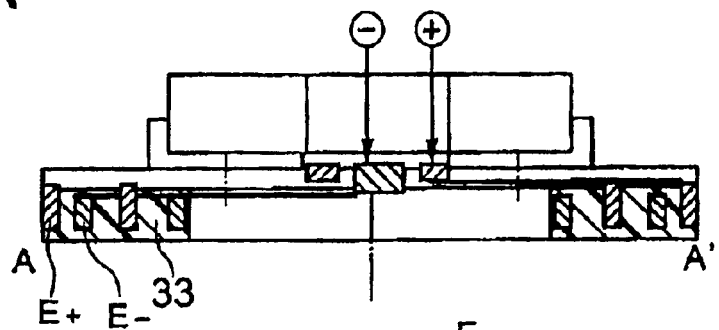
FIGS. 19A to 19C are views of a polishing ring wheel of a polishing apparatus according to an 11th embodiment, where
Figure 19B:
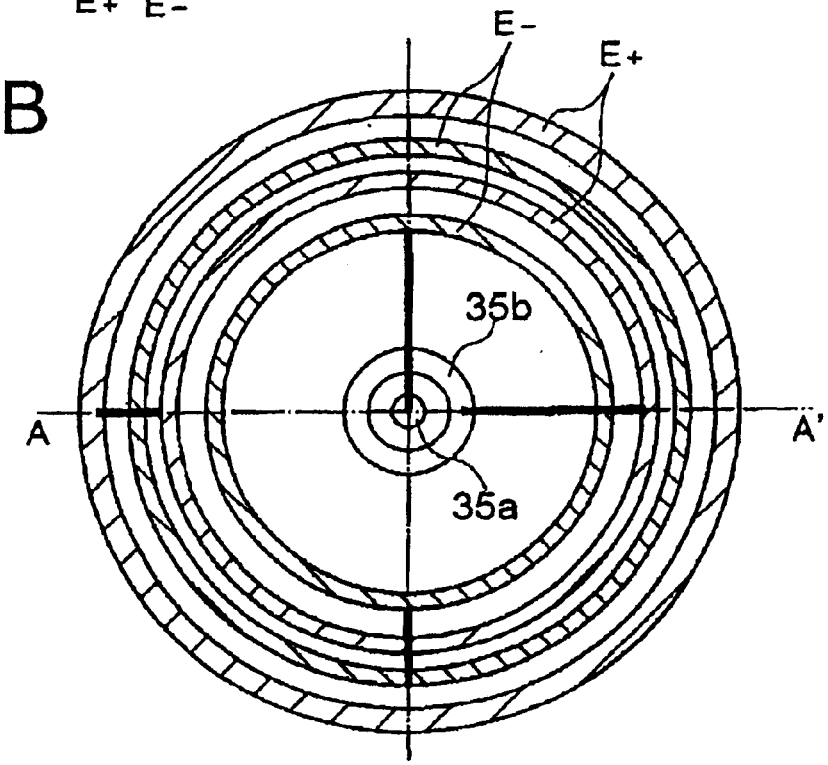

The polishing apparatus according to the present embodiment is substantially the same as that of the 10th embodiment, however, in the same way as the fifth embodiment, as shown in the schematic sectional view in FIG. 19A and the plan view in FIG. 19B (FIG. 19A corresponds to the section along the A–A' line in FIG. 19B), ring-shaped anode members $E_+$ set apart from cathode members E by specified distances are arranged to face the surface to be polished. For example, the cathode members E and the anode members $E_+$ are formed from ring-shaped electrodes having large and small diameters. These rings are concentric and arranged alternately.

The cathode members E and the anode members $E_+$ are both embedded in a polishing ring wheel 33.

To polish with the above polishing apparatus, an electrolytic solution is fed by a not shown electrolytic solution feeding nozzle and interposed between the surface to be polished, that is, the interconnection layer 105, and the cathode members $E_-$ and between the interconnection layer 105 and the anode members $E_+$, and a certain positive voltage or negative voltage is supplied by a not shown power supply to the cathode members $E_-$ and the anode members $E_+$ through a terminal 35a and the ring-shaped terminal 35b at the center of the polishing ring wheel 33.

Figure 19C:
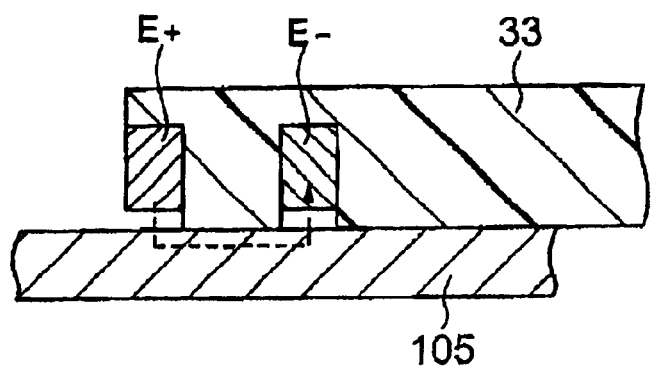

At this time, as shown in FIG. 19C, if the distances between the cathode members E and the anode members $E_+$ are set sufficiently long and the distances between the interconnection layer 105 and the cathode members $E_-$ and between the interconnection layer 105 and the anode members $E_+$ are set sufficiently short compared with this, a current flows from the anode members $E_+$ to the cathode members $E_-$ through the interconnection layer 105 and therefore the same effects can be obtained as if supplying a voltage with the cathode members $E_-$ as a cathode and the regions of the surface, that is, the interconnection layer 105, facing the cathode members $E_-$ as an anode.

As a result, it is possible to electrolytically polish by electrolytic elution from the surface of the portions of the interconnection layer 105 facing the cathode members $E_-$.

Further, it is possible to polish by chemical mechanical polishing by scrubbing by the polishing ring wheel 33. This improves or assists the polishing efficiency.

By linking the electrolytic solution feeding nozzle and the polishing ring wheel 33 and making them move continuously or stepwise over the entire surface of the wafer at the same time as the above operation, the entire surface can be polished uniformly by the composite polishing of electrolytic polishing by electrolytic elution and chemical mechanical polishing.

Figure 20A:
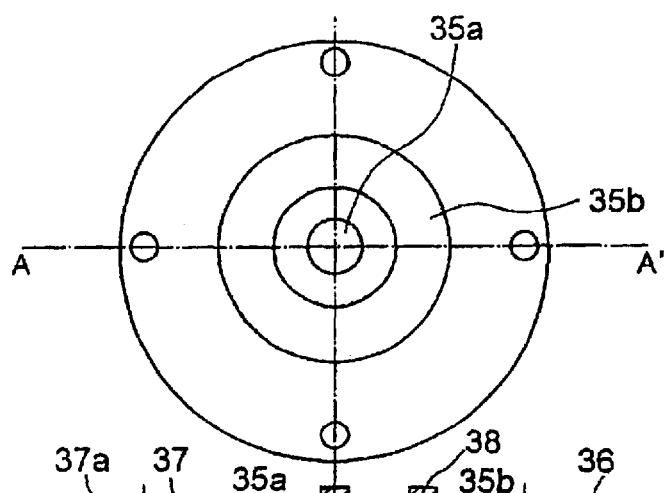
FIGS. 20A and 20B are views of an example of wiring for applying a voltage to a cathode member and an anode member of the polishing ring wheel of a polishing apparatus according to the 11th embodiment, where
Figure 20B:
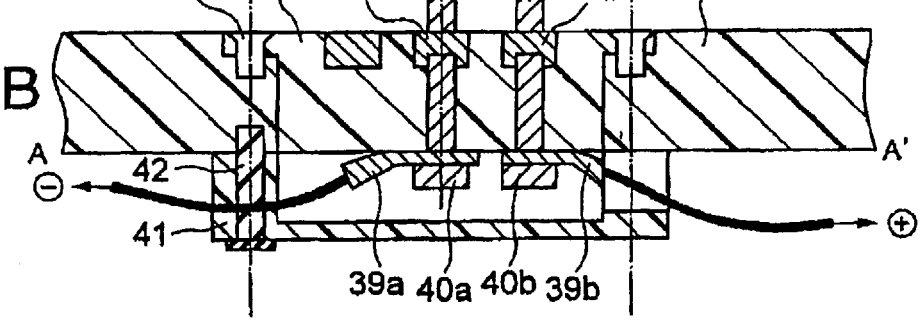

An example of the wiring configuration for supplying a voltage to the cathode members $E_-$ and the anode members $E_+$ embedded in the rotating polishing ring wheel 33 is shown in the plan view of FIG. 20A and the sectional view along A—A of that figure of FIG. 20B.

That is, a terminal holder 37 made of polyvinyl chloride etc. is fit into an opening provided at the center of a wheel holder 36 for holding the polishing ring wheel 33 embedded with the cathode members $E_-$ and the anode members $E_+$ in a not shown region and is secured by plastic or other screws 37a.

The above terminal 35a and ring-shaped terminal 35b are embedded in the terminal holder 37. A voltage is supplied via a projecting contact probe 38 from a power supply by a slip ring.

At the back side of the terminal holder 37, terminals 39a and 39b are connected to the terminal 35a and the ring-shaped terminal 35b via the conductive screws 40a and 40b penetrating through the terminal holder 37. The terminals 39a and 39b are connected to the cathode members $E_-$ and the anode members $E_+$ at a not shown region.

The region of the terminals 39a and 39b is protected by a plastic cover 41. The plastic cover 41 is secured to the wheel holder 36 by plastic screws 42.

An example of the layout of the polishing ring wheel embedded with the cathode members $E_-$ and the anode members $E_+$ described above is shown below.

Figure 21A:
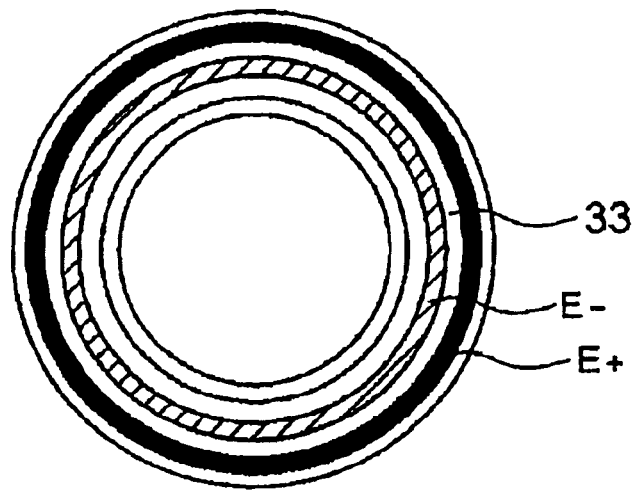
FIGS. 21A to 21C are views of an example of the layout of a cathode member and an anode member of the polishing ring wheel according to the 11th embodiment.

FIG. 21A shows a configuration in which one large diameter anode member $E_+$ is arranged around a small diameter cathode member $E_-$.

Figure 21B:
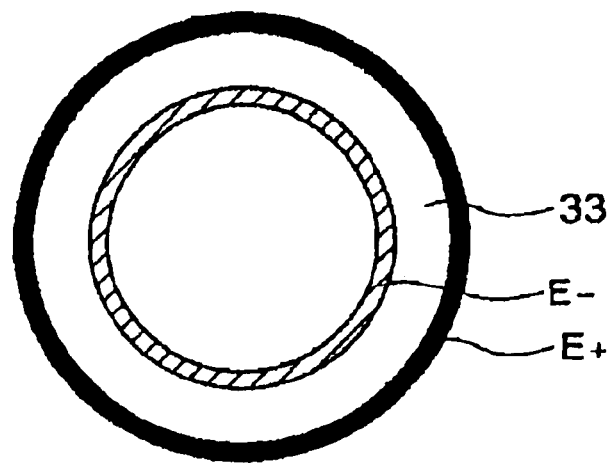

FIG. 21B, similar to FIG. 21a, shows a configuration in which one large diameter anode member $E_+$ is arranged around the polishing ring wheel 33 and a small diameter cathode member $E_-$ is arranged inside the polishing ring wheel 33.

Figure 21C:
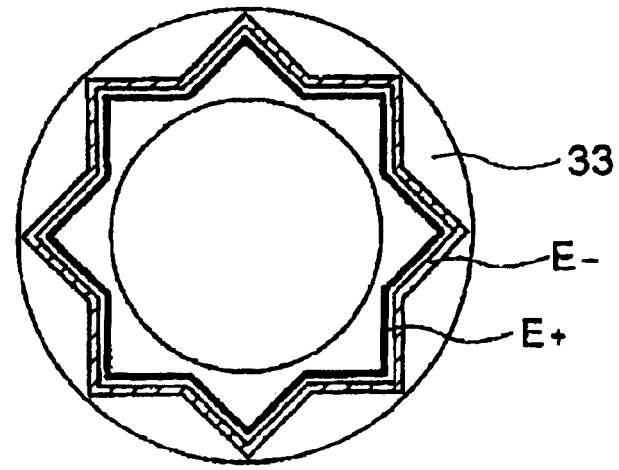

FIG. 21C shows a configuration in which the cathode member $E_-$ and the anode member $E_+$ are arranged in star shapes.

Figure 22A:
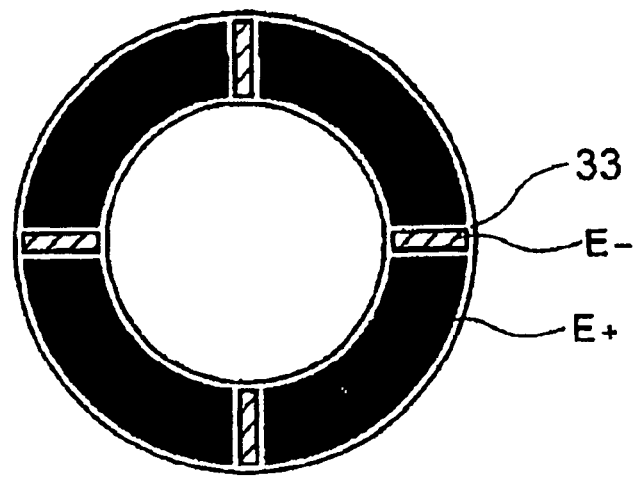
FIGS. 22A to 22C are views of another example of the layout of a cathode member and an anode member of the polishing ring wheel according to the 11th embodiment.

FIG. 22A shows a configuration in which cathode members $E_-$ are arranged on two lines perpendicularly intersecting at the center of the polishing ring wheel 33 and anode members $E_+$ are arranged at the remaining regions.

Figure 22B:
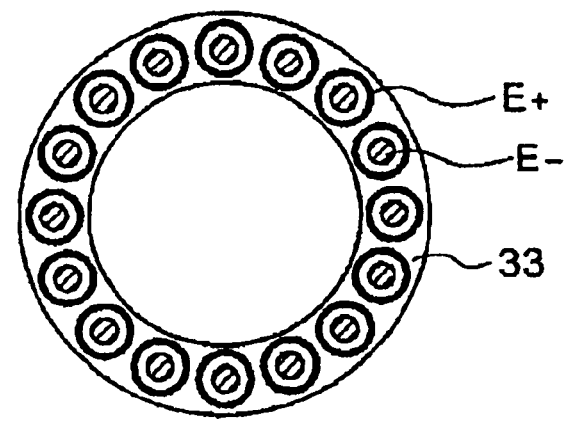

FIG. 22B shows a configuration in which patterns of circular cathode members $E_-$ surrounded by anode members $E_+$ are arranged on the region of the polishing ring wheel 33.

Figure 22C:
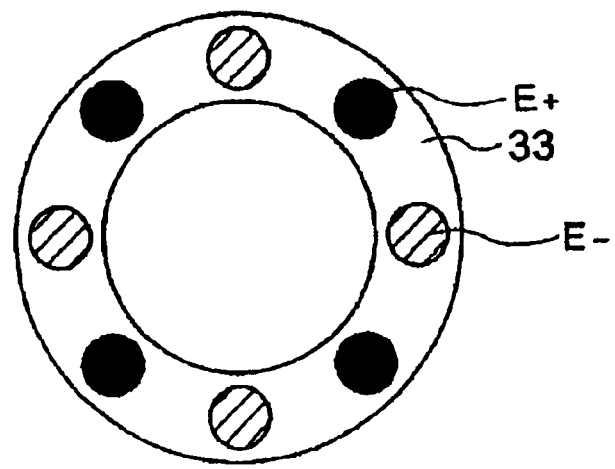

FIG. 22C shows a configuration in which circular cathode members $E_-$ and anode members $E_+$ are arranged alternately on the region of the polishing ring wheel 33.

Figure 23A:
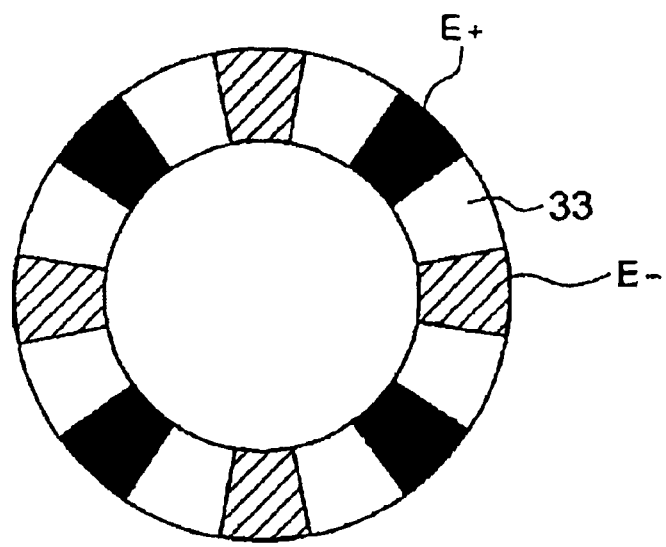
FIGS. 23A and 23B are views of still another example of the layout of a cathode member and an anode member of the polishing ring wheel according to the 11th embodiment.

FIG. 23A shows a configuration in which the region of the polishing ring wheel 33 is divided into sections diametrically and cathode members $E_-$ and anode members $E_+$ are arranged alternately in the sections.

Figure 23B:
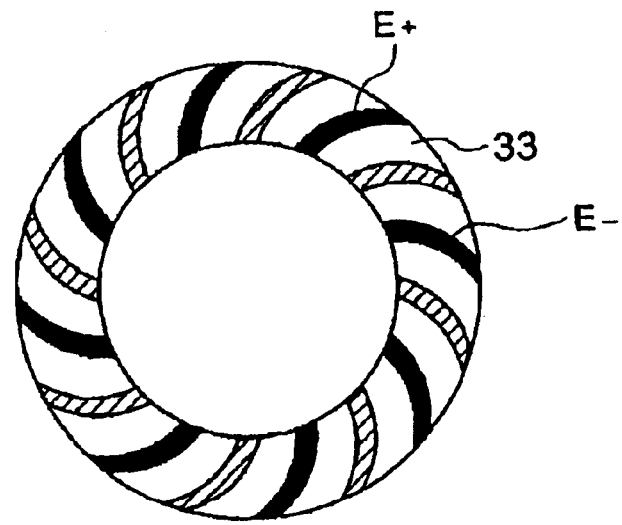

FIG. 23B shows a configuration in which the cathode members $E_-$ and the anode members $E_+$ are arranged alternately in spiral shapes on the region of the polishing ring wheel 33.

In the present embodiment, the rest of the configuration such as the material of the anode members is similar to that in the fifth embodiment. Further, for example, the configuration and operation of the measuring means provided with a measuring head for measuring the thickness of the copper film or data corresponding to the thickness and the calculating unit for calculating the target amount of removal of the copper film from the obtained thickness equivalent data of the copper film can be made the same way as in the first and second embodiments. The same effects can be achieved as the first and second embodiments.

12th Embodiment

Next, an explanation will be made of a process of formation of copper interconnections by the dual damascene process in a semiconductor device having copper interconnections using the polishing method and apparatus of the present invention.

First, in the same way as the steps up to FIG. 2B, an interlayer insulation film 102 is formed on a semiconductor substrate 101, contact holes and interconnection grooves M are formed, then the barrier metal film 103 and the interlayer connection layer 105 are formed.

The surface of the interconnection layer 105 is formed with unevenness having a height of for example about 800 nm caused burying the contact holes CH and the interconnection grooves M.

The above process is carried out in a manner similar to the related art, but in the polishing method of the present invention, the excess parts of the interconnection layer 105 present on the interlayer insulation film 102 are removed by not chemical mechanical polishing, but by anodic oxidation using a cathode member of a small size compared with a surface to be polished and by chelation of the oxidized copper using a chelating agent.

Figure 24A:
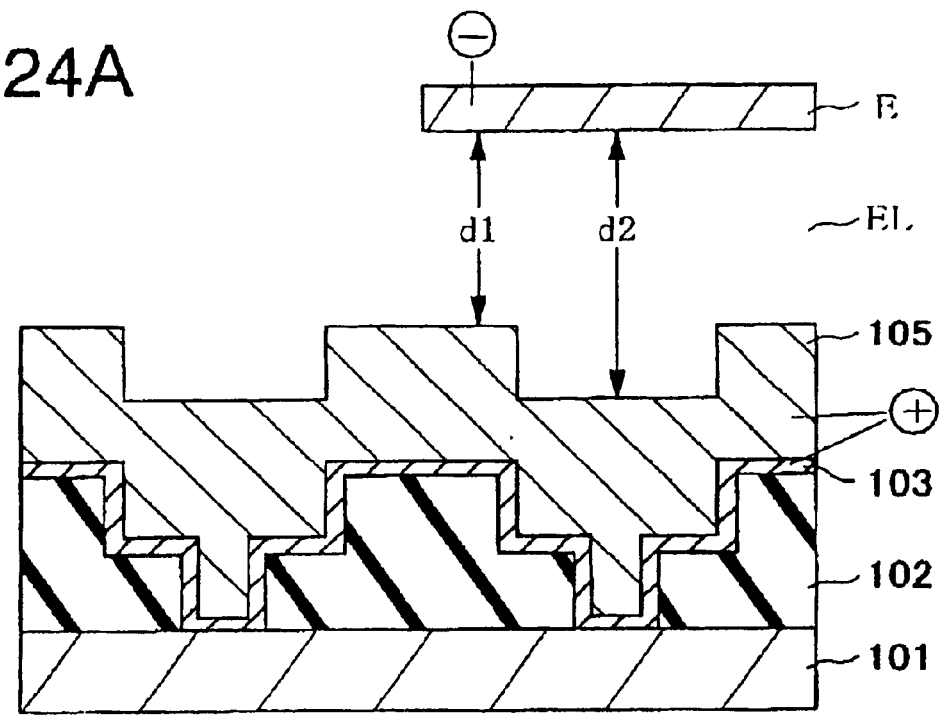
FIGS. 24A and 24B are sectional views of steps of the method of producing a semiconductor device according to a 12th embodiment of the present invention and specifically show the steps of anodic oxidation and chelation in one region of a copper film.

That is, as shown in FIG. 24A, a cathode member E of a relatively small size compared with the surface to be polished, that is, the interconnection layer 105, is arranged to face one region of the interconnection layer 105, and an electrolytic solution EL including a chelating agent is interposed at least between that region of the interconnection layer 105 and the cathode member E.

Here, as the chelating agent, use may be made of for example quinaldinic acid of chemical formula (1), glycine of chemical formula (2), citric acid of chemical formula (3), oxalic acid of chemical formula (4), propionic acid of chemical formula (5), anthranilic acid of chemical formula (6), phenylalanine of chemical formula (7), or so on.

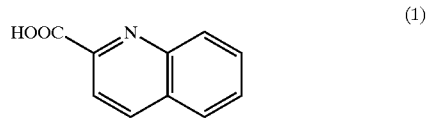

(1)

(2)

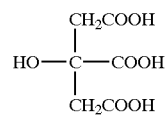

(3)

(4)

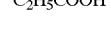

(5)

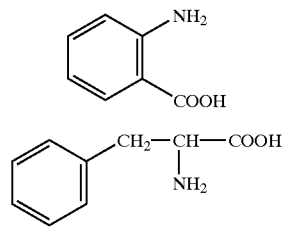

(6)

(7)

Next, a voltage is supplied using the cathode member E as a cathode and the interconnection layer 105 and the barrier metal film 103 as an anode.

At this time, in the region facing the cathode member E, the anode, that is, the copper film 105, is oxidized by anodic oxidation and forms CuO. Here, the distance d1 between a projecting portion on the surface of the interconnection layer 105 and the cathode member E is shorter than the distance d2 between a recessed portion on the surface of the interconnection layer 105 and the cathode member E, so when the potential difference between the cathode member E and the interconnection layer 105 is constant, the current density at the projecting portion is greater than that at the recessed portion and therefore the anodic oxidation is accelerated.

Figure 24B:
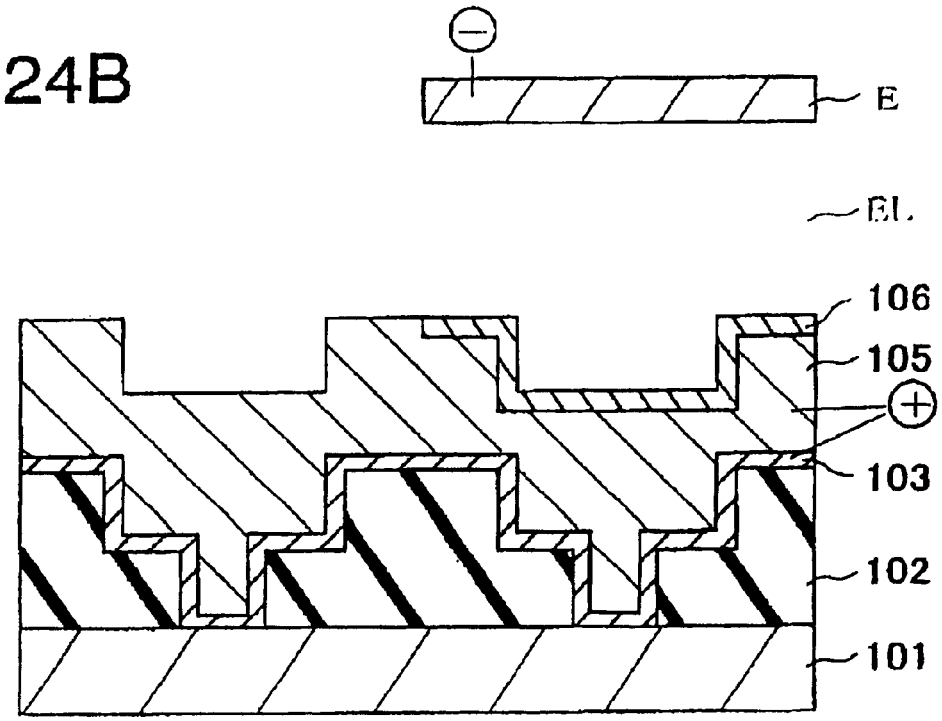

As shown in FIG. 24B, the surface of the oxidized copper film (CuO) 105 is chelated by the chelating agent in the electrolytic solution.

When quinaldic acid is used as the chelating agent, a film made from a chelated compound of the chemical formula (8) is formed. When glycine is used, a film made from a chelate compound of the chemical formula (9) is formed.

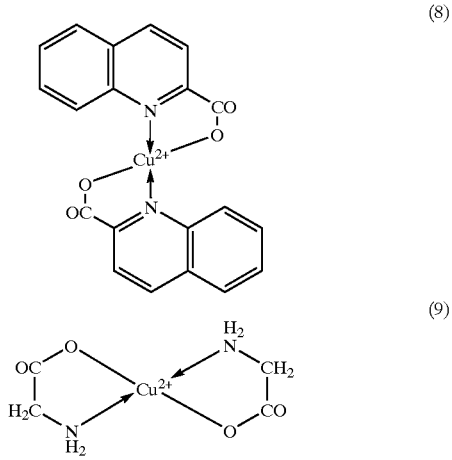

(8)

(9)

These chelate films 106 have an electrical resistance higher than copper and a very low mechanical strength, hence are fragile films.

If a chelate film 106 is formed on the surface of the interconnection layer 105 in this way, the value of the current from the copper film 105 to the cathode member E via the electrolytic solution EL decreases in that region.

Figure 25A:
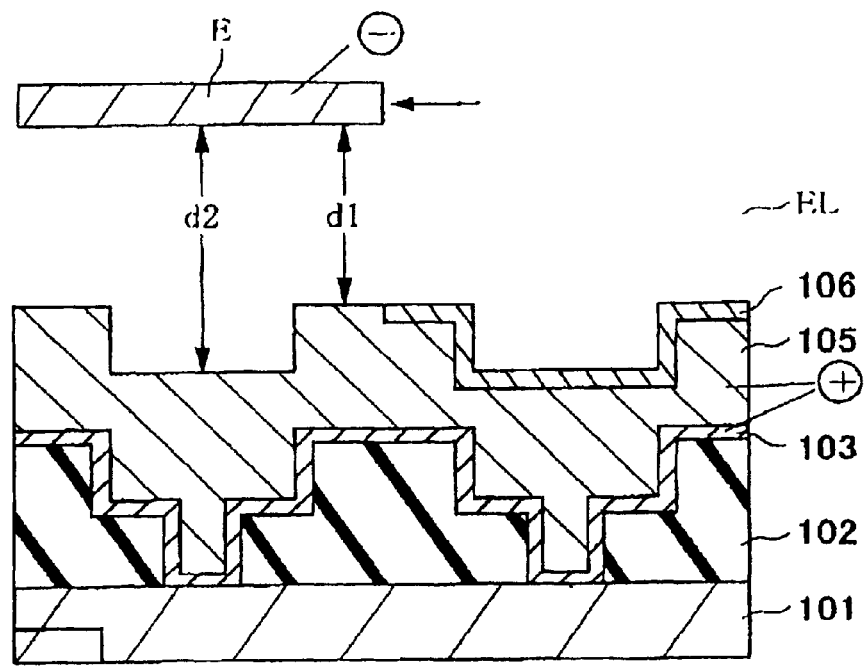
FIGS. 25A and 25B are views of steps continuing from FIGS. 24A and 24B and specifically show the steps of anodic oxidation and chelation in another region of the copper film.

Next, as shown in FIG. 25A, the cathode member E is moved from the region where the chelation of the surface of the interconnection layer 105 is finished to another region.

In this other region, since the surface of the interconnection layer 105 has not been chelated, the cathode member E faces the interconnection layer 105 having unevenness with a distance d1 to a projecting portion and a distance d2 to a recessed portion.

Figure 25B:
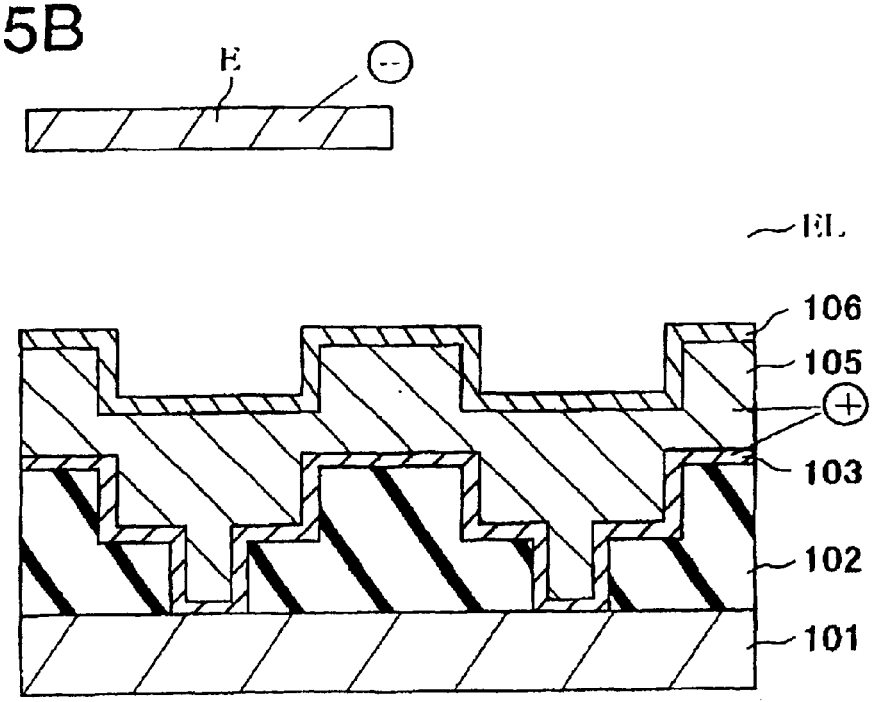

Next, similar to the anodic oxidation and chelation in the former region of the interconnection layer 105 as shown in FIG. 24B, the interconnection layer 105 is oxidized by anodic oxidation and chelated in that other region as shown in FIG. 25B.

In this step as well, similar to the above, the interconnection layer 105 is oxidized by anodic oxidation preferentially from the projecting portions. Anodic oxidation and chelation are carried out in other regions of the above interconnection layer 105 similar to the above until all other regions of the interconnection layer 105 are oxidized by anodic oxidation and chelated.

Figure 26A:
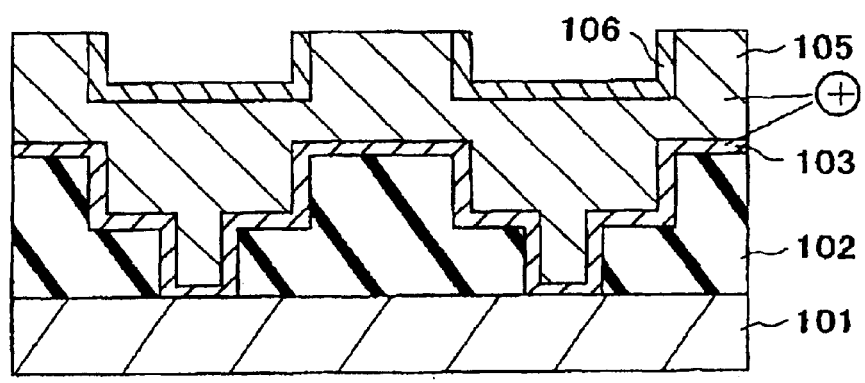

Next, as shown in FIG. 26A, the projecting portions of the chelate film 106 formed on the surface of the interconnection layer 105 are selectively removed by wiping, mechanical polishing, etc.

Note that when removing the projecting portions of the chelate film 106 by mechanical polishing, the electrolytic solution EL may also include a polishing slurry such as described in the 10th embodiment.

Further, because the mechanical strength of the chelate film 106 is very low, it can be easily removed even by applying vibration to the substrate 101 or by jetting the electrolytic solution.

Because the projecting portions of the interconnection layer 105 of the low electrical resistance are exposed in the electrolytic solution at that time, the value of the current flowing from the interconnection layer 105 to the cathode member E via the electrolytic solution EL rises.

Figure 26B:
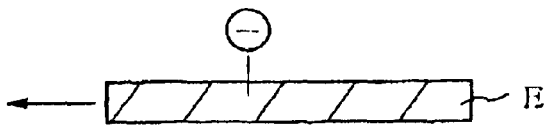
Figure 26B:
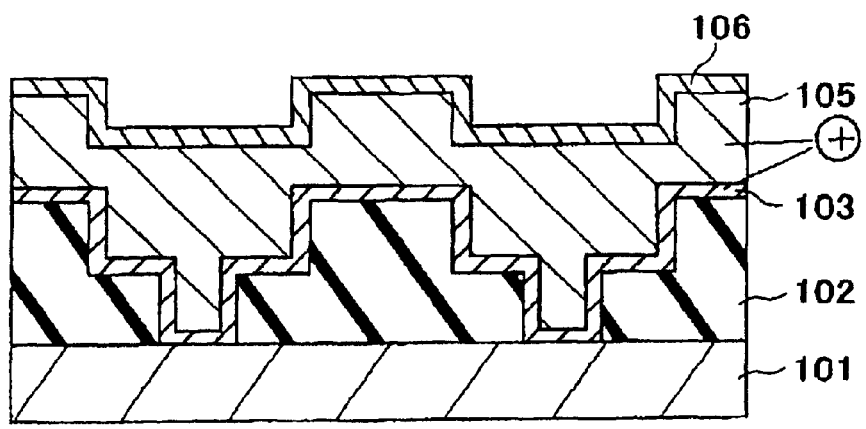

Next, as shown in FIG. 26B, if the cathode member E is made to face one region of the surface and a voltage is supplied, since the projecting portions of the interconnection layer 105 exposed in the electrolytic solution have a low electrical resistance and a short distance to the cathode member E, they are intensively oxidized by anodic oxidation, and the oxidized copper is chelated.

In this way, the cathode member E is moved and the anodic oxidation and chelation are performed in the same way in other regions to anodically oxidize and chelate the entire surface of the interconnection layer 105 again.

Next, the projecting portions of the chelate film 106 are selectively removed by the previously mentioned wiping, mechanical polishing, etc., the exposed copper film 105 is intensively oxidized and chelated, and the projecting portions of the chelate film 106 are selectively removed. These steps are then repeated.

The current flowing from the interconnection layer 105 to the cathode member E via the electrolytic solution EL repeatedly rises and falls together with removal and formation of the chelate film 106, respectively.

Figure 27A:
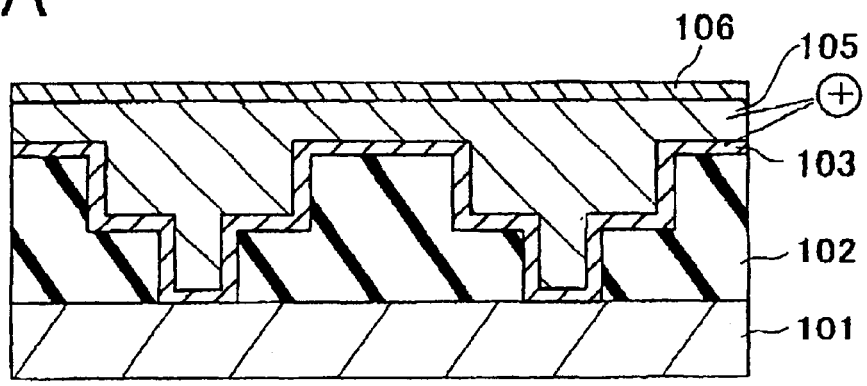
FIGS. 27A to 27C are views of steps continued from FIG. 26A and 26B, where

By repeating the step of anodic oxidation and chelation over the entire surface while moving the cathode member E and the step of selective removal of projecting portions of the chelate film, as shown in FIG. 27A, the interconnection layer 105 is flattened.

Figure 27B:
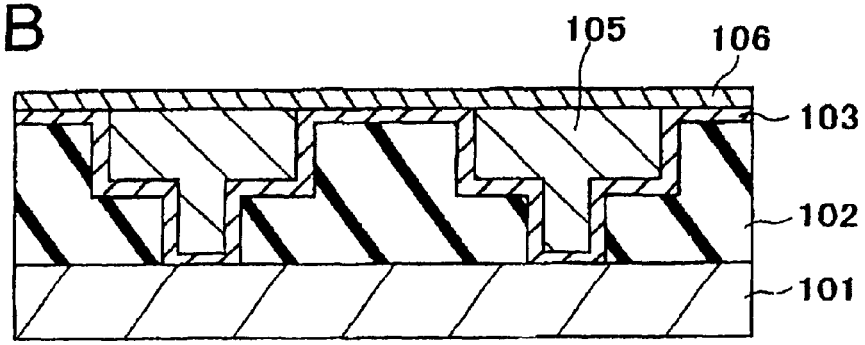

Next, as shown in FIG. 27B, the step of formation of a chelate film by anodic oxidation and removal of the chelate film are continued over the entire surface of the flattened interconnection layer 105 until the excess parts of the interconnection layer 105 on the barrier metal film 103 disappear completely.

Figure 27C:
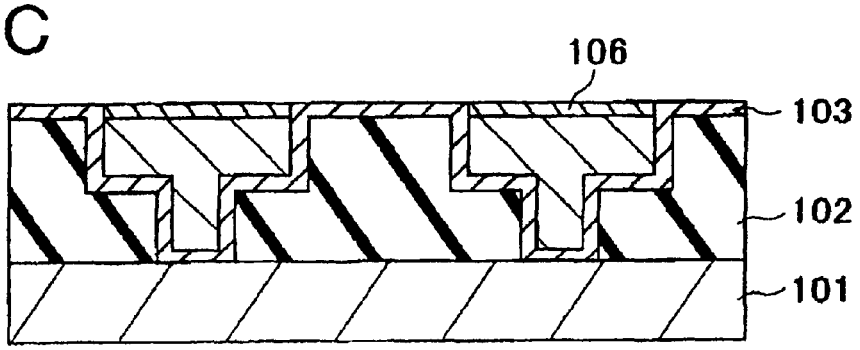

Next as shown in FIG. 27C, a certain amount of the entire interconnection layer 105 is removed by for example the aforesaid wiping, mechanical polishing, etc. to expose the surface of the barrier metal film 103.

The above flattening polishing of the interconnection layer 105 through formation of a chelate film by anodic oxidation and removal of the chelate film is carried out until removing a target amount of the interconnection layer 105.

Here, the target amount of the interconnection layer 105 to be removed in one region is calculated in advance in a separate step from the thickness data measured by a thickness meter for the interconnection layer 105 or is measured and calculated during the above electrolytic polishing step.

Further, it is possible to measure the electrolytic current of the anodic oxidation and use the electrolytic current as a quantity related to the remaining amount of the interconnection layer 105 to be removed.

For example, if the electrolytic current is monitored after removal of the chelate film 106, the current after the removal of the chelate film 106 starts to decline at the time when the barrier film 103 having a higher electric resistance than the interconnection layer 105 is exposed.

Therefore, at the point of time when the current after the removal of the chelate film starts to decline, the application of voltage is stopped to stop the chelation by the anodic oxidation.

Next, the barrier metal film deposited outside the contact holes and the interconnection grooves is removed.

Due to the above steps, contact hole connections and copper interconnections preferable for a semiconductor device are formed simultaneously by the dual damascene process.

According to polishing method of the present embodiment used for a process of formation of copper interconnections by a dual damascene process in a semiconductor device having copper interconnections, it is possible to set the distribution of necessary amounts of removal by conditions obtained by measuring beforehand the variability of the thickness of a film plated on a surface and in accordance with this remove the interconnection film as necessary for formation of interconnections by polishing by exactly the right amounts.

In addition, by moving the cathode member so that the actual distribution of amounts of removal of the entire surface, comprised of partial amounts of removal due to chelation superposed on the surface, coincides with the above preset distribution of amounts of removal, it is possible to remove the interconnection film as necessary for formation of interconnections by polishing by exactly the right amounts over the entire surface.

Further, since the interconnection film on the surface is polished and removed by formation of a chelate film by anodic oxidation and removal of the chelate film, unlike the CMP method, it is no longer necessary to apply pressure on the film, so occurrence of cracks of the film or damage to the lower interlayer insulation film can be suppressed.

Further, when removing the chelate film by wiping, the pressure applied to the interconnection layer is much smaller than in the chemical mechanical polishing of the related art, so occurrence of cracks of the interconnection layer or damage to the lower interlayer insulation film can be suppressed.

By including a polishing slurry in the fed electrolytic solution, it is possible to polish the chelate film by chemical mechanical polishing and improve or assist the polishing efficiency.

Further, in the step of polishing and removal by formation of a chelate film by anodic oxidation and removal of the chelate film, projecting portions in the unevenness formed on the surface of the interconnection layer can be removed preferentially, so the surface can be flattened effectively.

As described above, according to the polishing method of the present invention, when flattening a film by polishing, an initial unevenness can be easily flattened, excellent efficiency of removal of an excess copper film can be obtained, and damage to a lower interlayer insulation film can be suppressed.

In addition, in the present embodiment, it is preferable to add polyoxyethylenealkylether, alkylbenzenesulfonate, or another surface-active agent to the electrolytic solution.

Figure 28:
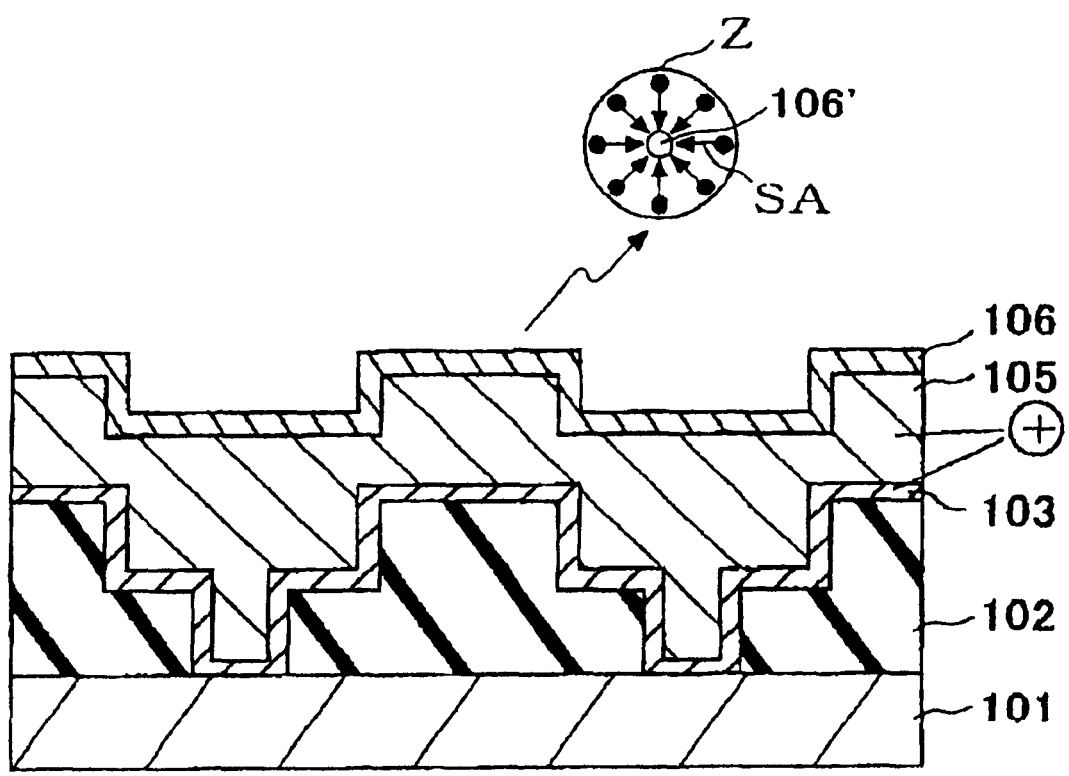
FIG. 28 is a schematic view for explaining the micelling process when a surface-active agent is added into an electrolytic solution in the 12th embodiment.

As shown in FIG. 28, the surface-active agent SA in the electrolytic solution envelops and micelles an insoluble chelate film 106' formed on the surface of the copper interconnection layer. The formed insoluble complex micelles Z can be separated easily from the surface of the interconnection layer, so removal of the chelate film becomes even easier due to the micelled insoluble complexes. Furthermore, the selective removal of the projecting portions becomes easier.

As the polishing apparatus for the process of polishing the above interconnection layer, use can be made of substantially the same apparatuses as those described in the second to the 11th embodiments.

The difference is that in the above polishing apparatuses, an electrolytic solution containing a chelating agent or an electrolytic solution further containing a surface-active agent is used as the electrolytic solution to be fed and the surface to be polished facing the cathode member is anodically oxidized rather than electrolytically eluted. When the surface layer of the surface to be polished is oxidized by anodic oxidation, the oxidized surface reacts with the chelating agent in the electrolytic solution to form a chelate film. Then the surface can be polished by removal of the low mechanical strength chelate film by the methods described above.

Further, for example, this process can also be applied to the apparatus shown in FIG. 11 in which an anode is arranged to be away from the cathode member at a certain distance or the apparatus as shown in FIG. 18 which incorporates a polishing ring wheel.

When polishing an interconnection layer on an insulation film of a low mechanical strength such as porous silica in an apparatus provided with a scrubber or a polishing ring wheel, however, applying pressure as in normal chemical mechanical polishing by the scrubber or the polishing ring wheel is not preferable. It is preferable to limit the pressure to the extent of that of wiping.

In addition, for example, as in the 10th embodiment, when pumping up the electrolytic solution residing at the bottom of the electrolytic bath tank T by the jet pump P via the filter F and feeding it again by the electrolytic solution feeding nozzle 30, it is possible to remove the insoluble chelate or micelles or other unnecessary components in the electrolytic solution and to add quinaldic acid or other components consumed and now insufficient.

In the present embodiment, as mentioned above, it is possible to use the polishing apparatuses described in the second to 11th embodiments. The same effects can be obtained as in the second to 11th embodiments.

13th Embodiment

Figure 29:
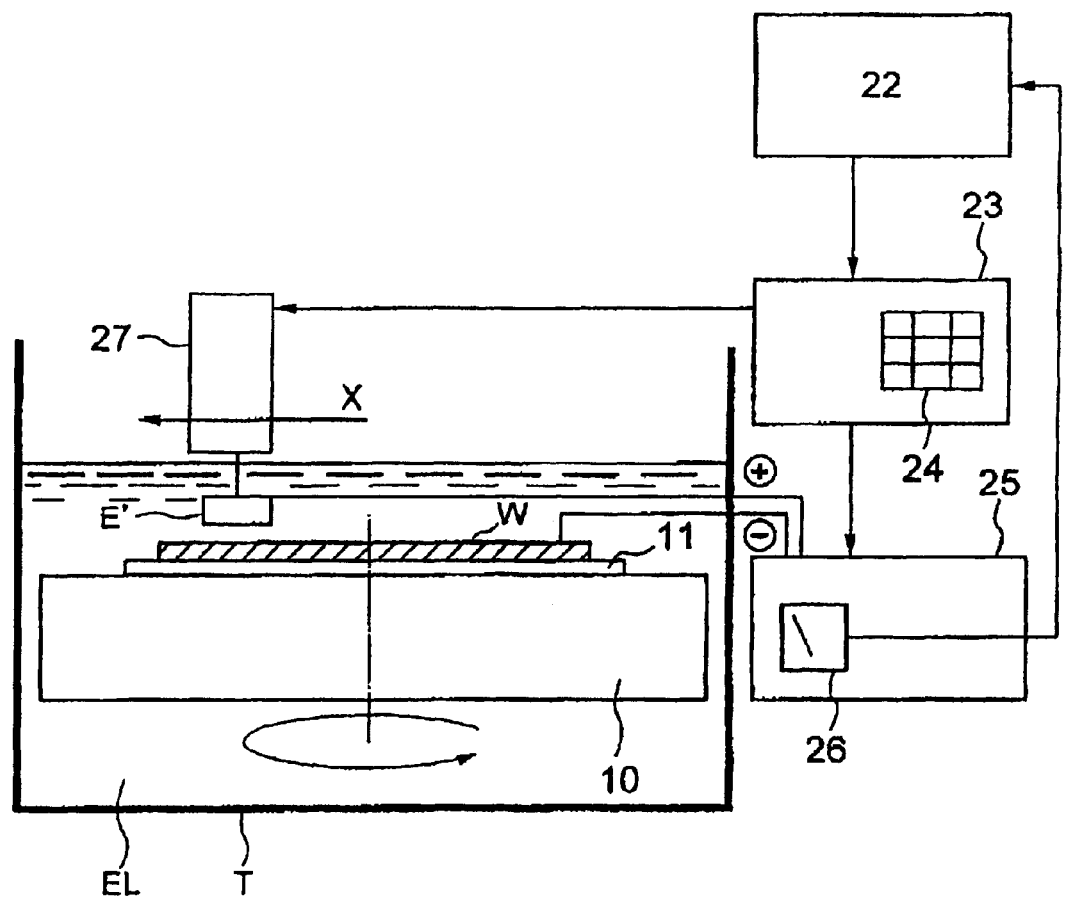
FIG. 29 is a schematic view of a plating apparatus according to a 13th embodiment.

FIG. 29 is a schematic view of the configuration of a plating apparatus used in the process of forming the above interconnection layer.

Namely, the plating apparatus of the present embodiment includes a table 10 for carrying a wafer W to be plated (hereinafter, also referred to as "wafer") on which a copper film is to be deposited, a securing means 11 such as a vacuum chuck provided on the table 10, a calculating unit 22, a controller 23, a control panel 24, a power supply 25, an ammeter 26, an anode member E', a moving mechanism 27 of the anode member E', and an electrolytic plating bath tank T for storing the electrolytic plating solution EL.

The wafer W, for example, is secured by a securing means 11 such as a vacuum chuck on the rotatable table 10. As the securing means, in addition to a vacuum chuck, use can also be made of an edge clamp or a mechanical clamp. In the case of an edge clamp, a current can be supplied to the wafer that serves as the cathode through the clamp portion that grounds the edge portion of the wafer.

The wafer W is immersed in the electrolytic plating solution EL in the electrolytic plating bath tank T together with the table 10.

For example, while the table 10 is driven to rotate, the anode member E', which is relatively smaller than the surface of the wafer W, is arranged so as to face one region of the surface. A predetermined voltage such as a direct-current voltage or a pulse voltage is supplied by the power supply 25 with the surface of the wafer, that is, the barrier metal film, as a cathode and the anode member E' as an anode.

If such a voltage is supplied, that region of the surface is plated.

The electrolytic plating current at this time is monitored by the ammeter 26 and is output to the calculating unit 22. The calculating unit 22 cumulatively adds (integrates) the input current value and outputs the obtained integrated value of the current to the controller 23.

The controller 23 compares the integrated value of the current with a preset value and judges that a copper film of a necessary thickness is formed when the preset value is reached. It then ends the plating treatment in that region of the plated surface and controls the moving mechanism 27 to move the anode member 27 from this region to another region.

In addition, the controller 23 can receive output input from the control panel 24.

Figure 30A:
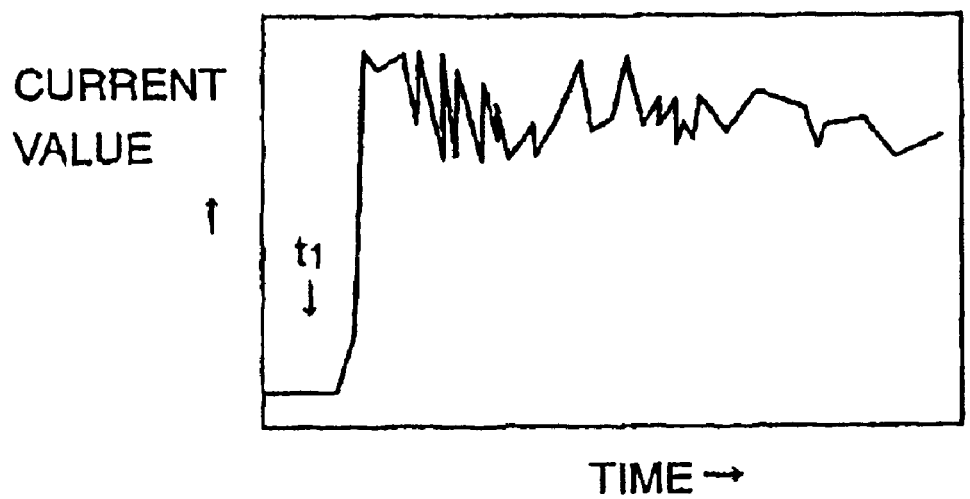

For example, looking at the profile of the electrolytic plating current, as shown in FIG. 30A, when the electrolytic plating reaction starts at the time $t_1$, the current value rises suddenly, then becomes stable within the range of fluctuation.

Figure 30B:
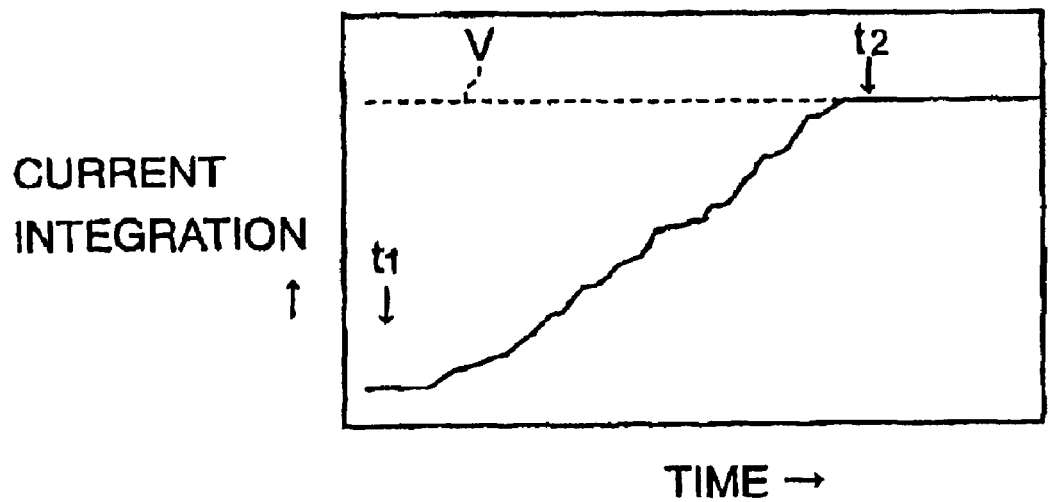
FIG. 30B is a view of the current integrated value.

FIG. 30B is a graph obtained by integration of the above current. The integrated value of the current is substantially proportional to the deposited thickness. When the electrolytic plating reaction starts at the time $t_1$, the integrated value of the current rises gradually and increases monotonically. Here, at the point of time when the integrated value reaches a preset value V corresponding to a certain thickness, the application of voltage is stopped to stop the plating in this region.

In this way, while the table 10 is being rotated, the anode member E' is made to scan one direction (the X-direction in FIG. 29) by the moving mechanism 27 to electrolytically plate the entire surface. The anode member E' can be moved by the moving mechanism 27 continuously or stepwise.

Note that, although not illustrated in the figure, the above plating apparatus is installed in a clean room. A loading/unloading port for loading and unloading a wafer cassette storing wafers to be plated in or out of the clean room is provided in the clean room. Further, a wafer conveyance robot for transferring the wafers between the wafer cassette loaded in the clean room through this loading/unloading port and the plating apparatus is arranged between the loading/unloading port and the plating apparatus.

The plating apparatus according to the present embodiment, and the plating method used in the apparatus, plate while measuring the integrated value of the electrolytic plating current, which corresponds to the thickness of the film being deposits. Due to this, the necessary copper film can be formed by exactly the right amounts of deposition.

In addition, by moving the cathode member so that the actual distribution of the amounts of deposition over the entire surface, comprising the partial amounts of deposition superposed on the surface, coincides with the above preset distribution of amounts of deposition, the necessary copper film can be formed by exactly the right amounts over the entire surface.

As shown above, in the process of forming interconnections of a semiconductor device etc., a flat copper film can be deposited.

14th Embodiment

In the 13th embodiment, plating is performed with measuring the integral value of the electrolytic plating current which is corresponding to the thickness of the plating film to be plated and the cathode member is moved depending on the integral value, on the other hand, in this embodiment, plating is performed with measuring the thickness equivalent data of the plating film.

Figure 31:
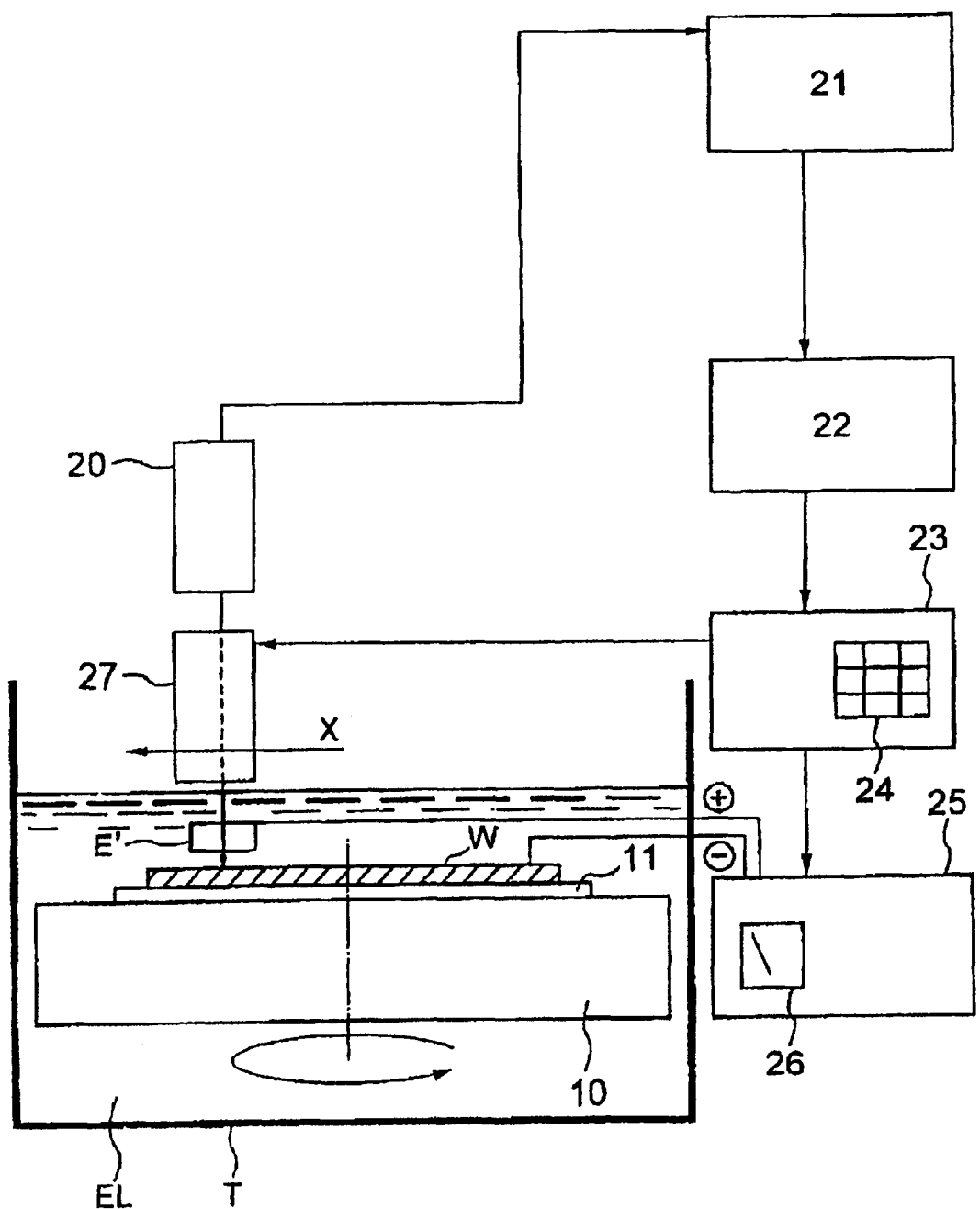
FIG. 31 is a schematic view of a plating apparatus according to a 14th embodiment.

FIG. 31 is a schematic view of a plating apparatus according to the present embodiment.

Namely, the plating apparatus of the present embodiment includes a table 10 for carrying a wafer W to be plated (hereinafter, also referred to as a "wafer") on which a copper film is to be formed, a securing means 11 such as a vacuum chuck provided on the table 10, a measuring means provided with a measuring head 20, a calculating unit 22, a controller 23, a control panel 24, a power supply 25, an ammeter 26, an anode member E', a moving mechanism 27 of the anode member E', and an electrolytic plating bath tank T for storing the electrolytic plating solution EL.

The wafer W, for example, is secured by a securing means 11 such as a vacuum chuck on the rotatable table 10. The wafer W is immersed in the electrolytic plating solution EL in the electrolytic plating bath tank T together with the table 10.

If a predetermined voltage such as a direct-current voltage or a pulse voltage is supplied by the power supply 25 with the surface of the wafer, that is, the barrier metal film, as a cathode and the anode member E' as an anode, that region of the surface is plated.

Here, the above measuring means 21 measures the thickness or thickness equivalent data during the electrolytic plating.

The thickness of the copper film, or the thickness equivalent data, is measured by the measuring means 21 provided with a measuring head 20.

The thickness of the copper film can be measured, for example, by using the method of measuring the sheet resistance with a four-probe type sheet resistance meter and converting it to thickness using a known sheet resistance or by using the method of measuring the thickness equivalent data by an eddy current type detector or an electrostatic capacitance type detector.

The calculating unit 22 calculates the target amount of the copper film to be deposited from the obtained thickness equivalent data of the copper film and outputs it to the controller 23.

The controller 23 sets the target amount of the copper film to be deposited from this input and in accordance with this controls the voltage output from the power supply 25 and the moving mechanism 27 of the cathode member 27. In addition, the controller 23 can receive outside input from the control panel 24.

For example, when it is judged that the amount of deposition has reached the necessary thickness from the obtained thickness or thickness equivalent data of the copper film, the anode member E' is moved in one direction (the X-direction in FIG. 31) by the moving mechanism 27 continuously or stepwise. At this time, the measuring head 20 is moved together with the anode member E'.

By performing the above process over the entire surface, the entire surface can be uniformly electrolytically plated.

The rest of the configuration and operation can be made the same as in the 13th embodiment. The same effects can be achieved as the 13th embodiment.

15th Embodiment

Figure 32:
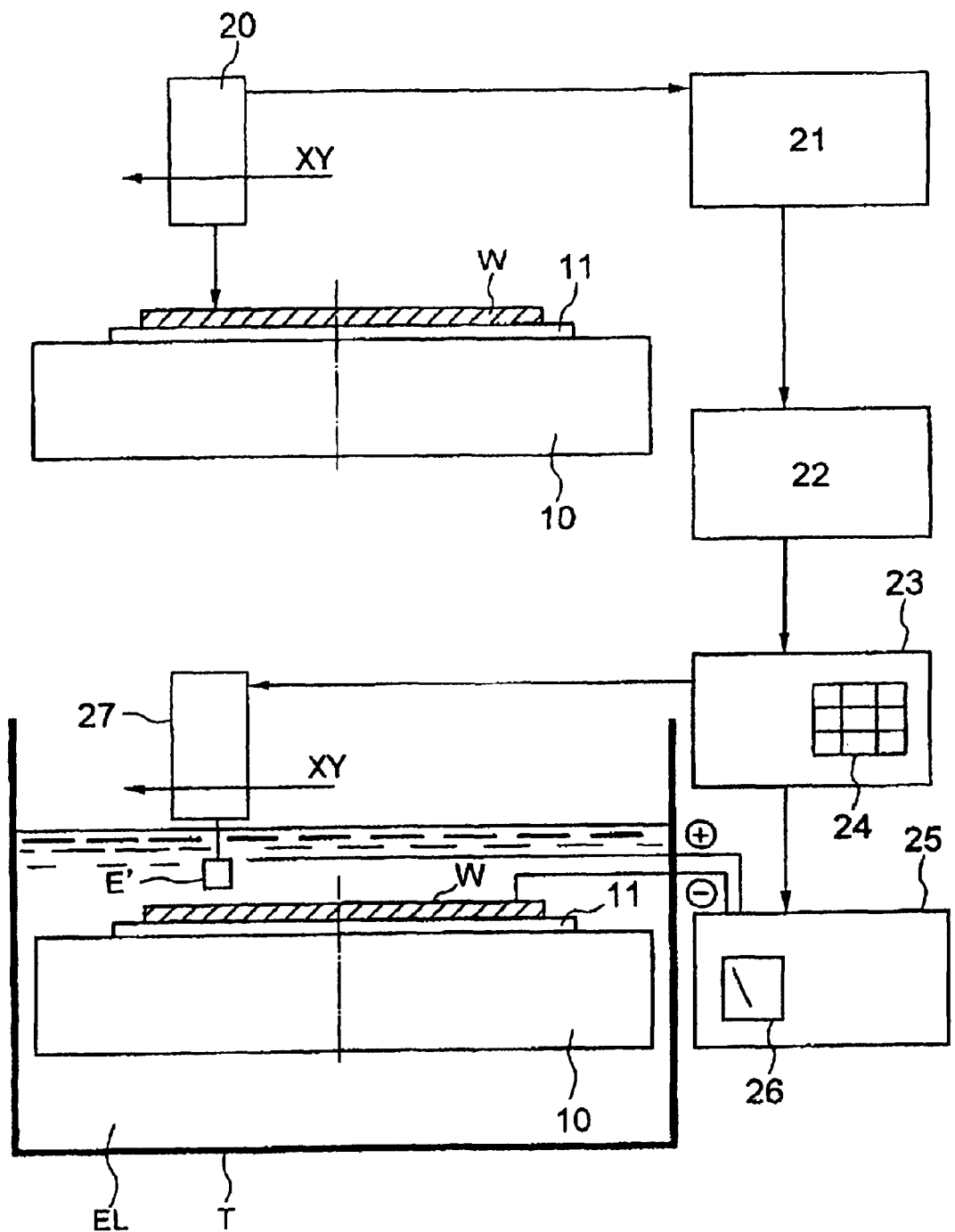
FIG. 32 is a schematic view of a plating apparatus according to a 15th embodiment.

FIG. 32 is a schematic view of the configuration of a plating apparatus used in the plating process for forming the above interconnection layer.

Namely, the plating apparatus of the present embodiment includes a table 10 for carrying a wafer W to be plated (hereinafter, also referred to as a "wafer") on which a copper film is to be deposited, a securing means 11 such as a vacuum chuck provided on the table 10, a measuring means provided with a measuring head 20, a calculating unit 22, a controller 23, a control panel 24, a power supply 25, an ammeter 26, an anode member E', a moving mechanism 27 of the anode member E', and an electrolytic plating bath tank T for storing the electrolytic plating solution EL.

The wafer W, for example, is secured by a securing means 11 such as a vacuum chuck on the rotatable table 10.

The surface height of the surface is measured by the measuring means 21 provided with a measuring head 20. The surface height can be measured, for example, by making the measuring head 20 facing the surface scan the X- and Y-directions.

The calculating unit 22 calculates the target amount of the copper film to be deposited from the obtained surface height data and outputs it to the controller 23.

The controller 23 sets the target amount of the copper film to be deposited from this input and in accordance with this controls the voltage output from the power supply 25 and the moving mechanism 27 of the cathode member 27. In addition, the controller 23 can receive outside input from the control panel 24.

In the process of electrolytic plating, the wafer W is immersed in the electrolytic plating solution EL in the electrolytic plating bath tank T together with the table 10.

The anode member E', which is relatively small compared with the surface of the wafer W, is arranged to face one region of the surface. The anode member E' is arranged to be parallel with the wafer W in the electrolytic plating solution.

By conductance through the clamp portion grounded at the edge of the wafer, a direct-current voltage or a pulse voltage is supplied by the power supply 25 with the surface of the wafer, that is, the copper film, as a cathode and the anode member E' as an anode.

When such a voltage is supplied, that region of the surface is plated.

When the controller 23 judges that the target thickness has been deposited in this region in accordance with the preset distribution of target thickness to be deposited, the anode member E' is made to scan the X- and Y-directions by the moving mechanism 27 to electrolytically plate the entire surface.

The anode member E' can be moved by the moving mechanism 27 continuously or stepwise.

The voltage supplied by the above power supply 25 to the cathode and anode and the moving mechanism 27 are controlled by the controller 23 in accordance with the preset target amount of the copper film to be deposited.

For example, when the moving mechanism 27 moves the anode member E' continuously, the speed of movement of the anode member E' can be controlled in accordance with the preset target amount of the copper film to be deposited. In regions where the speed of movement is low, the anode member E' faces the plated surface for a longer time, the time of electrolytic plating is longer, and a larger amount of copper film can be deposited by the electrolytic plating. On the other hand, in regions where the speed of movement is high, the time when the anode member E' faces the plated surface is shorter, and the time of electrolytic plating is shorter, leading to a smaller amount of copper film.

Figure 33A:
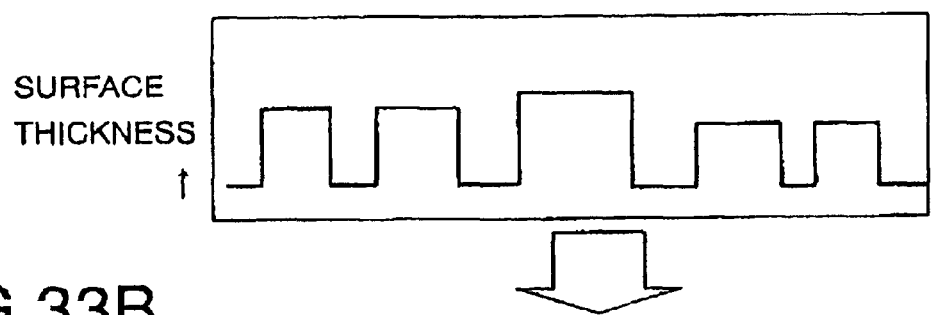
FIG. 33A shows a surface height profile of a plated surface in the plating method according to the 15th embodiment.
Figure 33B:
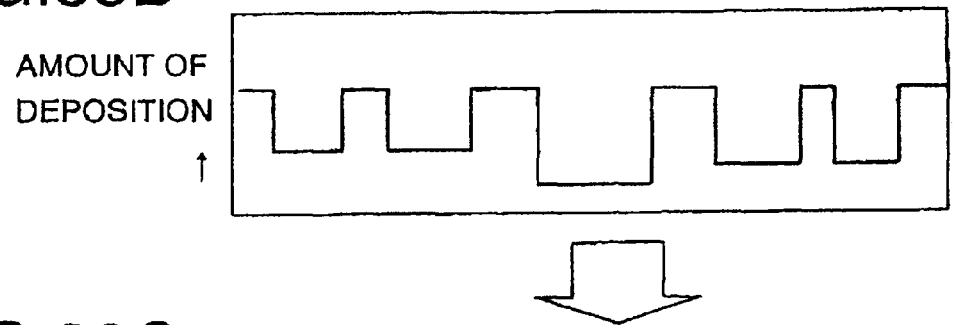
FIG. 33B shows the deposition profile.
Figure 33C:
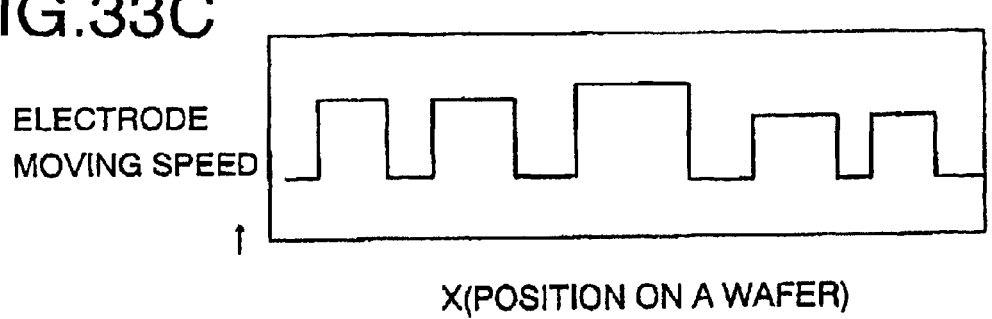
FIG. 33C shows the speed of movement profile of an electrode.
Figure 34A:
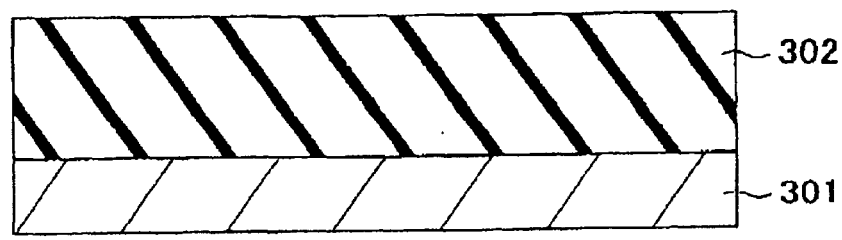
FIGS. 34A to 34C are sectional views of steps of the method of formation of copper interconnections by the dual damascene process according to an example of the related art, where
Figure 34B:
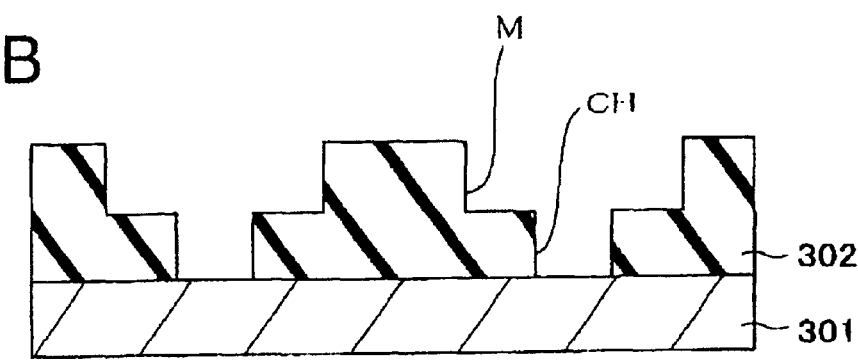
Figure 34C:
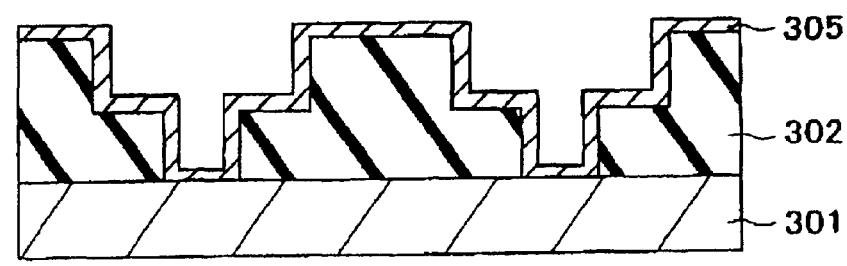
Figure 35A:
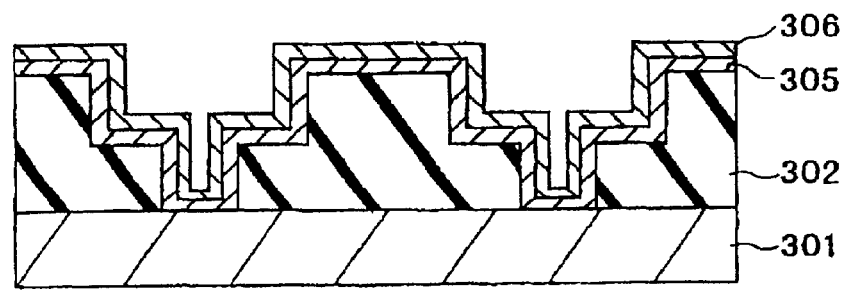
FIGS. 35A to 35C are views of steps continuing from FIG. 34A to 34C, where
Figure 35B:
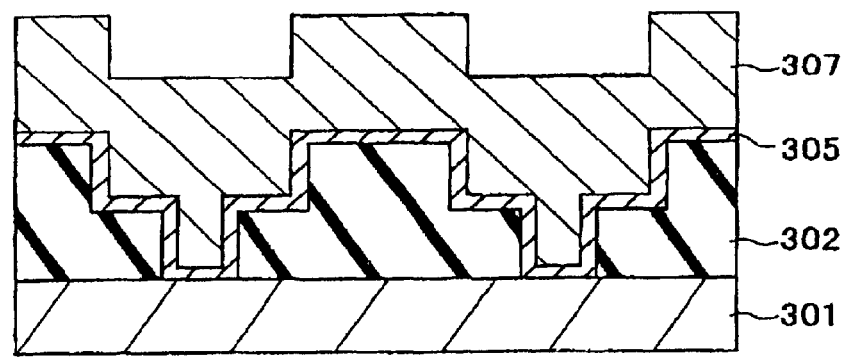
Figure 35C:
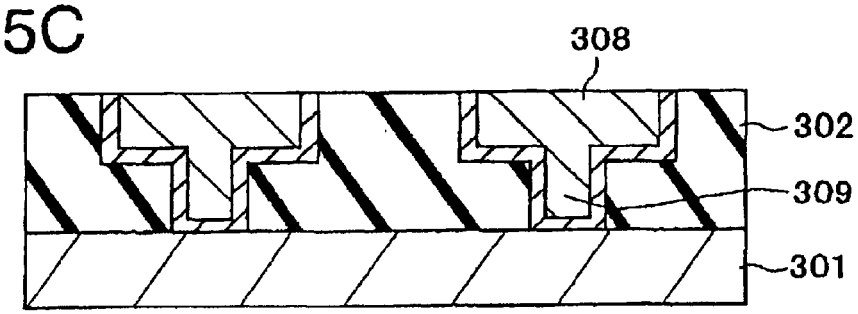
Figure 36:
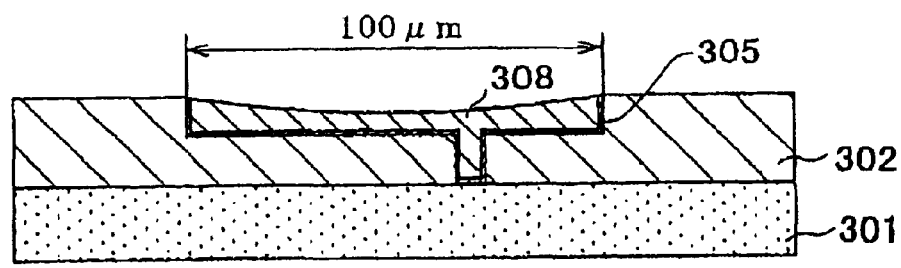
FIG. 36 is a sectional view for explaining dishing occurring in polishing of a copper film by CMP.
Figure 37:
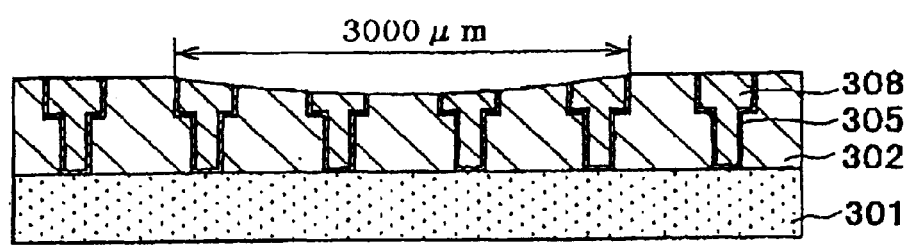
FIG. 37 is a sectional view for explaining erosion occurring in polishing of a copper film by CMP.
Figure 38:
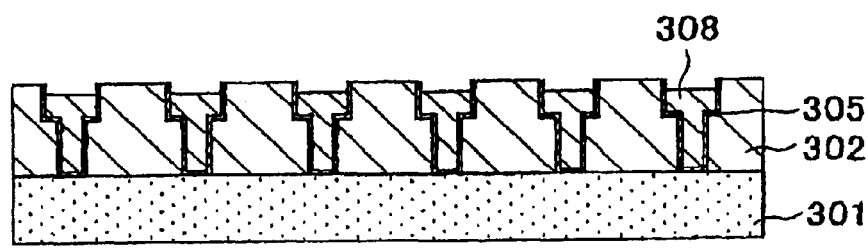
FIG. 38 is a sectional view for explaining a recess occurring in polishing of a copper film by CMP.
Figure 39:
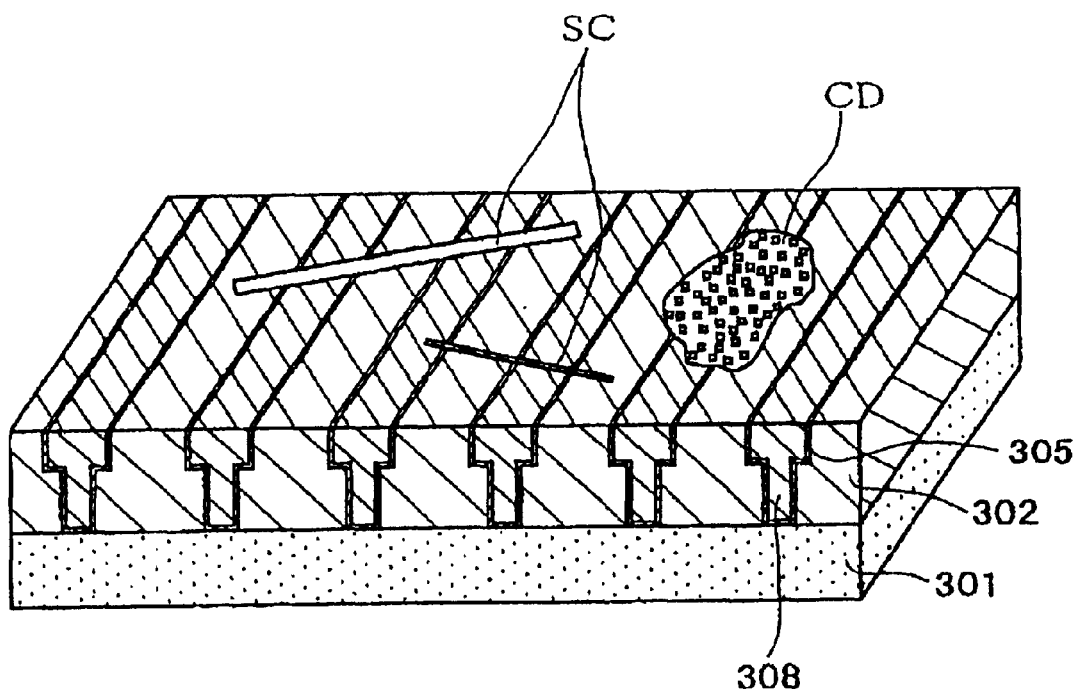
FIG. 39 is a sectional view for explaining a scratch and chemical damage occurring in polishing of a copper film by CMP.

For example, when the result of measurement of the surface height of the surface is that shown by the graph in FIG. 33A, (in this figure, the profile with respect to one direction in the plane is shown one-dimensionally), that is, fine projecting and recessed regions are formed from the edge portion ED of the wafer to the center portion CT, the target amount of the copper film to be deposited (amount of deposition) is set as shown in FIG. 33B, the same as the profile in FIG. 33A. The speed of movement of the anode member E' is controlled, as shown in FIG. 33C, to be fast at portions of a small amount of deposition and be slow at portions of a large amount of deposition.

In the plating apparatus of the present embodiment, since the anode member E' is small to the extent of the magnitude of the unevenness of the plated surface, movement of the fine anode member E' and application of voltage following the unevenness of the surface become possible.

The rest of the configuration and operation can be made the same as in the 13th and 14th embodiments. The same effects can be achieved as the 13th and 14th embodiments.

While the invention has been described with reference to specific embodiments chosen for purpose of illustration, it should be apparent that numerous modifications could be made thereto by those skilled in the art without departing from the basic concept and scope of the invention.

The present invention is not limited to the above embodiments.

For example, polishing and plating of a copper film can be used for other applications than formation of interconnections.

In addition, application to polishing or plating of another material than copper is also possible.

The type of the chelating agent and materials of the cathode or the anode member are not specifically limited.

Furthermore, the polishing method, polishing apparatus, plating method, and plating apparatus for copper film are applicable to other processes than the fabrication of a semiconductor device of the present invention.

In addition, the present invention is not limited to fabrication of semiconductor devices as in the above embodiments. By suitable modification, it is applicable to fabrication of contact holes, interconnection grooves, or a barrier metal layer or other processes than the process of flattening a copper film.

Numerous other modifications can also be made without departing from the basic concept and scope of the invention.

Summarizing the effects of the present invention, according to the polishing method of the present invention, it is possible to set the distribution of necessary amounts of removal by conditions obtained by measuring beforehand the variability of the thickness of a copper film plated on a surface and in accordance with this remove the copper film as necessary for formation of interconnections by polishing by exactly the right amounts.

Especially, the polishing process can managed in-line rather than by time.

In addition, by moving the cathode member so that the actual distribution of amounts of removal over the entire surface, comprising the partial amounts of removal superposed on the surface, coincides with the above preset distribution of amounts of removal, it is possible to remove the copper film as necessary for formation of interconnections by polishing by exactly the right amounts over the entire surface.

Further, since the copper film on the surface is polished and removed by electrolytic elution, unlike the CMP method, it is no longer necessary to apply pressure on the film, so occurrence of cracks of the copper film or damage to the lower interlayer insulation film can be suppressed.

In addition, in the above polishing and removal by electrolytic elution, only the projecting portions in the unevenness formed on the surface of the copper film are selectively electrolytically eluted, so effective flattening can be achieved.

As described above, according to the polishing method of the present invention, when flattening a copper film by polishing, an initial unevenness can be easily flattened, excellent efficiency of removal of an excess copper film can be obtained, and damage to the lower interlayer insulation film can be suppressed.

Further, according to the polishing apparatus of the present invention, with a compact design of one head, it becomes possible to polish the film on the surface by the polishing method of the present invention. When flattening a copper film by polishing, an initial unevenness can be easily flattened, excellent efficiency of removal an excess copper film can be obtained, and damage to the lower interlayer insulation film can be suppressed.

Further, according to the plating method of the present invention, by measuring in advance the surface height of the surface to be plated or by measuring plating thickness data during the plating, the necessary amount of deposition can be preset under the obtained conditions and in accordance with this a necessary plating film can be formed by exactly the right amounts.

In addition, by moving the cathode member so that the actual distribution of amounts of deposition over the entire surface, comprising the partial amounts of deposition superposed on the surface, coincides with the above preset distribution of amounts of deposition, it is possible to form the necessary copper film by exactly the right amounts over the entire surface.

As explained above, in the process of forming interconnections of a semiconductor device, a flat copper film can be deposited.

According to the plating apparatus of the present invention, by measuring in advance the surface height of the surface to be plated or by measuring the plating height data during the plating, it is possible to set the necessary distribution of amounts of deposition by the obtained conditions and in accordance with this form the necessary plating film by exactly the right amounts.

In addition, by moving the cathode member so that the actual distribution of amounts of deposition over the entire surface, comprising the partial amounts of deposition superposed on the surface, coincides with the above preset distribution of amounts of deposition, it is possible to form the necessary copper film by exactly the right amounts over the entire surface.

As explained above, in the process of forming interconnections of a semiconductor device, a flat copper film can be deposited.

What is claimed is:

1. A polishing method for polishing an object having a film on a surface to be polished, comprising the steps of
measuring data corresponding to a thickness of the film on the object and
making a relatively small cathode member compared with an overall surface, interposing an electrolytic solution at least between that region of the surface corresponding to the cathode member, and in that state applying a voltage with the cathode member serving as a cathode and the film as an anode to electrolytically polish and flatten the film by electrolytic elution in that region of the surface preferentially until removing a target amount of the film wherein an electric current, voltage or resistance measurement associated with the electrolytic polishing is used to determine when a target amount has been removed; and
moving the cathode member to another region of the surface and electrolytically polishing the film in that other region until removing the target amount of film to flatten the film is repeated over the entire surface, to thereby remove the target amount of film over the entire surface.

2. A polishing method as set forth in claim 1, wherein the film comprises a copper film.

3. A polishing method as set forth in claim 1, further comprising a step of calculating the amount of the film to be removed from the thickness equivalent data after the step of measuring the thickness equivalent data and before the step of electrolytically polishing and flattening the film by electrolytic elution in that region of the surface.

4. A polishing method as set forth in claim 1, wherein the cathode member is moved continuously from one region to another region of the surface.

5. A polishing method as set forth in claim 4, wherein the speed of movement of the cathode member is controlled in accordance with the target amount of the film to be removed obtained from the thickness equivalent data.

6. A polishing method as set forth in claim 1, wherein the cathode member is moved stepwise from one region to another region of the surface.

7. A polishing method as set forth in claim 1, wherein, as the thickness equivalent data of the film is based on an actual measurement.

8. A polishing method as set forth in claim 1, wherein,
in the step of measuring the thickness equivalent data of the film, the thickness equivalent data of the film in the region where the cathode member faces the surface is measured, and prior to moving the cathode member to another region of the surface, measuring the thickness equivalent data of the film in that other region, and electrolytically polishing and flattening the film by electrolytic elution preferentially from projecting portions of the film in that other region until removing the target amount of the film obtained from the thickness equivalent data is repeated over the entire surface.

9. A polishing method as set forth in claim 8, wherein, in the step of measuring the thickness equivalent data of the film, as the thickness equivalent data of the film, an electrolytic current of the electrolytic polishing is measured in the region where the cathode member faces the surface, and in the step of electrolytically polishing and flattening the film by electrolytic elution in that region of the surface, the electrolytic polishing is performed until removing the target amount of the film determined by the electrolytic current of the electrolytic polishing.

10. A polishing method as set forth in claim 9, wherein, in the step of electrolytically polishing and flattening the film by electrolytic elution in that region of the surface, the target amount of the film remaining at the point of time when the electrolytic current of the electrolytic polishing becomes a specified value is determined to be zero and the electrolytic polishing in that region of the surface is finished.

11. A polishing method as set forth in claim 1, wherein, the cathode member is shaped so as to be able to apply a stronger electric field to a projecting portion than to a recessed portion of the film corresponding to the unevenness of the film in that region of the surface, and in the step of electrolytically polishing and flattening the film by electrolytic elution in that region of the surface, by applying this electric field, the film is polished electrolytically and flattened by electrolytic elution in the region of the surface preferentially from a projecting portion of the film.

12. A polishing method as set forth in claim 11, wherein the surface has a projecting and recessed pattern and by moving the cathode member stepwise to other regions of the surface and applying the stronger electric field to the projecting portion than to the recessed portion of the film corresponding to the unevenness of the film the step of electrolytically polishing and flattening the film by electrolytic elution preferentially at projecting portions of the film is repeated over the entire surface.

13. A polishing method as set forth in claim 1, wherein the cathode member is divided into a plurality of regions which are insulated from each other and the cathode member as a whole faces the entire surface, and by changing the position of application of voltage the substantially equivalent is obtained as when changing the position of the cathode member facing the surface from one region to another region.

14. A polishing method as set forth in claim 13, wherein the cathode member is divided into a plurality of concentric circular regions, and the entire surface is electrolytically polished by changing the position of application of voltage from the inner side to the outer side of the cathode member divided into concentric circular regions.

15. A polishing method as set forth in claim 1, wherein, when making a relatively small cathode member compared with that region of the surface, an anode member set apart from the cathode member at a certain distance is made to face the surface, an electrolytic solution is interposed at least between that region of the surface and the cathode member and between the surface and the anode member, and a voltage is applied to the cathode member and the anode member.

16. A polishing method as set forth in claim 15, wherein the anode member is comprised of a nobler metal than the material on the surface.

17. A polishing method as set forth in claim 1, wherein, in the step of electrolytically polishing and flattening the film by electrolytic elution in that region of the surface, chemical mechanical polishing is performed at the same time as the electrolytic polishing to flatten the film by composite polishing combining the electrolytic polishing and the chemical mechanical polishing.

18. A polishing method as set forth in claim 1, wherein, when a voltage is applied with the cathode member as a cathode and the surface as an anode, a direct-current voltage is applied.

19. A polishing method as set forth in claim 18, wherein a rectangular pulse voltage is applied.

20. A polishing method as set forth in claim 15, wherein, when a voltage is applied to the cathode member and the anode member, an alternating-current voltage is applied.

21. A polishing method as set forth in claim 1, wherein, in the step of electrolytically polishing and flattening the film by electrolytic elution in that region of the surface, an electrolytic current of the electrolytic polishing in the region is measured at the same time.

22. A polishing method as set forth in claim 21, wherein the voltage applied with the cathode member as a cathode and the surface as an anode is controlled to maintain the electrolytic current constant.

23. A polishing method as set forth in claim 21, wherein the progress in flattening the film in that region of the surface is managed through the electrolytic current.

24. A polishing method for polishing an object having a film on a surface to be polished, comprising the steps of measuring data corresponding to a thickness of the film on the object;

making a relatively small cathode member compared with an entire surface, interposing an electrolytic solution including a chelating agent at least between that region of the surface and the cathode member, and in that state applying a voltage with the cathode member serving as a cathode and the film as an anode to oxidize the surface of the film by anodic oxidation and form a chelate film of the oxidized material; and selectively removing a projecting portion of the chelate film corresponding to unevenness of the film to expose the film of the projecting portion at the surface;

and moving the cathode member from one region to another region of the surface, and repeating the chelate film forming step, and the chelate film removing step until removing the target amount of the film determined from the thickness equivalent data over the entire surface to flatten the entire surface.

25. A polishing method as set forth in claim 24, wherein the film comprises a copper film.

26. A polishing method as set forth in claim 24, wherein the electrolytic solution further includes a surface-active agent.

27. A polishing method as set forth in claim 24, further comprising a step of calculating the target amount of the film to be removed from the thickness equivalent data after the step of measuring the thickness equivalent data and before the chelate film forming step in that region of the surface.

28. A polishing method as set forth in claim 24, wherein the cathode member is moved continuously from one region to another region of the surface.

29. A polishing method as set forth in claim 28, wherein the speed of movement of the cathode member is controlled in accordance with the target amount of the film to be removed obtained from the thickness equivalent data.

30. A polishing method as set forth in claim 24, wherein the cathode member is moved stepwise from one region to another region of the surface.

31. A polishing method as set forth in claim 24, wherein, as the thickness equivalent data of the film, the thickness of the film is measured.

32. A polishing method as set forth in claim 24, wherein,
in the step of measuring the thickness equivalent data of the film, the thickness equivalent data of the film in the region where the cathode member faces the surface is measured, and
the step of moving the cathode member to other regions of the surface, the step of measuring the thickness equivalent data of the film in these other regions, the chelate film forming step, and the chelate film removing step are repeated over the entire surface.

33. A polishing method as set forth in claim 32, wherein,
in the step of measuring the thickness equivalent data of the film, as the thickness equivalent data of the film, an electrolytic current of the anodic oxidation is measured in the region where the cathode member faces the surface, and
the step of measuring an electrolytic current of the anodic oxidation, the chelate film forming step, and the chelate film removing step are repeated over the entire surface until removing the target amount of the film determined by the electrolytic current of the anodic oxidation.

34. A polishing method as set forth in claim 33, wherein, when repeating the step of measuring the electrolytic current of the anodic oxidation in a region of the surface, the chelate film forming step, and the chelate film removing step over the entire surface, the target amount of the film remaining at the point of time when the electrolytic current of the anodic oxidation becomes a specified value is determined to be zero and the chelate film forming step and the chelate film removing step in that region of the surface are finished.

35. A polishing method as set forth in claim 24, wherein
the cathode member is shaped so as to be able to apply a stronger electric field to a projecting portion than to a recessed portion of the film corresponding to the unevenness of the film in that region of the surface, and
in the chelate film forming step and the chelate film removing step in that region of the surface, by applying this electric field, the chelate film is formed and removed preferentially from projecting portions of the film to flatten the film.

36. A polishing method as set forth in claim 35, wherein
the surface has a projecting and recessed pattern formed by repeating a projecting and recessed pattern in that region of the surface, and
by moving the cathode member stepwise to other regions of the surface and applying the stronger electric field to the projecting portion than to the recessed portion of the film corresponding to the unevenness of the film in these other regions, the step of chelating the film and removing the formed chelate film preferentially from a projecting portion of the film to flatten the film is repeated over the entire surface.

37. A polishing method as set forth in claim 24, wherein
the cathode member is divided into a plurality of regions which are arranged insulated from each other and the cathode member as a whole faces the entire surface, and
by changing the position of application of a voltage to the divided cathode member, the substantially equivalent is obtained as when changing the position of the cathode member facing the surface from one region to another region.

38. A polishing method as set forth in claim 37, wherein
the cathode member is divided into a plurality of concentric circular regions, and
the entire surface of the film is oxidized by anodic oxidation and chelated by changing the position of application of a voltage from the inner side to the outer side of the cathode member divided into concentric circular regions.

39. A polishing method as set forth in claim 24, wherein, when making a relatively small cathode member compared with die surface face that region of the surface, an anode member set apart from the cathode member at a certain distance is made to face the surface, an electrolytic solution is interposed at least between that region of the surface and the cathode member and between the surface and the anode member, and a voltage is applied to the cathode member and the anode member so as to apply the voltage de facto with the cathode member as a cathode and the surface as an anode.

40. A polishing method as set forth in claim 39, wherein the anode member is comprised of a nobler metal than the material on the surface.

41. A polishing method as set forth in claim 24, wherein, in the step of removing the chelate film in that region of the surface, a projecting portion of the chelate film corresponding to the unevenness of the film is selectively removed by wiping.

42. A polishing method as set forth in claim 24, wherein, in the step of removing the chelate film in that region of the surface, the chelate film is removed by applying vibration.

43. A polishing method as set forth in claim 24, wherein, in the step of removing the chelate film in that region of the surface, the chelate film is removed by applying a jet.

44. A polishing method as set forth in claim 24, wherein, when a voltage is applied with the cathode member as a cathode and the surface as an anode, a direct-current voltage is applied.

45. A polishing method as set forth in claim 44, wherein a rectangular pulse voltage is applied.

46. A polishing method as set forth in claim 39, wherein, when a voltage is applied to the cathode member and the anode member, an alternating-current voltage is applied.

47. A polishing method as set forth in claim 24, wherein, in the step of oxidizing the film by the anodic oxidation in that region of the surface, an electrolytic current of the anodic oxidation in the region is measured at the same time.

48. A polishing method as set forth in claim 47, wherein the voltage applied with the cathode member as a cathode and the surface as an anode is controlled to maintain the electrolytic current constant.

49. A polishing method as set forth in claim 47, wherein the progress in flattening the film in that region of the surface is managed through the electrolytic current.

* * * * *